US009412471B2

(12) United States Patent
Kim et al.

(10) Patent No.: US 9,412,471 B2
(45) Date of Patent: Aug. 9, 2016

(54) METHOD OF READING DATA FROM A NONVOLATILE MEMORY DEVICE, NONVOLATILE MEMORY DEVICE, AND METHOD OF OPERATING A MEMORY SYSTEM

(71) Applicants: Kyung-Ryun Kim, Daejeon (KR); Sang-Yong Yoon, Seoul (KR)

(72) Inventors: Kyung-Ryun Kim, Daejeon (KR); Sang-Yong Yoon, Seoul (KR)

(73) Assignee: Samsung Electronics Co., Ltd. (KR)

( * ) Notice: Subject to any disclaimer, the term of this patent is extended or adjusted under 35 U.S.C. 154(b) by 97 days.

(21) Appl. No.: 14/186,504

(22) Filed: Feb. 21, 2014

(65) Prior Publication Data

US 2014/0281770 A1 Sep. 18, 2014

(30) Foreign Application Priority Data

Mar. 15, 2013 (KR) .................. 10-2013-0027722

(51) Int. Cl.
*G11C 29/50* (2006.01)
*G06F 11/10* (2006.01)
*G11C 29/02* (2006.01)
*G11C 29/42* (2006.01)
(Continued)

(52) U.S. Cl.
CPC ............ *G11C 29/50* (2013.01); *G06F 11/1048* (2013.01); *G06F 11/1068* (2013.01); *G11C 16/3418* (2013.01); *G11C 29/021* (2013.01); *G11C 29/028* (2013.01); *G11C 29/42* (2013.01); *G11C 16/00* (2013.01); *G11C 2207/2254* (2013.01)

(58) Field of Classification Search
CPC ...... G11C 29/50; G11C 29/42; G11C 29/021; G11C 29/028; G11C 16/00; G06F 11/1048; G06F 11/1068
USPC .......................................................... 714/721
See application file for complete search history.

(56) References Cited

U.S. PATENT DOCUMENTS 6,282,145 B1 * 8/2001 Tran .................. G11C 11/5621
365/230.06
(Continued)

FOREIGN PATENT DOCUMENTS

JP 2012-133832 7/2012
KR 10-2009-0117172 11/2009

OTHER PUBLICATIONS

Yu Cai; Mutlu, O.; Haratsch, E.F.; Ken Mai, "Program interference in MLC NAND flash memory: Characterization, modeling, and mitigation," in Computer Design (ICCD), 2013 IEEE 31st International Conference on , vol., No., pp. 123-130, Oct. 6-9, 2013.*

(Continued)

*Primary Examiner* — Cynthia Britt
(74) *Attorney, Agent, or Firm* — Myers Bigel & Sibley, PA

(57) ABSTRACT

In a method of reading data from a nonvolatile memory device, a first read operation for memory cells coupled to a first word line is performed by applying a first read voltage to the first word line, a first read retry is performed to obtain an optimal read level regardless or independent of whether data read by the first read operation is error-correctable, and the optimal read level is stored to perform a subsequent second read operation using the optimal read level. Related methods and devices are also discussed.

35 Claims, 36 Drawing Sheets

(51) Int. Cl.
  *G11C 16/34* (2006.01)
  *G11C 16/00* (2006.01)

(56) References Cited

U.S. PATENT DOCUMENTS

| | | | |
|---|---|---|---|
| 7,038,928 B1 | 5/2006 | Hsu et al. | |
| 7,653,779 B1 * | 1/2010 | Fein | G11C 11/5621 |
| | | | 365/185.11 |
| 7,684,255 B2 | 3/2010 | Kim et al. | |
| 7,876,620 B2 | 1/2011 | Mokhlesi et al. | |
| 7,890,818 B2 | 2/2011 | Kong et al. | |
| 7,941,590 B2 | 5/2011 | Yang et al. | |
| 7,957,187 B2 | 6/2011 | Mokhlesi et al. | |
| 8,072,805 B2 | 12/2011 | Chou et al. | |
| 8,938,659 B2 * | 1/2015 | Wu | G06F 11/1068 |
| | | | 714/47.2 |
| 2008/0320346 A1 * | 12/2008 | Lin | G06F 11/1072 |
| | | | 714/721 |
| 2010/0199138 A1 | 8/2010 | Rho | |
| 2010/0322007 A1 | 12/2010 | Jeon | |
| 2012/0084490 A1 | 4/2012 | Choi et al. | |
| 2013/0080858 A1 * | 3/2013 | Lee | G11C 16/349 |
| | | | 714/773 |
| 2013/0297986 A1 * | 11/2013 | Cohen | G06F 3/061 |
| | | | 714/763 |

OTHER PUBLICATIONS

National Search Report from the Dutch Patent Office for corresponding Dutch Patent Application No. 2012398 dated Mar. 15, 2016, 8 pages.

* cited by examiner

Read Retry Table                                400

| VREF1 (Si/Si+1)   | RL11 | RL12 | RL13 | RL14 | ... |
|-------------------|------|------|------|------|-----|
| VREF2 (Si+1/Si+2) | RL21 | RL22 | RL23 | RL24 | ... |
|                   |      |  :   |      |      |     |

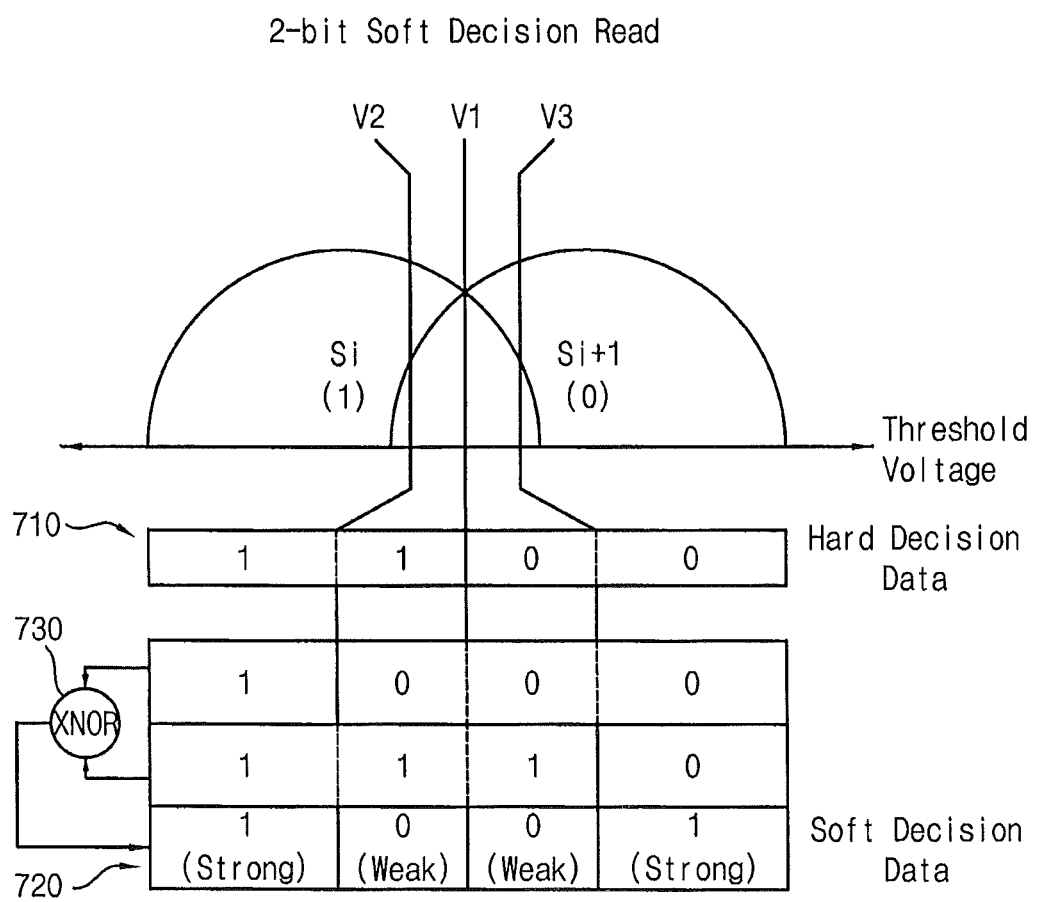

METHOD OF READING DATA FROM A NONVOLATILE MEMORY DEVICE, NONVOLATILE MEMORY DEVICE, AND METHOD OF OPERATING A MEMORY SYSTEM

CROSS-REFERENCE TO RELATED APPLICATIONS

This U.S. non-provisional application claims the benefit of priority under 35 U.S.C. §119 to Korean Patent Application No. 10-2013-0027722 filed on Mar. 15, 2013 in the Korean Intellectual Property Office (KIPO), the entire content of which is incorporated by reference herein in its entirety.

BACKGROUND

1. Technical Field

The inventive concept relates generally to nonvolatile memory devices and, more particularly, to methods of reading data from nonvolatile memory devices, the nonvolatile memory devices, and methods of operating memory systems.

2. Description of the Related Art

The individual memory cells in a nonvolatile memory device, such as a flash memory device, can store data in accordance with a plurality of threshold voltage distributions, where each respective threshold voltage distribution is assigned to a corresponding logic state for stored data. The data stored by a memory cell may be read by determining whether the memory cell is turned ON/OFF when a predetermined read voltage is applied.

During (and/or following) the programming of a memory cell, its intended threshold voltage distribution may be undesirably shifted or broadened due to a number of events or conditions including (e.g., charge leakage, program disturbances, word and/or bit line coupling, temperature change, voltage change, etc. Once the threshold voltage distribution of a memory cell has been thus altered, it may become difficult to accurately read the logic state of the stored data. In some instances, the logic state can become indiscernible and a read fail may occur. Once a read fail occurs, conventional nonvolatile memory devices may perform a so-called "read retry" operation.

In general during the read retry, a nonvolatile memory device may iteratively perform a read operation. During each successive iteration of the read operation, the level of the applied read voltage may be sequentially increased or decreased until the read operation does not result in a read fail. However, the use of repeated read operations during a read retry operation may invariably extend the time required to successfully read data from the nonvolatile memory device.

SUMMARY

Some example embodiments provide a method of reading data from a nonvolatile memory device capable of reducing an average read time and/or an average read latency.

Some example embodiments provide a nonvolatile memory device capable of reducing an average read time and/or an average read latency.

Some example embodiments provide methods of operating a memory system capable of reducing an average read time and/or an average read latency.

According to example embodiments, in a method of operating a nonvolatile memory device, a read operation is performed to read data from a memory cell of the memory device by applying a first read voltage to a first word line coupled thereto. A read retry operation is performed to read the data from the memory cell responsive to performing the read operation and independent of whether the data read in the read operation is correctable by an error correction code, and an error-correctable read voltage different from the first read voltage is determined responsive to the read retry operation.

In some example embodiments, the read retry operation may be performed responsive to determining that the data is correctable by the error correction code.

In some example embodiments, the memory cell may correspond to a first page of a memory block. A subsequent read operation may be performed to read data from a memory cell corresponding to a second page of the memory block by applying the error-correctable read voltage to a second word line coupled thereto.

In some example embodiments, a probability that the data read in the subsequent read operation is correctable by the error correction code may be increased responsive to performing the read retry operation.

In some example embodiments, a subsequent read retry operation for the second page may be selectively performed or omitted dependent on whether the data read in the subsequent read operation is correctable by the error correction code. A read retry voltage of the subsequent read retry operation may be based on a relationship between the first read retry voltage and the error-correctable read voltage.

In some example embodiments, the read operation may be a soft decision read operation indicating a reliability of the data read in a preceding read operation, and the subsequent read operation may be a hard decision read operation indicating either a first or second state of the memory cell corresponding to the second page.

In some example embodiments, the read operation may be a sequential read operation that is indicative of a sequence of the first page relative to a previously read page, and the subsequent read operation may be a random read operation that is independent of a sequence of the second page relative to the first page.

In some example embodiments, the read operation may be an initial read operation performed after erasure of the memory block.

In some example embodiments, respective error-correctable read voltages may be determined and stored for each of a plurality of memory blocks.

In some example embodiments, the first and second word lines may be coupled to respective memory cells that are remote from edges of the memory block.

In some example embodiments, a number of program/erase operations previously performed on a memory block including the memory cell may be determined, and the read retry operation may be selectively performed based on the number of program/erase operations.

In some example embodiments, a number of read retry voltages applied to the first word line during the read retry operation and/or respective ranges therebetween may vary based on whether the data read in the read operation is correctable by the error correction code.

According to example embodiments, in a method of reading data from a nonvolatile memory device, a first read operation for memory cells coupled to a first word line is performed by applying a first read voltage to the first word line, a first read retry is performed to obtain an optimal read level regardless of whether data read by the first read operation are error-correctable, and the optimal read level is stored to perform a subsequent second read operation using the optimal read level.

In some example embodiments, a second read operation for memory cells coupled to a second word line may be performed by applying a second read voltage having the optimal read level to the second word line, and a second read retry may be selectively performed according to whether data read by the second read operation are error-correctable.

In some example embodiments, it may be determined whether the data read by the second read operation are error-correctable. To selectively perform the second read retry, the second read operation may be completed without performing the second read retry, and the second read retry may be performed when the data read by the second read operation are determined not to be error-correctable.

In some example embodiments, the second read retry may be performed using a result of the first read retry.

In some example embodiments, when the optimal read level lower than a voltage level of the first read voltage is obtained as the result of the first read retry, the second read retry may be performed by applying read retry voltages having voltage levels lower than the voltage level of the first read voltage to the second word line, and when the optimal read level higher than the voltage level of the first read voltage is obtained as the result of the first read retry, the second read retry may be performed by applying read retry voltages having voltage levels higher than the voltage level of the first read voltage to the second word line.

In some example embodiments, it may be determined whether the data read by the first read operation are error-correctable. To perform the first read retry, when the data read by the first read operation are determined not to be error-correctable, the first read retry may be performed using first read retry voltages having a first range, and when the data read by the first read operation are determined to be error-correctable, the first read retry may be performed using second read retry voltages having a second range narrower than the first range.

In some example embodiments, the number of the second read retry voltages may be less than the number of the first read retry voltages.

In some example embodiments, an error correction may be performed on the data read by the first read operation using a Bose-Chaudhuri-Hocquenghem (BCH) code.

In some example embodiments, an error correction may be performed on the data read by the first read operation using a low density parity check (LDPC) code.

In some example embodiments, to perform the first read operation, a first hard decision read operation that reads first hard decision data from the memory cells coupled to the first word line may be performed by applying the first read voltage to the first word line, it may be determined whether the first hard decision data read by the first hard decision read operation are error-correctable, and when the first hard decision data are determined not to be error-correctable, a first soft decision read operation that reads first soft decision data having reliability information for the first hard decision data from the memory cells coupled to the first word line may be performed.

In some example embodiments, even when the first hard decision data are error-correctable based on the reliability information of the first soft decision data, or are error-correctable without the reliability information of the first soft decision data, the first read retry may be performed.

In some example embodiments, when the first soft decision read operation is performed, it may be determined whether the first hard decision data are error-correctable based on the reliability information of the first soft decision data. To perform the first read retry, when the first hard decision data are determined not to be error-correctable based on the reliability information of the first soft decision data, the first read retry may be performed using first read retry voltages having a first range, the first read retry may be performed using second read retry voltages having a second range narrower than the first range when the first hard decision data are determined to be error-correctable based on the reliability information of the first soft decision data, and the first read retry may be performed using third read retry voltages having a third range narrower than the second range when the first hard decision data are determined to be error-correctable without the reliability information of the first soft decision data.

In some example embodiments, the number of the second read retry voltages may be less than the number of the first read retry voltages, and the number of the third read retry voltages may be less than the number of the second read retry voltages.

In some example embodiments, the first read retry may not be performed when the first hard decision data are error-correctable without the reliability information, and may be performed even when the first hard decision data are error-correctable based on the reliability information of the first soft decision data.

In some example embodiments, when the first soft decision read operation is performed, it may be determined whether the first hard decision data are error-correctable based on the reliability information of the first soft decision data. To perform the first read retry, when the first hard decision data are determined not to be error-correctable based on the reliability information of the first soft decision data, the first read retry may be performed using first read retry voltages having a first range, and when the first hard decision data are determined to be error-correctable based on the reliability information of the first soft decision data, the first read retry may be performed using second read retry voltages having a second range narrower than the first range.

In some example embodiments, a second hard decision read operation that reads second hard decision data from memory cells coupled to a second word line may be performed by applying a second read voltage having the optimal read level to the second word line, it may be determined whether the second hard decision data read by the second hard decision read operation are error-correctable, a second soft decision read operation that reads second soft decision data having reliability information for the second hard decision data from the memory cells coupled to the second word line may be performed when the second hard decision data are determined not to be error-correctable, and a second read retry may be selectively performed according to whether the second hard decision data are error-correctable based on the reliability information of the second soft decision data.

In some example embodiments, it may be determined whether the first read operation is one of sequential read operations that sequentially read data from a plurality of adjacent pages. The first read retry may be selectively performed according to whether the data read by the first read operation are error-correctable when the first read operation is determined not to be one of the sequential read operations, and may be performed regardless of whether the data read by the first read operation are error-correctable when the first read operation is determined to be one of the sequential read operations.

In some example embodiments, it may be determined whether the first read operation is a read operation that is performed for the first time after a memory block including the memory cells coupled to the first word line is erased. The first read retry may be selectively performed according to whether the data read by the first read operation are error-correctable when the first read operation is determined not to be the read operation that is performed for the first time after the memory block is erased, and may be performed regardless of whether the data read by the first read operation are error-correctable when the first read operation is determined to be the read operation that is performed for the first time after the memory block is erased.

In some example embodiments, the optimal read level may be stored for each memory block included in the nonvolatile memory device.

In some example embodiments, it may be determined whether the first word line is an edge word line that is located at an edge region of a memory block including the memory cells coupled to the first word line. The first read retry may be selectively performed according to whether the data read by the first read operation are error-correctable when the first word line is determined to be the edge word line, and may be performed regardless of whether the data read by the first read operation are error-correctable when the first word line is determined not to be the edge word line.

In some example embodiments, erase cycles of a memory block including the memory cells coupled to the first word line may be counted, and the counted number of the erase cycles may be compared with a predetermined value. The first read retry may be selectively performed according to whether the data read by the first read operation are error-correctable when the counted number of the erase cycles does not match the predetermined value, and may be performed regardless of whether the data read by the first read operation are error-correctable when the counted number of the erase cycles matches the predetermined value.

According to example embodiments, a nonvolatile memory device includes a memory cell array including a plurality of memory cells, and a control circuit configured to perform a first read operation for memory cells coupled to a word line among the plurality of memory cells by applying a read voltage to the word line, to perform a read retry to obtain an optimal read level regardless of whether data read by the first read operation are error-correctable, and to store the optimal read level to perform a subsequent second read operation using the optimal read level.

According to example embodiments, in a method of operating a memory system including a nonvolatile memory device and a memory controller, the memory controller transmits a read command to the nonvolatile memory device, the nonvolatile memory device transmits, at, data read by a first read operation to the memory controller by performing the first read operation in response to the read command, the memory controller transmits a read retry command to the nonvolatile memory device regardless of whether the data read by the first read operation are error-correctable, and the nonvolatile memory device stores an optimal read level by performing a read retry in response to the read retry command to perform a subsequent second read operation using the optimal read level.

According to example embodiments, in a method of operating a memory system including a nonvolatile memory device and a memory controller, the memory controller transmits a read and read retry command to the nonvolatile memory device, the nonvolatile memory device transmits data read by a first read operation to the memory controller by performing the first read operation in response to the read and read retry command, and the nonvolatile memory device stores an optimal read level by performing a read retry in response to the read retry command regardless of whether the data read by the first read operation are error-correctable to perform a subsequent second read operation using the optimal read level.

BRIEF DESCRIPTION OF THE DRAWINGS

Illustrative, non-limiting example embodiments will be more clearly understood from the following detailed description taken in conjunction with the accompanying drawings.

FIG. 9 is a diagram for describing an example of a 2-bit soft decision read operation.

DETAILED DESCRIPTION OF THE EMBODIMENTS

Figure 1:
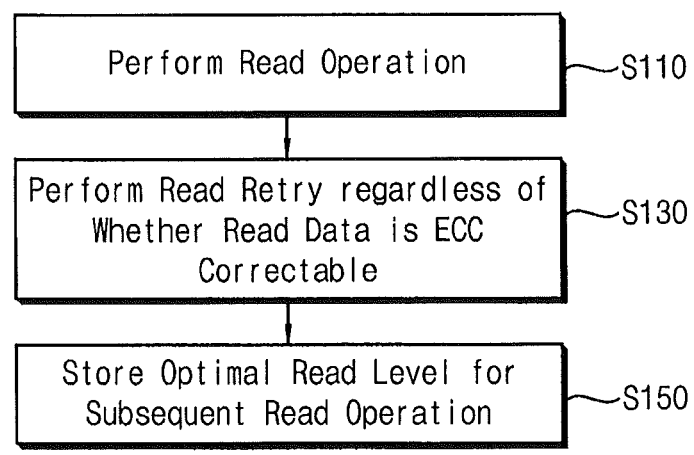
FIG. 1 is a flow chart illustrating methods of reading data from a nonvolatile memory device according to example embodiments.

Various example embodiments will be described more fully hereinafter with reference to the accompanying drawings, in which some example embodiments are shown. The present inventive concept may, however, be embodied in many different forms and should not be construed as limited to the example embodiments set forth herein. In the drawings, the sizes and relative sizes of layers and regions may be exaggerated for clarity.

It will be understood that when an element or layer is referred to as being "on," "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Like numerals refer to like elements throughout. As used herein, the term "and/or" includes any and all combinations of one or more of the associated listed items.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present inventive concept.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular example embodiments only and is not intended to be limiting of the present inventive concept. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Example embodiments are described herein with reference to cross-sectional illustrations that are schematic illustrations of idealized example embodiments (and intermediate structures). As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the present inventive concept.

Unless otherwise defined, all terms (including technical and scientific terms) used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Figure 2:
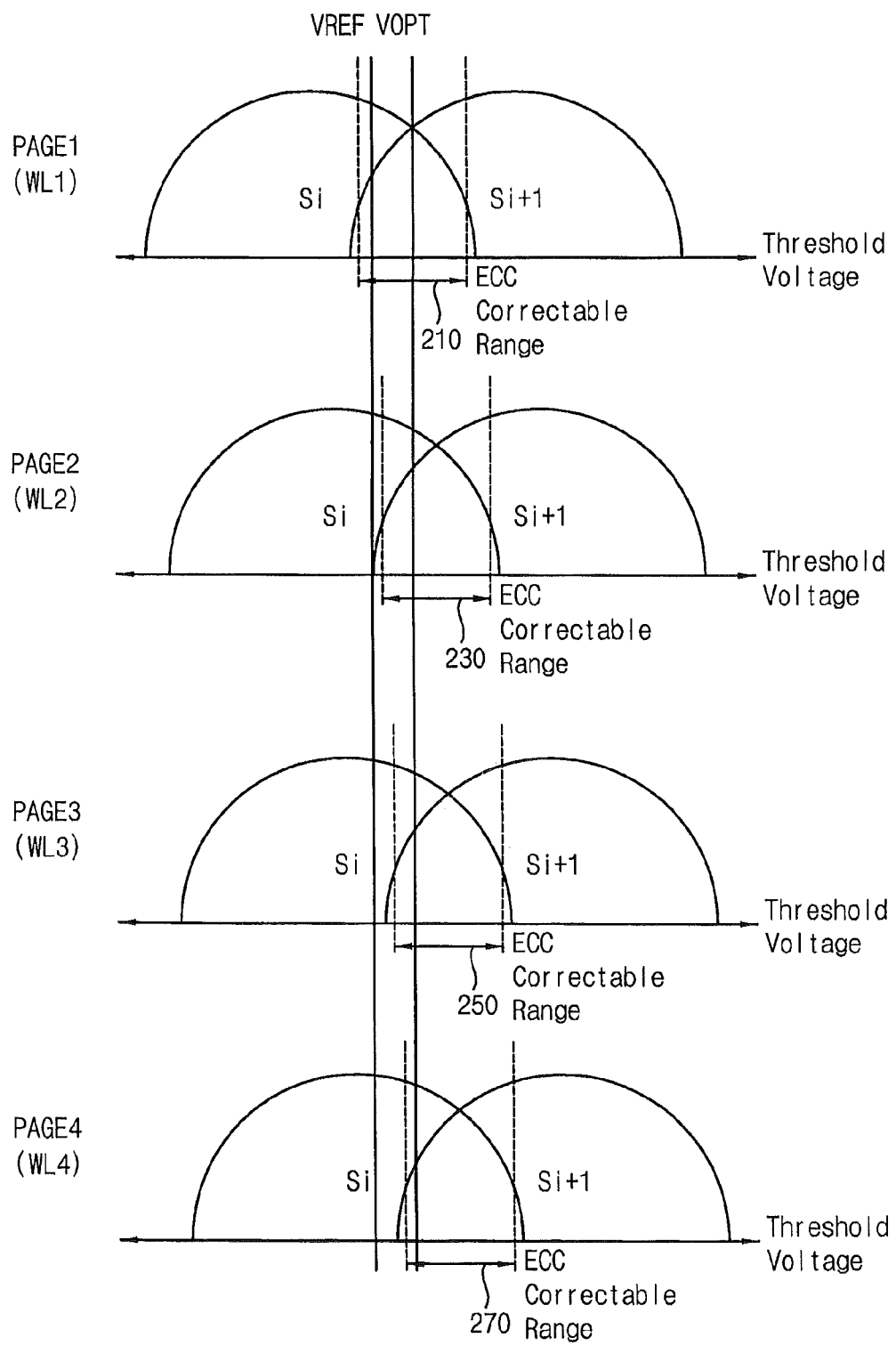
FIG. 2 is a diagram illustrating an example of threshold voltage distributions of a plurality of pages included in a nonvolatile memory device.

FIG. 1 is a flow chart illustrating a method of reading data from a nonvolatile memory device according to example embodiments, and FIG. 2 is a diagram illustrating an example of threshold voltage distributions of a plurality of pages included in a nonvolatile memory device.

Referring to FIGS. 1 and 2, a nonvolatile memory device performs a first read operation for a first page PAGE1 corresponding to a first word line WL1 by applying a first read voltage VREF to the first word line WL1 (S110). That is, the nonvolatile memory device may read data from memory cells coupled to the first word line WL1 by applying the first read voltage VREF having a predetermined voltage level to the first word line WL1.

The nonvolatile memory device performs a read retry to obtain an optimal read voltage level (more generally referred to herein as an error-correctable read level or voltage) regardless or independent of whether data read by the first read operation are error-correctable by an error correction code (ECC) (S130). Here, the read data may be error-correctable when the read data includes at least one error that can be corrected by the ECC, or when the read data includes no error. In a conventional nonvolatile memory device, the read retry may not be performed when the read data are error-correctable. However, in the nonvolatile memory device according to example embodiments, even if the data read by the first read operation are error-correctable, the optimal read level may be obtained by performing the read retry.

The nonvolatile memory device stores the optimal read level obtained by the read retry for a subsequent second read operation (S150). That is, the nonvolatile memory device may store the optimal read level obtained by the read retry, and may perform the subsequent second read operation using a second read voltage VOPT having the stored optimal read level. Since the subsequent second read operation is performed using the second read voltage VOPT having the optimal read level, a read time of the subsequent second read operation may be reduced.

For example, as illustrated in FIG. 2, the first read operation that reads data of the first page PAGE1 corresponding to the first word line WL1 by distinguishing between two adjacent (e.g., first and second) states Si and Si+1 of the memory cells coupled to the first word line WL1 by applying the first read voltage VREF having a predetermined reference level to the first word line WL1. If the reference level of the first read voltage VREF is in an error-correctable range 210, original data may be recovered by performing an error correction (e.g., ECC decoding) on the data of the first page PAGE1 that are read using the first read voltage VREF even if the read retry is not performed. However, in the data read method according to example embodiments, even if the data of the first page PAGE1 that are read using the first read voltage VREF are error-correctable, the read retry may be performed to obtain and store the optimal read level, and subsequent read operations may be performed using the second read voltage VOPT having the optimal read level.

For example, the subsequent second read operation for a second page PAGE2 corresponding to a second word line WL2 may be performed by applying the second read voltage VOPT having the optimal read level to the second word line WL2. In some cases, the reference level of the first read voltage VREF may be out of an error-correctable range 230 for the second page PAGE2, and the optimal read level of the second read voltage VOPT may be in the error-correctable range 230 for the second page PAGE2. In this case, in a conventional nonvolatile memory device, since the read retry is typically not performed when the data of the first page PAGE1 that are read using the first read voltage VREF are error-correctable, the subsequent second read operation is performed also using the first read voltage VREF, and data of the second page PAGE2 that are read by the second read operation may not be error-correctable. However, in the nonvolatile memory device according to example embodiments, since the second read operation for the second page PAGE2 is performed using the second read voltage VOPT having the optimal read level, the data of the second page PAGE2 read by the second read operation may be error-correctable. Accordingly, in the nonvolatile memory device according to example embodiments, a read time of the subsequent second read operation may be reduced, and a read latency from a time point of read command application to a time point of data output may be reduced.

Further, subsequent read operations for third and fourth pages PAGE3 and PAGE4 corresponding to third and fourth word lines WL3 and WL4 may be performed by applying the second read voltage VOPT having the optimal read level to the third and fourth word lines WL3 and WL4, respectively. In some cases, the reference level of the first read voltage VREF may be out of error-correctable ranges 250 and 270 for the third and fourth pages PAGE3 and PAGE4, and the optimal read level of the second read voltage VOPT may be in the error-correctable ranges 250 and 270 for the third and fourth pages PAGE3 and PAGE4. In this case, the data of the third and fourth pages PAGE3 and PAGE4 read by the subsequent read operations may be error-correctable. Accordingly, in the nonvolatile memory device according to example embodiments, the read time and the read latency of the subsequent read operations may be reduced.

As described above, in the method of reading data from the nonvolatile memory device according to example embodiments, the optimal read level (or, more generally, an error-correctable read level) may be obtained regardless or independent of whether data read by a read operation are error-correctable, and subsequent read operations may be performed using the optimal or other error-correctable read level. Accordingly, data read by the subsequent read operations may be error-correctable, and thus the read time and the read latency of the subsequent read operations may be reduced. Therefore, an average read time and an average read latency of the nonvolatile memory device according to example embodiments may be reduced.

Although FIG. 2 illustrates two states Si and Si+1 of the memory cells, the memory cells of the nonvolatile memory device according to example embodiments may have two or more states. In some example embodiments, the memory cells may be single level cells (SLCs) having two states to store one bit of data per memory cell. In other example embodiments, the memory cells may be multi-level cells (MLCs) having three or more states to store more than one bit of data per memory cell.

Figure 3:
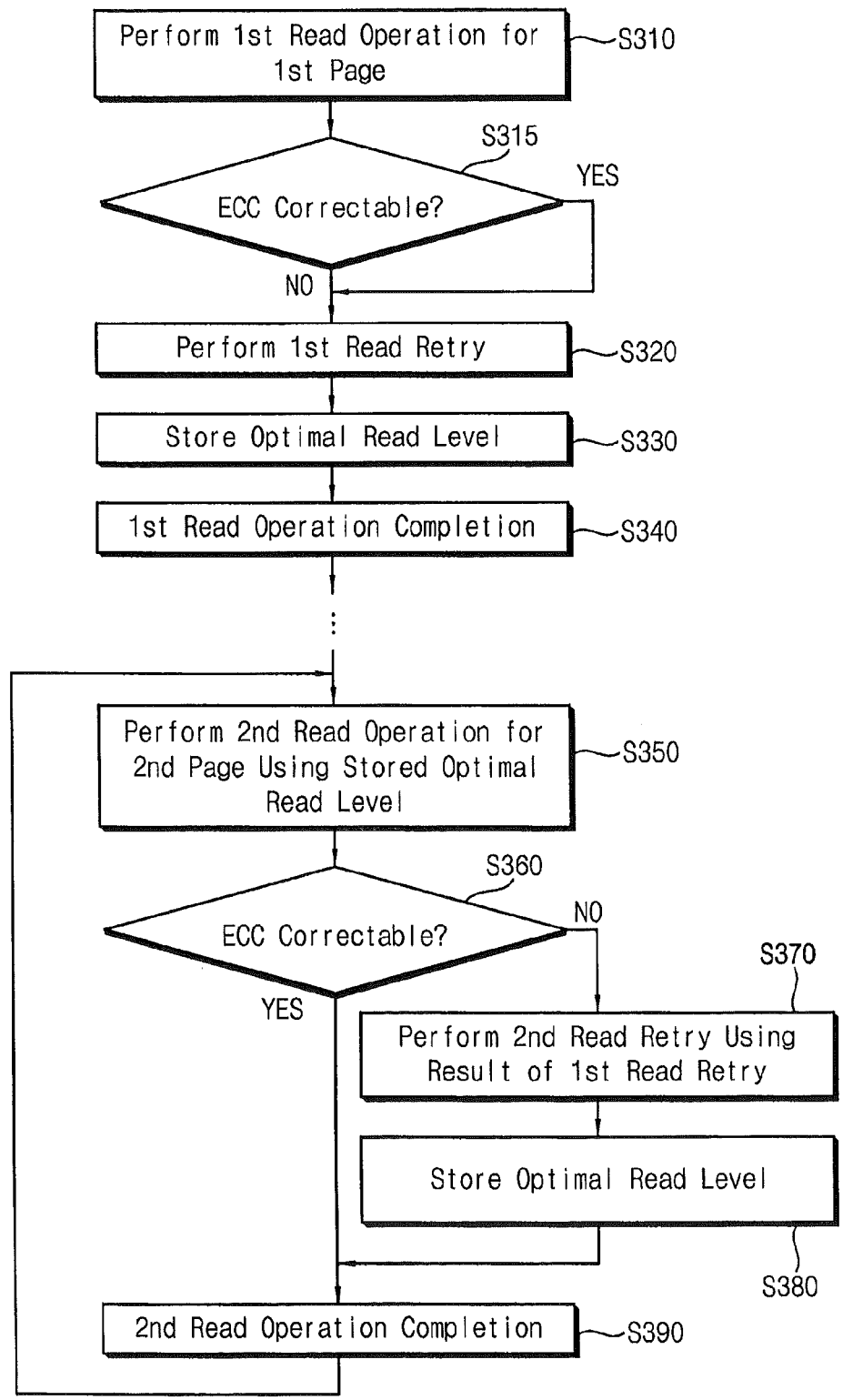
FIG. 3 is a flow chart illustrating methods of reading data from a nonvolatile memory device according to example embodiments.
Figures 4A, 4B:
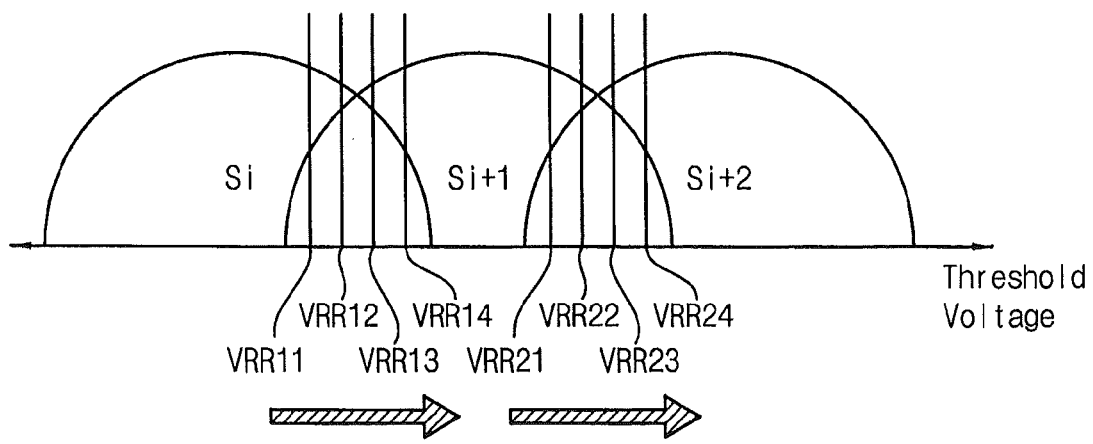
FIGS. 4A and 4B are diagrams for describing an example of a read retry.
Figure 5:
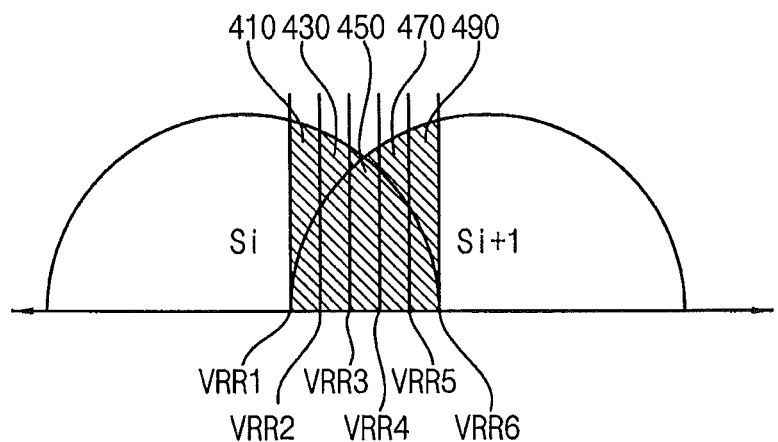
FIG. 5 is a diagram for describing another example of a read retry.
Figure 6A:
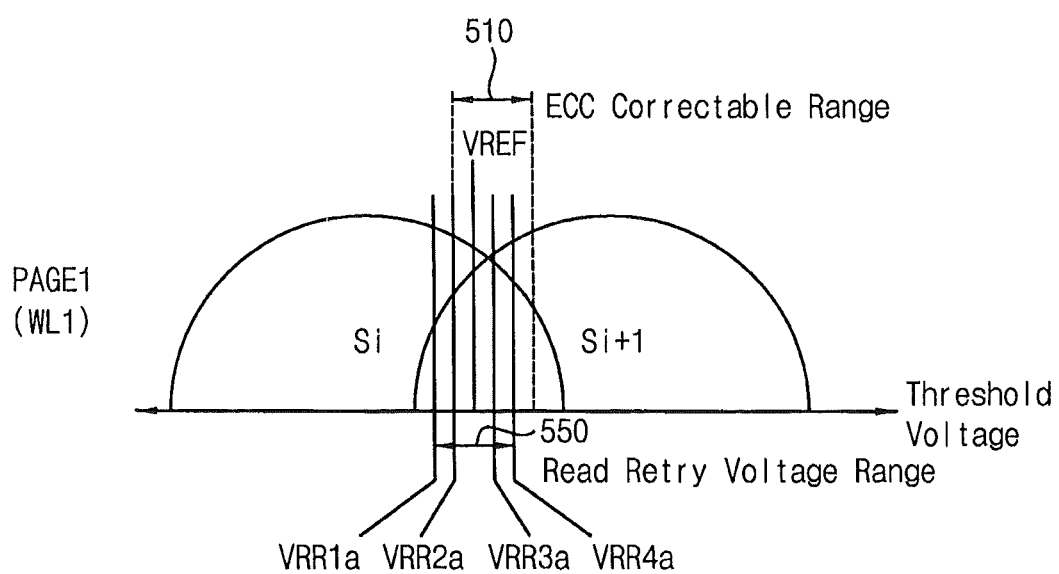
FIGS. 6A and 6B are diagrams for describing an example of a first read retry performed in a data read method of FIG. 3.
Figure 6B:
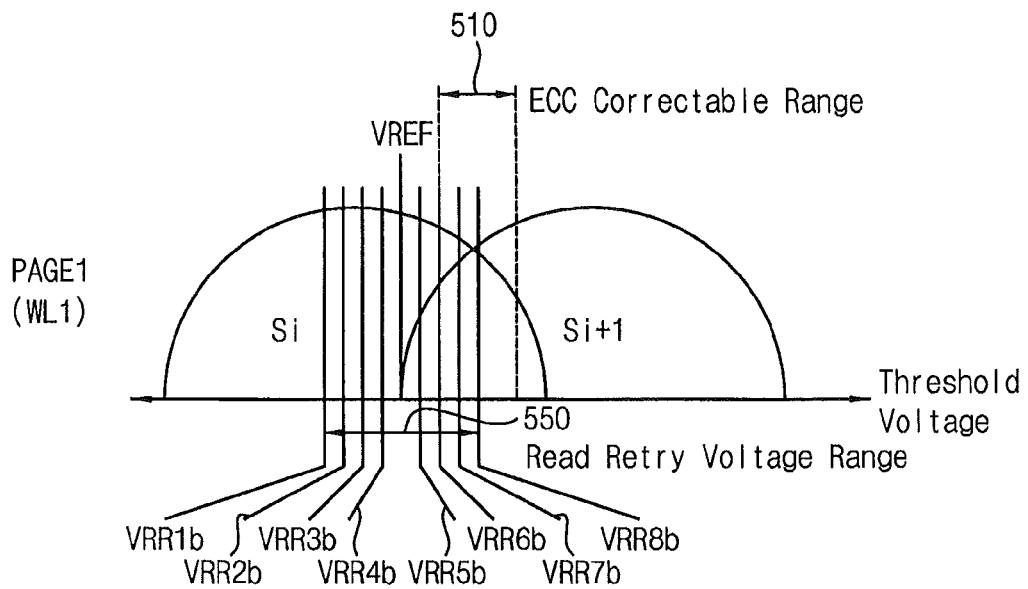
Figure 7:
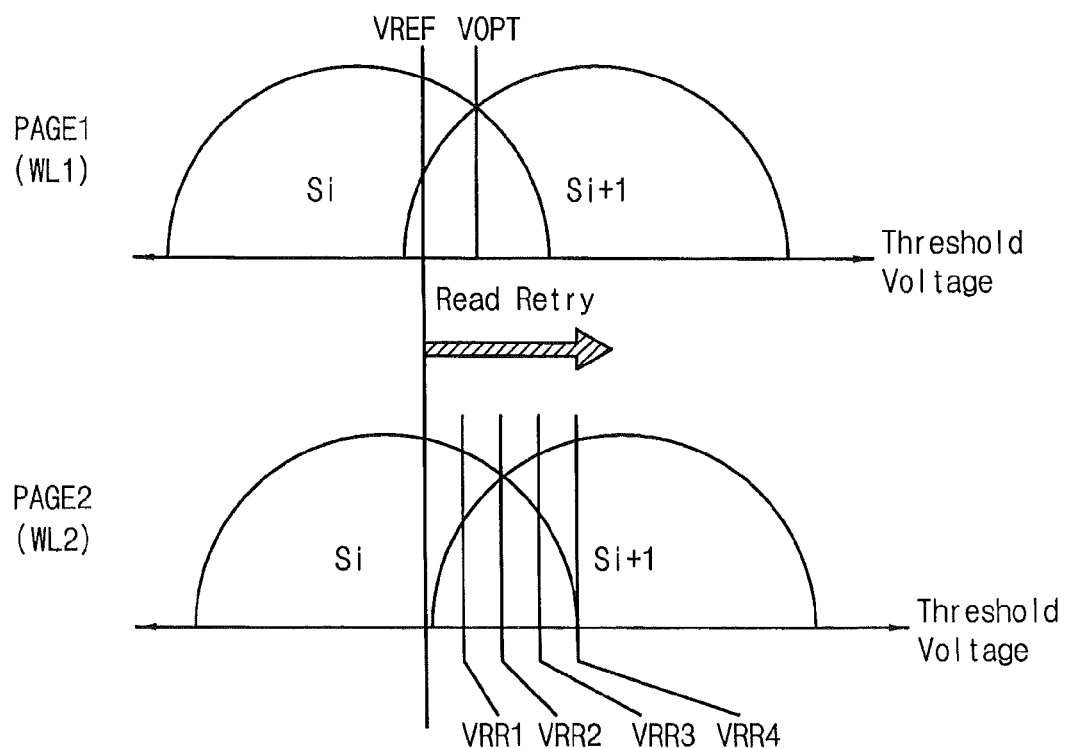
FIG. 7 is a diagram for describing an example of a second read retry performed in a data read method of FIG. 3.

FIG. 3 is a flow chart illustrating a method of reading data from a nonvolatile memory device according to example embodiments, FIGS. 4A and 4B are diagrams for describing an example of a read retry, FIG. 5 is a diagram for describing another example of a read retry, FIGS. 6A and 6B are diagrams for describing an example of a first read retry performed in a data read method of FIG. 3, and FIG. 7 is a diagram for describing an example of a second read retry performed in a data read method of FIG. 3.

Referring to FIG. 3, a nonvolatile memory device may perform a first read operation for a first page (S310). For example, the nonvolatile memory device may perform the first read operation for the first page corresponding to a first word line by applying a first read voltage having a predetermined reference level to the first word line. The nonvolatile memory device may output data of the first page read by the first read operation to a memory controller, and the memory controller may determine whether the data of the first page read by the first read operation are error-correctable by ECC (S315).

The nonvolatile memory device may perform a first read retry that obtains an optimal read level regardless or independent of whether the data of the first page read by the first read operation are error-correctable by the ECC (S315: YES, S315: NO and S320). That is, the nonvolatile memory device may perform the first read retry when the data of the first page are not error-correctable by the ECC (S315: NO and S320), and may also perform the first read retry even when the data of the first page are error-correctable by the ECC (S315: YES and S320).

For example, as illustrated in FIGS. 4A and 4B, the nonvolatile memory device may perform the first read retry by sequentially using read retry voltages VRR11, VRR12, VRR13, VRR14, VRR21, VRR22, VRR23 and VRR24 having read levels RL11, RL12, RL 13, RL14, RL21, RL22, RL 23 and RL24 stored in a read retry table 400. For example, the read retry table 400 may store first read levels RL11, RL12, RL 13 and RL14 of a first reference read voltage VREF1 for distinguishing between a first state Si and a second state Si+1 of memory cells, and may store second read levels RL21, RL22, RL 23 and RL24 of a second reference read voltage VREF2 for distinguishing between the second state Si+1 and a third state Si+2 of the memory cells. The nonvolatile memory device may obtain the optimal read level of the first reference read voltage VREF1 for distinguishing between the first state Si and the second state Si+1 by sequentially applying the read retry voltages VRR11, VRR12, VRR13 and VRR14 having the first read levels RL11, RL12, RL 13 and RL14 to the first word line until the read data become error-correctable by the ECC. The nonvolatile memory device may determine one of the first read levels RL11, RL12, RL 13 and RL14 of a read retry voltage that is applied when the read data become error-correctable by the ECC as the optimal read level of the first reference read voltage VREF1. Further, the nonvolatile memory device may obtain the optimal read level of the second reference read voltage VREF2 for distinguishing between the second state Si+1 and the third state Si+2 by sequentially applying the read retry voltages VRR21, VRR22, VRR23 and VRR24 having the second read levels RL21, RL22, RL 23 and RL24 to the first word line until the read data become error-correctable by the ECC.

Although FIGS. 4A and 4B illustrates an example where the first read levels RL11, RL12, RL 13 and RL14 of the read retry voltages VRR11, VRR12, VRR13 and VRR14 sequentially increase and the second read levels RL21, RL22, RL 23 and RL24 of the read retry voltages VRR21, VRR22, VRR23 and VRR24 sequentially increase, the first read levels RL11, RL12, RL 13 and RL14 and the second read levels RL21, RL22, RL 23 and RL24 may be any voltage levels that may not sequentially increase/decrease. For example, among the first read levels RL11, RL12, RL 13 and RL14, the read level RL12 of the read retry voltage VRR12 that is applied for the second time may be higher or lower than the read level RL11 of the read retry voltage VRR11 that is applied for the first time, and the read level RL13 of the read retry voltage VRR13 that is applied for the third time may be higher or lower than the read level RL12 of the read retry voltage VRR12 that is applied for the second time.

In other examples, as illustrated in FIG. 5, the nonvolatile memory device may perform the first read retry that obtains the optimal read level by counting the number of memory cells 410, 430, 450, 470 and 490 having threshold voltages between a plurality of read retry voltages VRR1, VRR2, VRR3, VRR4, VRR5 and VRR6 having regular intervals. For example, the number of the memory cells 410 having threshold voltages between a first read retry voltage VRR1 and a second read retry voltage VRR2 may be counted by subtracting the number of on-cells when the first read retry voltage VRR1 is applied from the number of on-cells when the second read retry voltage VRR2 is applied, the number of the memory cells 430 having threshold voltages between the second read retry voltage VRR2 and a third read retry voltage VRR3 may be counted by subtracting the number of on-cells when the second read retry voltage VRR2 is applied from the number of on-cells when the third read retry voltage VRR3 is applied, the number of the memory cells 450 having threshold voltages between the third read retry voltage VRR3 and a fourth read retry voltage VRR4 may be counted by subtracting the number of on-cells when the third read retry voltage VRR3 is applied from the number of on-cells when the fourth read retry voltage VRR4 is applied, the number of the memory cells 470 having threshold voltages between the fourth read retry voltage VRR4 and a fifth read retry voltage VRR5 may be counted by subtracting the number of on-cells when the fourth read retry voltage VRR4 is applied from the number of on-cells when the fifth read retry voltage VRR5 is applied, and the number of the memory cells 490 having threshold voltages between the fifth read retry voltage VRR5 and a sixth read retry voltage VRR6 may be counted by subtracting the number of on-cells when the fifth read retry voltage VRR5 is applied from the number of on-cells when the sixth read retry voltage VRR6 is applied. The nonvolatile memory device may determine a threshold voltage level of the memory cells 450 having the minimum number among the numbers of the memory cells 410, 430, 450, 470 and 490 as the optimal read level.

Although FIGS. 4A and 4B illustrate an example where the read retry is performed using the read retry table 400, and FIG. 5 illustrates an example where the read retry is performed by counting the number of memory cells having threshold voltages between the read retry voltages, the read retry performed in the data read method according to example embodiments may not be limited thereto, and may be performed in various manners. For example, in some example embodiments, the nonvolatile memory device may obtain a threshold voltage distribution of memory cells by using monitoring cells, and may perform the read retry by using the obtained threshold voltage distribution.

In some example embodiments, the nonvolatile memory device may perform the first read retry by using read retry voltages having different ranges according to whether the data of the first page read by the first read operation are error-correctable or not. For example, as illustrated in FIG. 6B, in a case where the reference level of the first read voltage VREF is out of an error-correctable range 510, the data read by the first read operation may not be error-correctable. In this case, the nonvolatile memory device may perform the first read retry using read retry voltages VRR1$b$, VRR2$b$, VRR3$b$, VRR4$b$, VRR5$b$, VRR6$b$, VRR7$b$ and VRR8$b$ having a first range 550. For example, the nonvolatile memory device may perform the first read retry by sequentially applying the read retry voltages VRR1$b$, VRR2$b$, VRR3$b$, VRR4$b$, VRR5$b$, VRR6$b$, VRR7$b$ and VRR8$b$ to the first word line WL1 until the read data become error-correctable as illustrated in FIGS. 4A and 4B, or may perform the first read retry by counting the number of memory cells having threshold voltage between the read retry voltages VRR1$b$, VRR2$b$, VRR3$b$, VRR4$b$, VRR5$b$, VRR6$b$, VRR7$b$ and VRR8$b$ as illustrated in FIG. 5. Further, as illustrated in FIG. 6A, in a case where the reference level of the first read voltage VREF is in the error-correctable range 510, the data read by the first read operation may be error-correctable. In this case, the nonvolatile memory device may perform the first read retry using read retry voltages VRR1$a$, VRR2$a$, VRR3$a$ and VRR4$a$ having a second range 530 narrower than the first range 550. For example, the nonvolatile memory device may perform the first read retry in a manner illustrated in FIGS. 4A and 4B, a manner illustrated in FIG. 5, or the like. In some example embodiments, in the case where the data read by the first read operation are error-correctable, the nonvolatile memory device may perform the first read retry using the read retry voltages VRR1a, VRR2a, VRR3a and VRR4a of which the number is less than the number of the read retry voltages VRR1b, VRR2b, VRR3b, VRR4b, VRR5b, VRR6b, VRR7b and VRR8b used when the data read by the first read operation are not error-correctable, thereby reducing a read time of the first read retry. In other example embodiments, the read retry voltages VRR1a, VRR2a, VRR3a and VRR4a used when the data read by the first read operation are error-correctable may have intervals narrower than intervals of the read retry voltages VRR1b, VRR2b, VRR3b, VRR4b, VRR5b, VRR6b, VRR7b and VRR8b used when the data read by the first read operation are not error-correctable.

Alternatively, in other example embodiments, the nonvolatile memory device may perform the first read retry by using the same read retry voltages having the same range regardless or independent of whether the data of the first page read by the first read operation are error-correctable or not.

The nonvolatile memory device may store the optimal read level obtained by the first read retry to perform a subsequent second read operation using the optimal read level (S330). The memory controller may recover original data by performing an error correction (e.g., ECC decoding) on the data of the first page read by the first read operation when the data of the first page read by the first read operation are error-correctable, or may recover the original data by performing an error correction on the data of the first page read by the first read retry when the data of the first page read by the first read operation are not error-correctable. In some example embodiments, the nonvolatile memory device may use a Bose-Chaudhuri-Hocquenghem (BCH) code to perform the error correction on the data of the first page read by the first read operation or the first read retry. In other example embodiments, to perform the error correction, the memory controller may use a turbo code, a Reed-Solomon code, a convolution code, a recursive systematic code (RSC), a coded modulation, such as a trellis-coded modulation (TCM), a block coded modulation (BCM), etc., or other error correction codes. Thus, the first read operation that reads the data of the first page may be completed (S340).

After the first read operation is completed, a host may request data of a second page from the memory controller, and the memory controller may transmit, to nonvolatile memory device, a command that requests reading the data of the second page from the nonvolatile memory device. The nonvolatile memory device may perform a second read operation for the second page using the stored read level (S350). For example, the nonvolatile memory device may perform the second read operation for the second page including memory cells coupled to a second word line by applying a second read voltage having the optimal read level to the second word line.

It may be determined whether the data of the second page read by the second read operation are error-correctable (S360), and a second read retry may be selectively performed according to whether the data of the second page read by the second read operation are error-correctable (S360 and S370). In a case where the data of the second page read by the second read operation are determined to be error-correctable (S360: YES), the nonvolatile memory device may complete the second operation without performing the second read retry (S390). In a case where the data of the second page read by the second read operation are determined not to be error-correctable (S360: NO), the nonvolatile memory device may perform the second read retry (S370). For example, the nonvolatile memory device may perform the second read retry in a manner illustrated in FIGS. 4A and 4B, a manner illustrated in FIG. 5, or the like. In the case where the second read retry is performed, the nonvolatile memory device may store a new optimal read level obtained by the second read retry to be used in subsequent read operations. In the data read method according to example embodiments, since the second read operation is performed using the optimal read retry obtained by the first read retry, a probability that the data of the second page read by the second read operation are error-correctable may be increased compared with that in a conventional data read method, and thus since the second read retry may not be performed. Accordingly, an average read time and an average read latency of the nonvolatile memory device may be reduced.

In some example embodiments, the nonvolatile memory device may perform the second read retry by using a result of the first read retry. For example, the second read retry may be performed based on a relationship between a voltage level of the first read voltage VREF and the optimal read level obtained by the first read retry. In some example embodiments, as illustrated in FIG. 7, in a case where the optimal read level higher than the voltage level of the first read voltage VREF applied during the first read operation is obtained as the result of the first read retry, the second read retry may be performed by applying read retry voltages VRR1, VRR2, VRR3 and VRR4 having voltage levels higher than the voltage level of the first read voltage VREF to the second word line WL2. Further, in a case where the optimal read level lower than the voltage level of the first read voltage VREF applied during the first read operation is obtained as the result of the first read retry, the second read retry may be performed by applying read retry voltages having voltage levels lower than the voltage level of the first read voltage VREF to the second word line WL2. In other example embodiments, in a case where the optimal read level is higher than the voltage level of the first read voltage VREF, the second read retry may be performed by applying read retry voltages having voltage levels higher than the optimal read level to the second word line WL2. Further, in a case where the optimal read level is lower than the voltage level of the first read voltage VREF, the second read retry may be performed by applying read retry voltages having voltage levels lower than the optimal read level to the second word line WL2. As described above, since the second read retry is performed using the result of the first read retry, a read time of the second read retry may be reduced.

The memory controller may recover original data by performing an error correction (e.g., ECC decoding) on the data of the second page read by the second read operation when the data of the second page read by the second read operation are error-correctable, or may recover the original data by performing an error correction on the data of the second page read by the second read retry when the data of the second page read by the second read operation are not error-correctable. Thus, the second read operation that reads the data of the second page may be completed (S390). Further, the nonvolatile memory device may further perform subsequent read operations by using the optimal read level obtained by the first read retry or the second read retry (S350).

As described above, in the method of reading data from the nonvolatile memory device according to example embodiments, the optimal read level may be obtained regardless or independent of whether the data read by the first read operation are error-correctable, and at least one subsequent read operation may be performed using the optimal read level. Accordingly, the data read by the subsequent read operations may be error-correctable, and thus a read time and a read latency of the subsequent read operations may be reduced. Therefore, an average read time and an average read latency of the nonvolatile memory device according to example embodiments may be reduced.

Figure 8A:
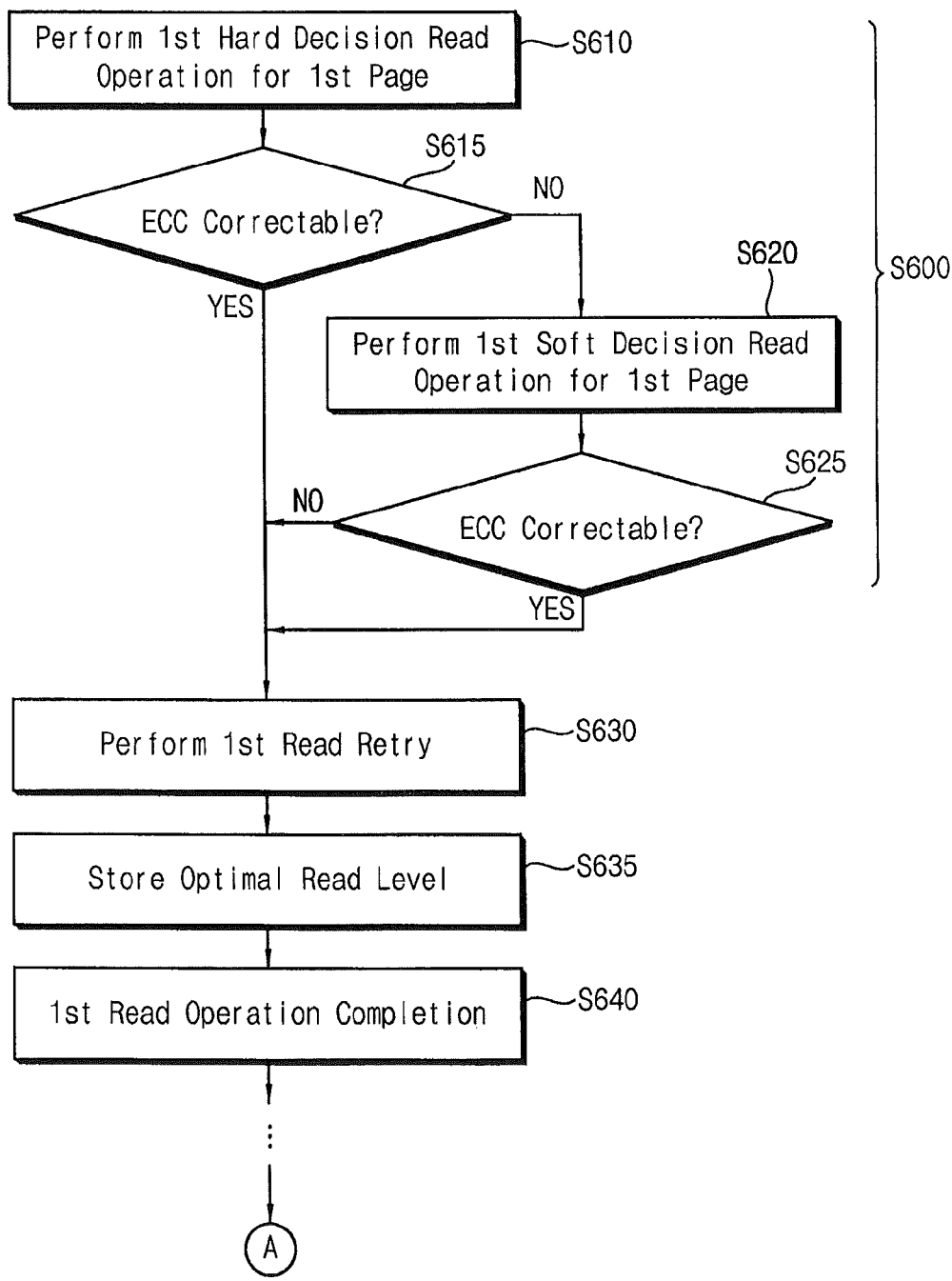
FIGS. 8A and 8B are a flow chart illustrating methods of reading data from a nonvolatile memory device according to example embodiments.
Figure 8B:
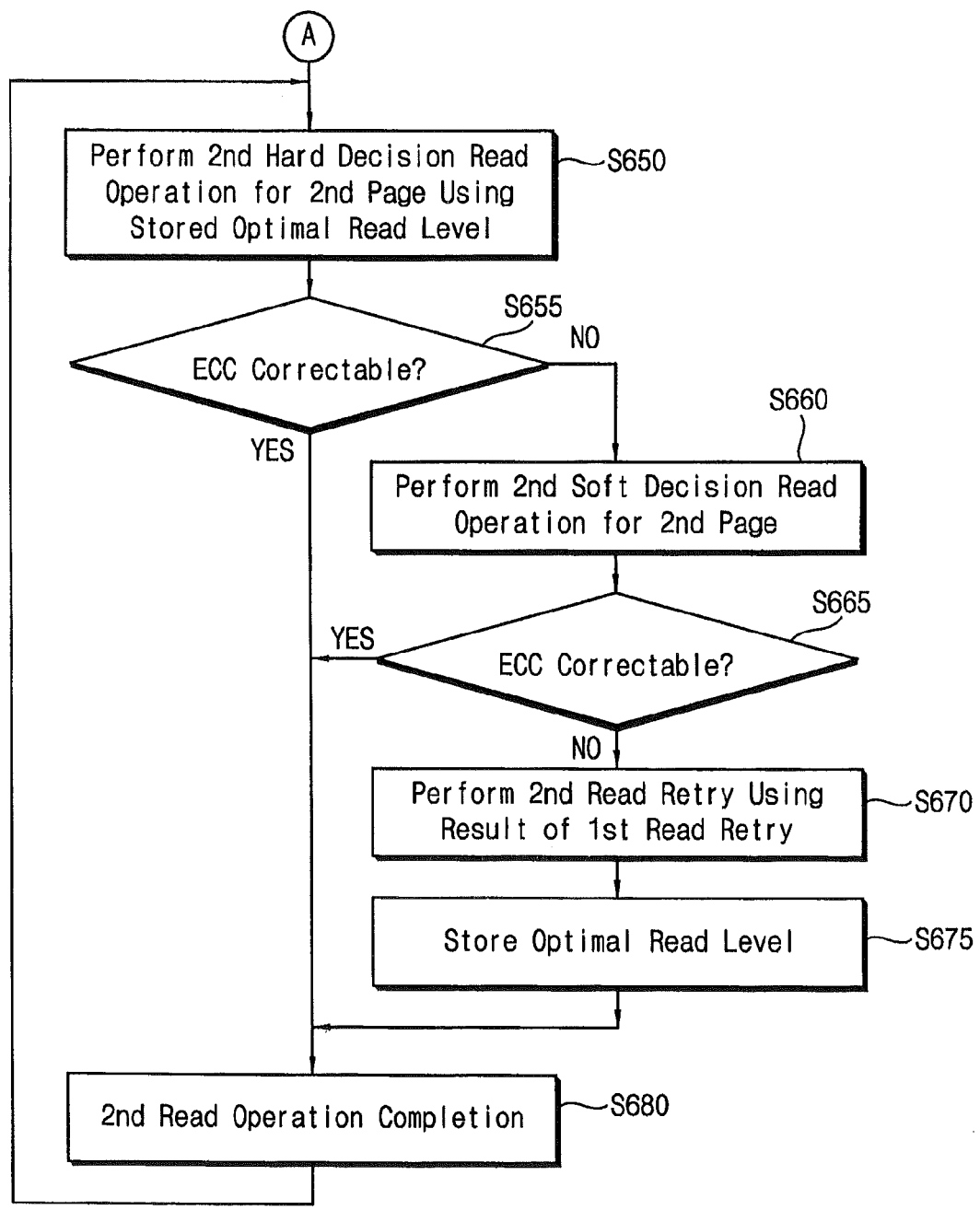
Figure 10:
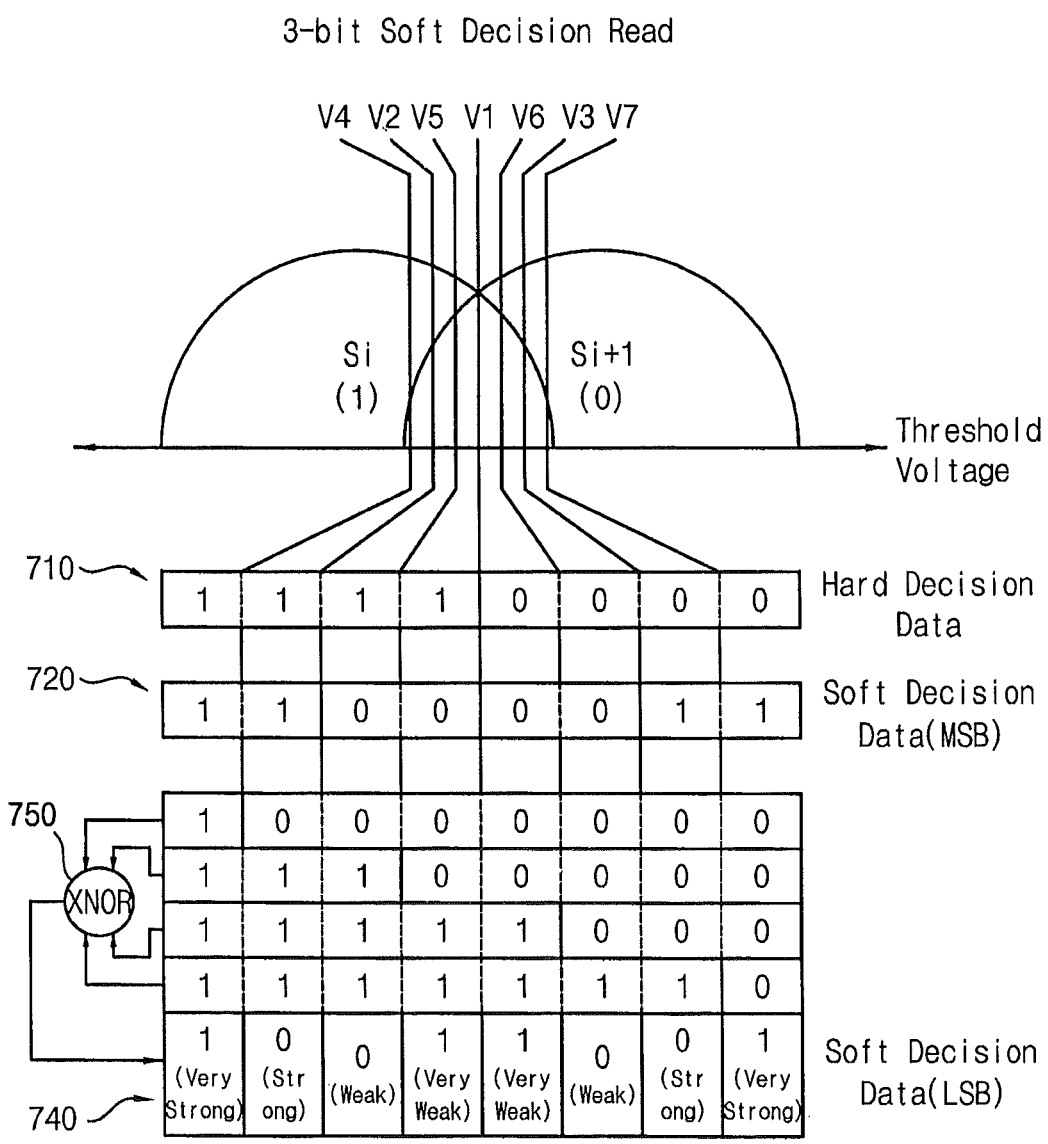
FIG. 10 is a diagram for describing an example of a 3-bit soft decision read operation.
Figure 11A:
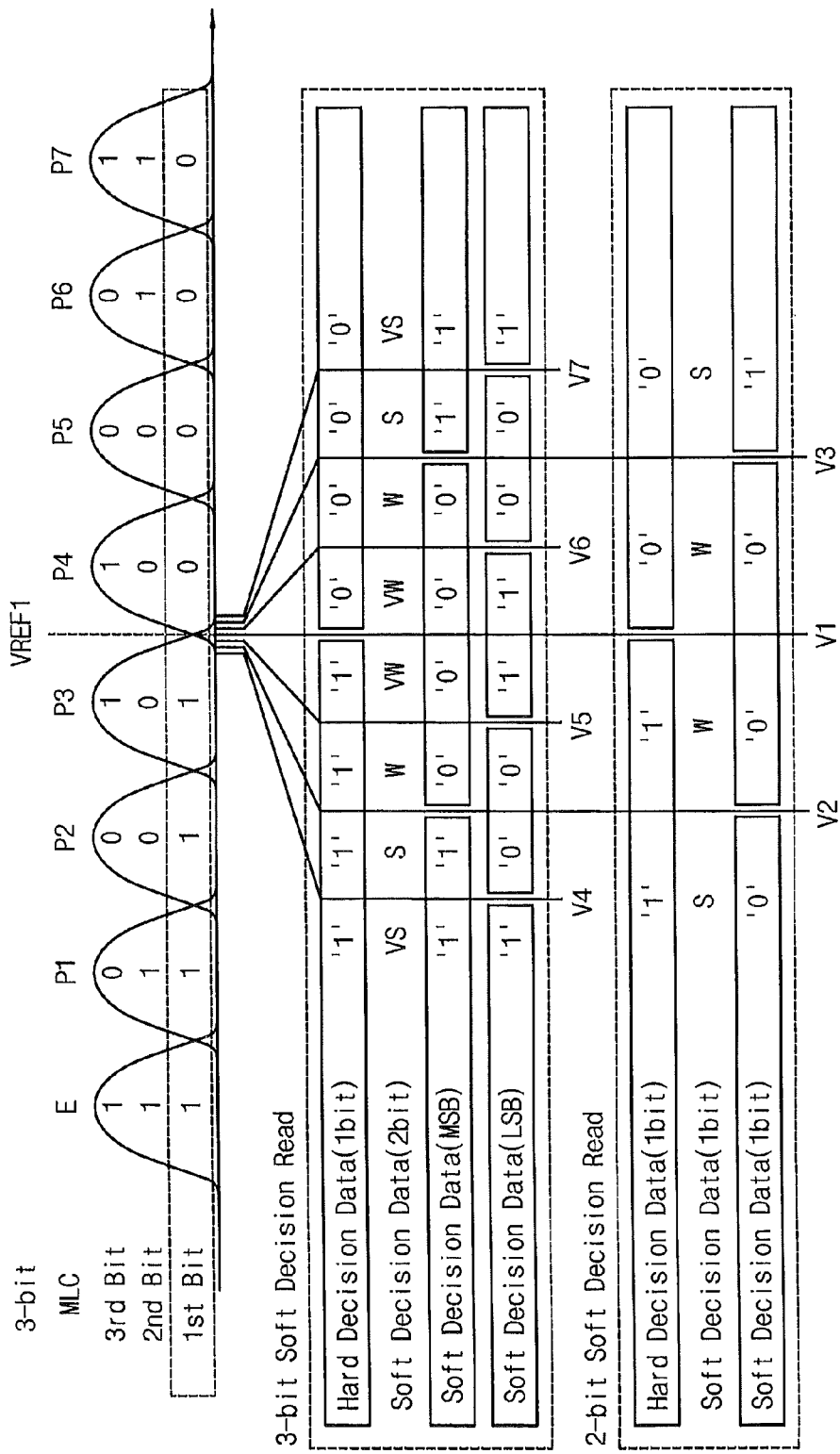
FIGS. 11A through 11C are diagrams for describing an example of a soft decision read operation performed in a nonvolatile memory device including 3-bit multi-level cell.
Figure 11B:
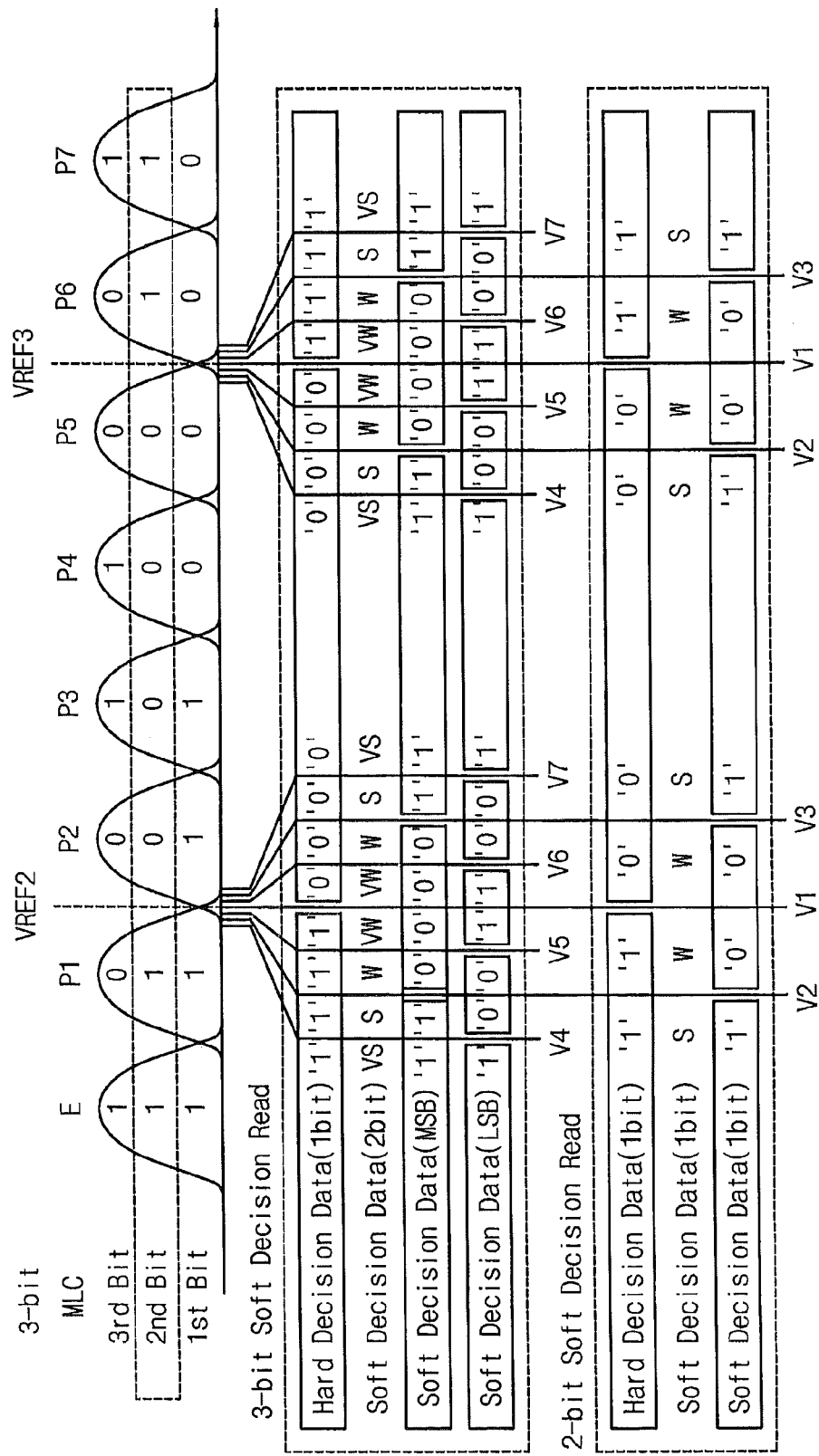
Figure 11C:
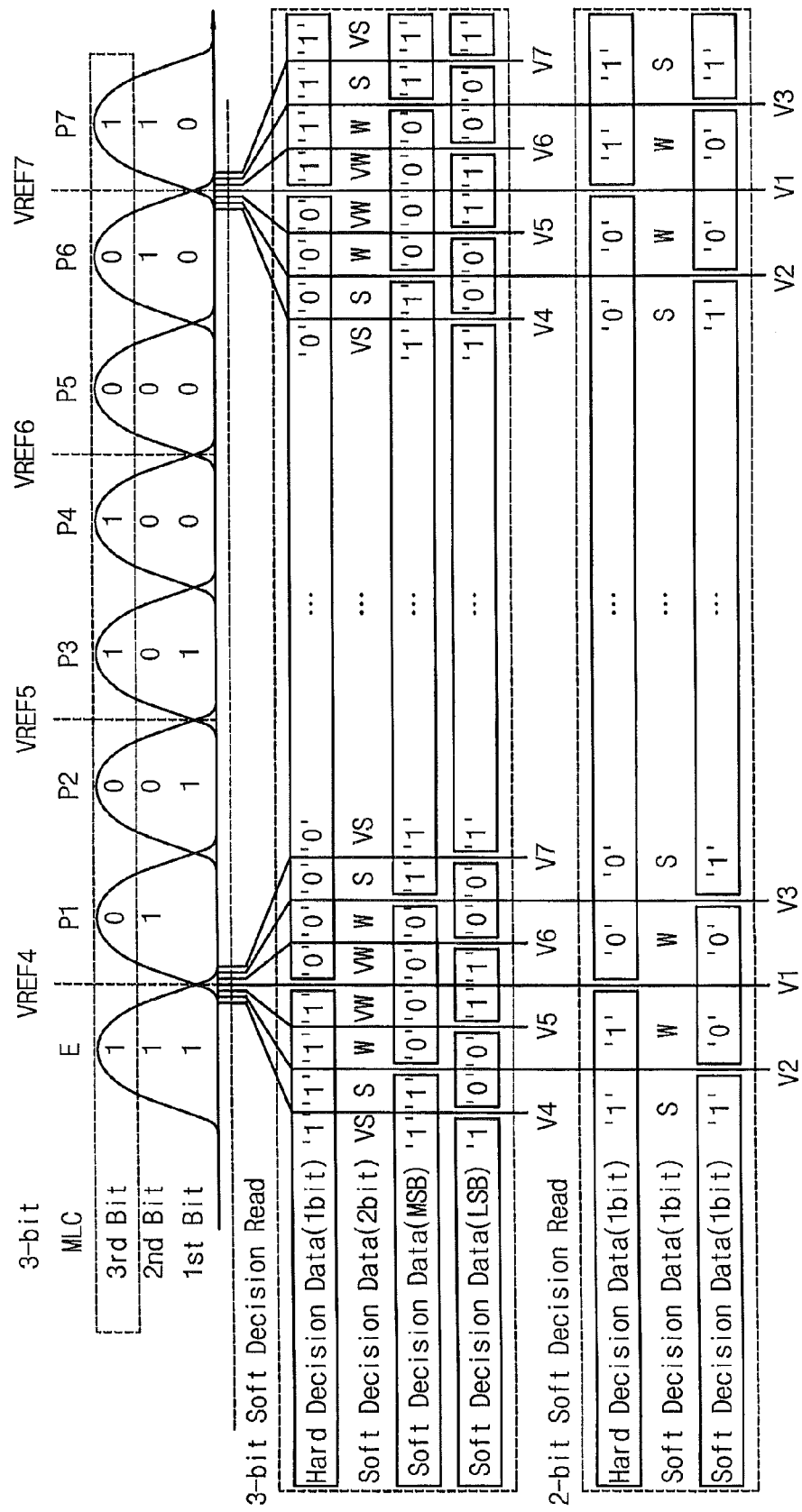
Figure 12:
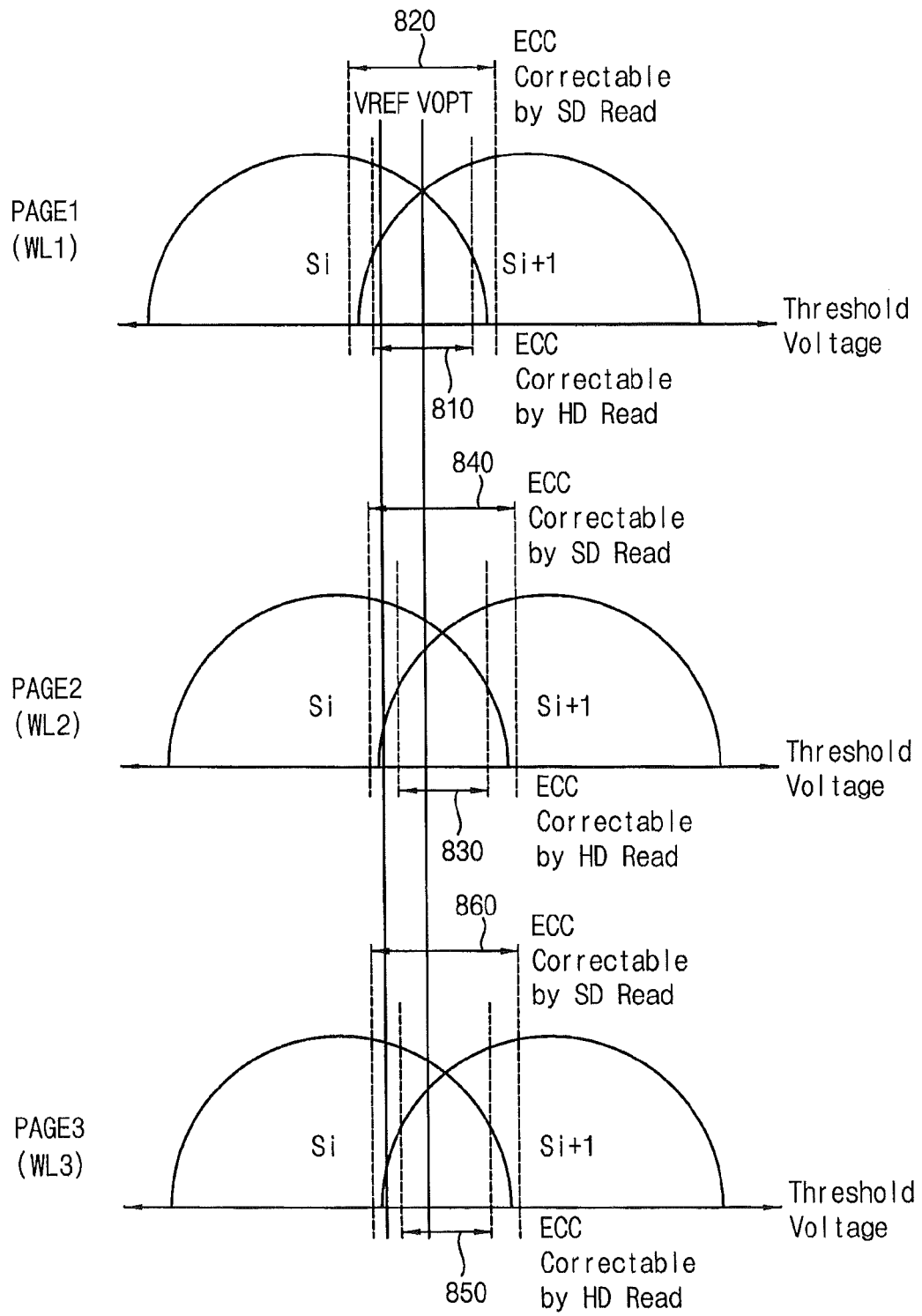
FIG. 12 is a diagram illustrating an example of threshold voltage distributions of a plurality of pages included in a nonvolatile memory device.

FIGS. 8A and 8B are a flow chart illustrating a method of reading data from a nonvolatile memory device according to example embodiments, FIG. 9 is a diagram for describing an example of a 2-bit soft decision read operation, FIG. 10 is a diagram for describing an example of a 3-bit soft decision read operation, FIGS. 11A through 11C are diagrams for describing an example of a soft decision read operation performed in a nonvolatile memory device including 3-bit multi-level cell, and FIG. 12 is a diagram illustrating an example of threshold voltage distributions of a plurality of pages included in a nonvolatile memory device.

Referring to FIGS. 8A and 8B, a nonvolatile memory device may perform a first read operation for a first page (S600). In some example embodiments, a read operation performed by the nonvolatile memory device may include a hard decision read operation and/or a soft decision read operation. The hard decision read operation is an operation that reads hard decision data from memory cells based on ON/OFF states (for example, indicating either a logic '0' or '1') of the memory cells coupled to a word line when a read voltage having a predetermined reference level is applied to the word line, and a memory controller may perform an error correction in a hard decision manner by using the hard decision data and an error correction code (e.g., a low density parity check (LDPC) code). Further, the soft decision read operation is an operation that reads soft decision data having reliability information for the hard decision data (for example, indicating a probability of a detected bit being a '0' or '1') from memory cells coupled to a word line by applying a plurality of read voltages having regular intervals, and the memory controller may perform an error correction in a soft decision manner by using the reliability information for the hard decision data as well as the hard decision data and the error correction code (e.g., the LDPC code).

For example, to perform the first read operation for the first page, the nonvolatile memory device may first perform a first hard decision read operation that reads first hard decision data of the first page (S610). The nonvolatile memory device may perform the first hard decision read operation that reads first hard decision data from the first page including memory cells coupled to a first word line by applying a first read voltage having a predetermined reference level to the first word line. The nonvolatile memory device may output the first hard decision data of the first page read by the first hard decision read operation to the memory controller, and the memory controller may determine whether the first hard decision data of the first page read by the first hard decision read operation are error-correctable by ECC (S615).

If the first hard decision data of the first page are not error-correctable by the ECC (S615: NO), the nonvolatile memory device may further perform a first soft decision read operation that reads first soft decision data of the first page having reliability information for the first hard decision data (S620). The nonvolatile memory device may read the first soft decision data having the reliability information for the first hard decision data from the first page including the memory cells coupled to the first word line by applying a plurality of voltages having regular intervals.

For example, as illustrated in FIG. 9, the nonvolatile memory device may perform a 2-bit soft decision read operation. The 2-bit soft decision read operation may include three read operations using three voltages V1, V2 and V3 having regular intervals. For example, the three voltages V1, V2 and V3 may include a first voltage V1 having a predetermined reference level for distinguishing between a first state Si corresponding to data '1' and a second state Si+1 corresponding to data '0', a second voltage V2 lower by a predetermined level than the first voltage V1, and a third voltage V3 higher by the predetermined level than the first voltage V1. In some example embodiments, data 710 read by using the first voltage V1 having the reference level may be hard decision data 710 read by a hard decision read operation, and the 2-bit soft decision read operation may use the hard decision data 710 read by the hard decision read operation without applying the first voltage V1 having the reference level. The 2-bit soft decision read operation may generate soft decision data 720 having reliability information for the hard decision data 710 by performing a predetermined logical operation (e.g., an XNOR operation 730) (or encoding) on data read by using the second voltage V2 and data read by using the third voltage V3. Each bit of the soft decision data 720 may represent a degree of reliability of a corresponding bit of the hard decision data 710. For example, a bit of the soft decision data 720 having a value of '1' may represent that a corresponding bit of the hard decision data 710 has strong (S) reliability, and a bit of the soft decision data 720 having a value of '0' may represent that a corresponding bit of the hard decision data 710 has weak (W) reliability.

In other examples, as illustrated in FIG. 10, the nonvolatile memory device may perform a 3-bit soft decision read operation. The 3-bit soft decision read operation may include seven read operations using seven voltages V1, V2, V3, V4, V5, V6 and V7 having regular intervals. For example, the seven voltages V1, V2, V3, V4, V5, V6 and V7 may include the three voltages V1, V2 and V3 used in the 2-bit soft decision read operation, and may further include a fourth voltage V4 lower than the second voltage V2, a fifth voltage V5 between the second voltage V2 and the first voltage V1, a sixth voltage V6 between the first voltage V1 and the third voltage V3, and seventh voltage V7 higher than the third voltage V3. In some example embodiments, the data 710 read by using the first voltage V1 may be the hard decision data 710 read by the hard decision read operation. The data 720 read by using the second and third voltages V2 and V3 may be most significant bit (MSB) soft decision data 720 corresponding to the soft decision data 720 read by the 2-bit soft decision read operation. The 3-bit soft decision read operation may generate least significant bit (LSB) soft decision data 740 by performing a predetermined logical operation (e.g., an XNOR operation 750) (or encoding) on data read by using the fourth voltage V4, the fifth voltage V5, the sixth voltage V6 and the seventh voltage V7. Each soft decision data 720 and 740 having two bits may represent a degree of reliability of a corresponding bit of the hard decision data 710. For example, each soft decision data 720 and 740 having a value of '11' may represent that a corresponding bit of the hard decision data 710 has very strong (VS) reliability, each soft decision data 720 and 740 having a value of '10' may represent that a corresponding bit of the hard decision data 710 has strong (S) reliability, each soft decision data 720 and 740 having a value of '00' may represent that a corresponding bit of the hard decision data 710 has weak (W) reliability, each soft decision data 720 and 740 having a value of '01' may represent that a corresponding bit of the hard decision data 710 has very weak (VW) reliability.

Although FIGS. 9 and 10 illustrate two adjacent states Si and Si+1, the 2-bit soft decision read operation and the 3-bit soft decision read operation illustrated in FIGS. 9 and 10 may be performed to distinguish between any two adjacent states of a plurality of states. For example, in a case where the memory cells are 3-bit MLCs having eight states E, P1, P2, P3, P5, P6 and P7 to store three bits of data per memory cell, the nonvolatile memory device may perform the 2-bit soft decision read operation or the 3-bit soft decision read operation in a manner illustrated FIGS. 11A through 11C. FIG. 11A illustrates an example of the 2-bit soft decision read operation and an example of the 3-bit soft decision read operation performed when first bits (e.g., LSBs) of data are read from the 3-bit MLCs by using a first reference read voltage VREF1, FIG. 11B illustrates an example of the 2-bit soft decision read operation and an example of the 3-bit soft decision read operation performed when second bits (e.g., CSBs) of data are read from the 3-bit MLCs by using second and third reference read voltages VREF2 and VREF3, FIG. 11C illustrates an example of the 2-bit soft decision read operation and an example of the 3-bit soft decision read operation performed when third bits (e.g., MSBs) of data are read from the 3-bit MLCs by using fourth through seventh reference read voltages VREF4, VREF5, VREF6 and VREF7.

The nonvolatile memory device may output the first soft decision data of the first page read by the first soft decision operation to the memory controller, and the memory controller may determine whether the first hard decision data are error-correctable based on the reliability information of the first soft decision data (S625).

The nonvolatile memory device may perform a first read retry that obtains an optimal read level regardless or independent of whether the first hard decision data are error-correctable (without the reliability information, or based on the reliability information of the first soft decision data) (S630). That is, not only when the first hard decision data are not error-correctable based on the reliability information of the first soft decision data (S625: NO), but also when the first hard decision data are error-correctable based on the reliability information of the first soft decision data (S625: YES), and even when the first hard decision data are error-correctable without the reliability information (S615: YES), the nonvolatile memory device may perform the first read retry (S630). In some example embodiments, at least a portion of read retry voltages used in the first read retry may correspond to at least a portion of a plurality of voltages having regular intervals used in the first soft decision read operation. In this case, the first read retry may use at least a portion of the first soft decision data.

In some example embodiments, the nonvolatile memory device may perform the first read retry by using read retry voltages having different ranges according to whether the first hard decision data are error-correctable without the reliability information or not and whether the first hard decision data are error-correctable based on the reliability information of the first soft decision data or not. For example, if the first hard decision data are determined not to be error-correctable based on the reliability information of the first soft decision data (S625: NO), the nonvolatile memory device may perform the first read retry using first read retry voltages having a first range. Compared with when the first hard decision data are not error-correctable based on the reliability information of the first soft decision data, the reference level of the first read voltage may be relatively close to the optimal read level when the first hard decision data are error-correctable based on the reliability information of the first soft decision data. Accordingly, if the first hard decision data are determined to be error-correctable based on the reliability information of the first soft decision data (S625: YES), the nonvolatile memory device may perform the first read retry using second read retry voltages having a second range narrower than the first range. Further, compared with when the first hard decision data are not error-correctable without the reliability information, the reference level of the first read voltage may be relatively close to the optimal read level when the first hard decision data are error-correctable without the reliability information. Accordingly, if the first hard decision data are determined to be error-correctable without the reliability information (S615: YES), the nonvolatile memory device may perform the first read retry using third read retry voltages having a third range narrower than the second range. In some example embodiments, the number of the second read retry voltages may be less than the number of the first read retry voltages, and the number of the third read retry voltages may be less than the number of the second read retry voltages.

The nonvolatile memory device may store the optimal read level obtained by the first read retry to perform a subsequent second read operation using the optimal read level (S635). The memory controller may perform an error correction in a hard decision manner or a soft decision manner by using an error correction code, the first hard decision data and/or the first soft decision data. For example, when the first hard decision data are error-correctable without the reliability information (S615: YES), the memory controller may recover original data by performing an error correction (or ECC decoding) on the first hard decision data of the first page in the hard decision manner by using the error correction code and the first hard decision data. When the first hard decision data are error-correctable based the reliability information of the first soft decision data (S625: YES), the memory controller may recover the original data by performing an error correction on the first hard decision data of the first page in the soft decision manner by using the error correction code, the first hard decision data and the first soft decision data. Further, when the first hard decision data are not error-correctable based the reliability information of the first soft decision data (S625: NO), the memory controller may recover the original data by performing an error correction on data of the first page read by the first read retry in the hard decision manner or the soft decision manner. Accordingly, the first read operation that reads the data of the first page may be completed (S640). In some example embodiments, the error correction code used in the error correction of the hard decision manner or the soft decision manner may be a low density parity check (LDPC) code.

After the first read operation is completed, a host may request data of a second page from the memory controller, and the memory controller may transmit, to nonvolatile memory device, a command that requests reading the data of the second page from the nonvolatile memory device. The nonvolatile memory device may perform a second read operation for the second page in response to the command (S650, S655, S660, S665, S670, S675 and S680). The second read operation may include a second hard decision read operation and/or a second soft decision read operation.

For example, to perform the second read operation for the second page, the nonvolatile memory device may first perform a second hard decision read operation that reads second hard decision data of the second page (S650). The nonvolatile memory device may perform the second hard decision read operation for the second page including memory cells coupled to a second word line by applying a second read voltage having the stored optimal read level to the second word line.

It is determined whether the second hard decision data read by the second hard decision read operation are error-correctable without the reliability information (S655). If the second hard decision data are determined not to be error-correctable (S655: NO), the nonvolatile memory device may perform a second soft decision read operation that reads second soft decision data having reliability information for the second hard decision data from the second page including the memory cells coupled to the second word line (S665). If the second hard decision data are determined to be error-correctable (S655: YES), the nonvolatile memory device may not perform the second soft decision read operation.

In a case where the second soft decision read operation is performed, the nonvolatile memory device may selectively perform a second read retry according to whether the second hard decision data are error-correctable based on the reliability information of the second soft decision data (S665 and S70). That is, the nonvolatile memory device may complete the second read operation without performing the second read retry if the second hard decision data are error-correctable based on the reliability information of the second soft decision data (S665: YES and S680), and may perform the second read retry if the second hard decision data are not error-correctable based on the reliability information of the second soft decision data (S665: NO and S670). For example, the nonvolatile memory device may perform the second read retry in a manner illustrated in FIGS. 4A and 4B, a manner illustrated in FIG. 5, or the like. In some example embodiments, the nonvolatile memory device may perform the second read retry by using a result of the first read retry, thereby reducing a read time of the second read retry. In a case where the second read retry is performed, the nonvolatile memory device may store a new optimal read level obtained by the second read retry to be used in subsequent read operations.

As described above, during the subsequent second read operation, the second soft decision read may be performed only when the data of the second page (or, the second hard decision data) read by the second hard decision read operation are not error-correctable. Further, during the subsequent second read operation, the second read retry may be performed only when the data of the second page are not error-correctable after the second soft decision read operation is performed. Since the second hard decision read operation is performed using the optimal read level obtained by the first read retry that is performed regardless or independent of whether the data of the first page (or, the first hard decision data) are error-correctable, a probability that the data of the second page read by the second hard decision read operation are error-correctable may be increased compared with that in a conventional data read method. Accordingly, the second soft decision read operation and/or the second read retry need not be performed, and thus an average read time and an average read latency of the nonvolatile memory device may be reduced.

For example, as illustrated in FIG. 12, the first read operation for the first page may be performed by applying a first read voltage VREF having a predetermined reference level to a first word line WL1. In a case where the reference level of the first read voltage VREF is in an error-correctable range 810 by the first hard decision read operation or in an error-correctable range 820 by the first soft decision read operation, the first read retry may not be performed in a conventional data read method, but the first read retry is performed to obtain the optimal read level in the data read method according to example embodiments. Accordingly, in the conventional data read method, subsequent hard decision read operations for second and third pages PAGE2 and PAGE3 use the first read voltage VREF, and thus soft decision read operations for the second and third pages PAGE2 and PAGE3 should be performed since the first read voltage VREF is out of error-correctable ranges 830 and 850 by the hard decision read operations for the second and third pages PAGE2 and PAGE3. Further, in the conventional data read method, if the first read voltage VREF is out of error-correctable ranges 840 and 860 by the soft decision read operations for the second and third pages PAGE2 and PAGE3, not only the soft decision read operations for the second and third pages PAGE2 and PAGE3 but also read retries for the second and third pages PAGE2 and PAGE3 should be performed. However, in the data read method according to example embodiments, the optimal read level may be obtained by the first read retry for the first page PAGE1, and a second read voltage VOPT having the optimal read level may be used for subsequent hard decision read operations for the second and third pages PAGE2 and PAGE3. Accordingly, the second read voltage VOPT may be in the error-correctable ranges 830 and 850 by the hard decision read operations for the second and third pages PAGE2 and PAGE3, and thus the soft decision read operations and the read retries for the second and third pages PAGE2 and PAGE3 may not be performed. As described above, in the subsequent read operations, since the soft decision read operations and the read retries may not be performed, an average read time and an average read latency of the nonvolatile memory device according to example embodiments may be reduced.

The memory controller may recover original data by performing an error correction on the data of the second page in the hard decision manner or the soft decision manner by using the error correction code, the hard decision data and/or the second soft decision data. Accordingly, the second read operation that reads the data of the second page may be completed (S680). The nonvolatile memory device may further perform subsequent read operations by using the optimal read level obtained by the first read retry or the second read retry (S650).

As described above, in the method of reading data from the nonvolatile memory device according to example embodiments, the optimal read level may be obtained regardless or independent of whether the data read by the first read operation are error-correctable, and the subsequent second read operation may be performed using the optimal read level. Accordingly, data read by the subsequent read operations may be error-correctable by the hard decision read operations without performing the soft decision read operations and/or the read retries, and thus read times and read latencies of the subsequent read operations may be reduced. Therefore, the average read time and the average read latency of the nonvolatile memory device according to example embodiments may be reduced.

Figure 13:
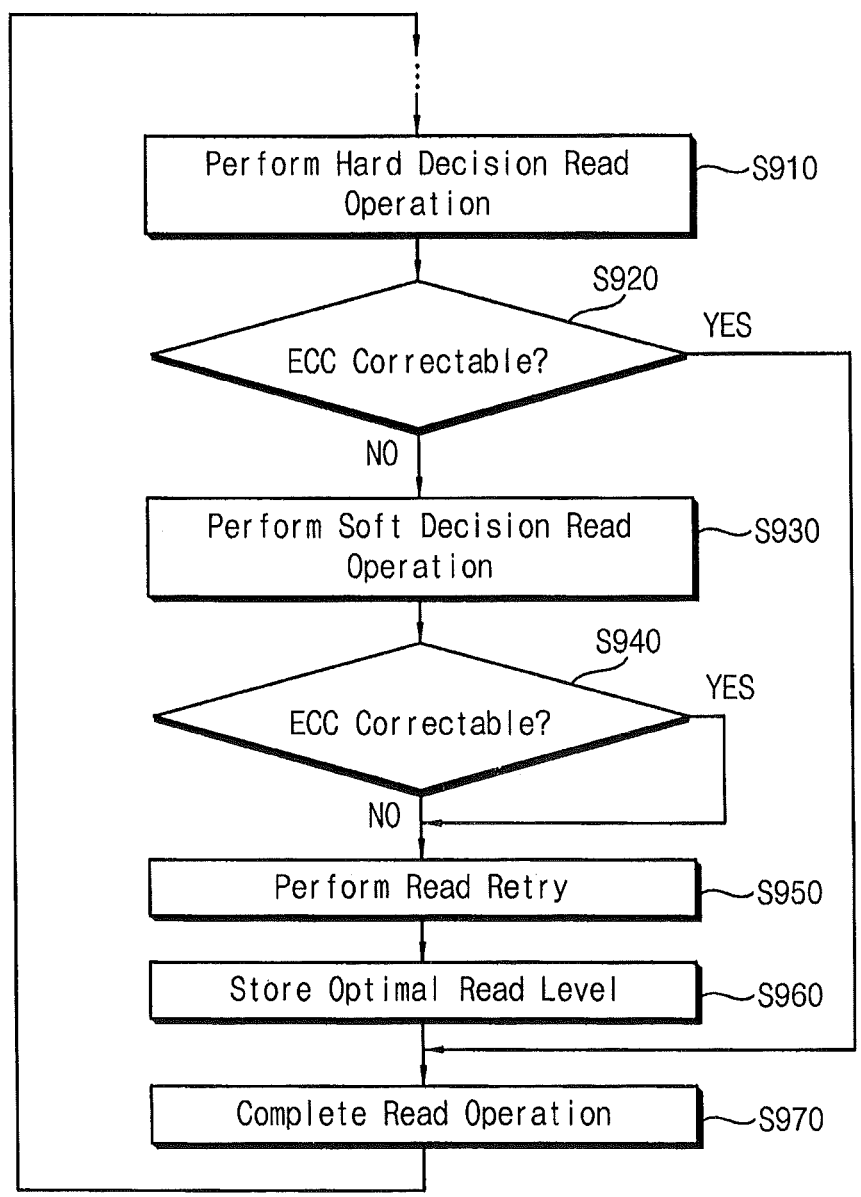
FIG. 13 is a flow chart illustrating methods of reading data from a nonvolatile memory device according to example embodiments.
Figure 14:
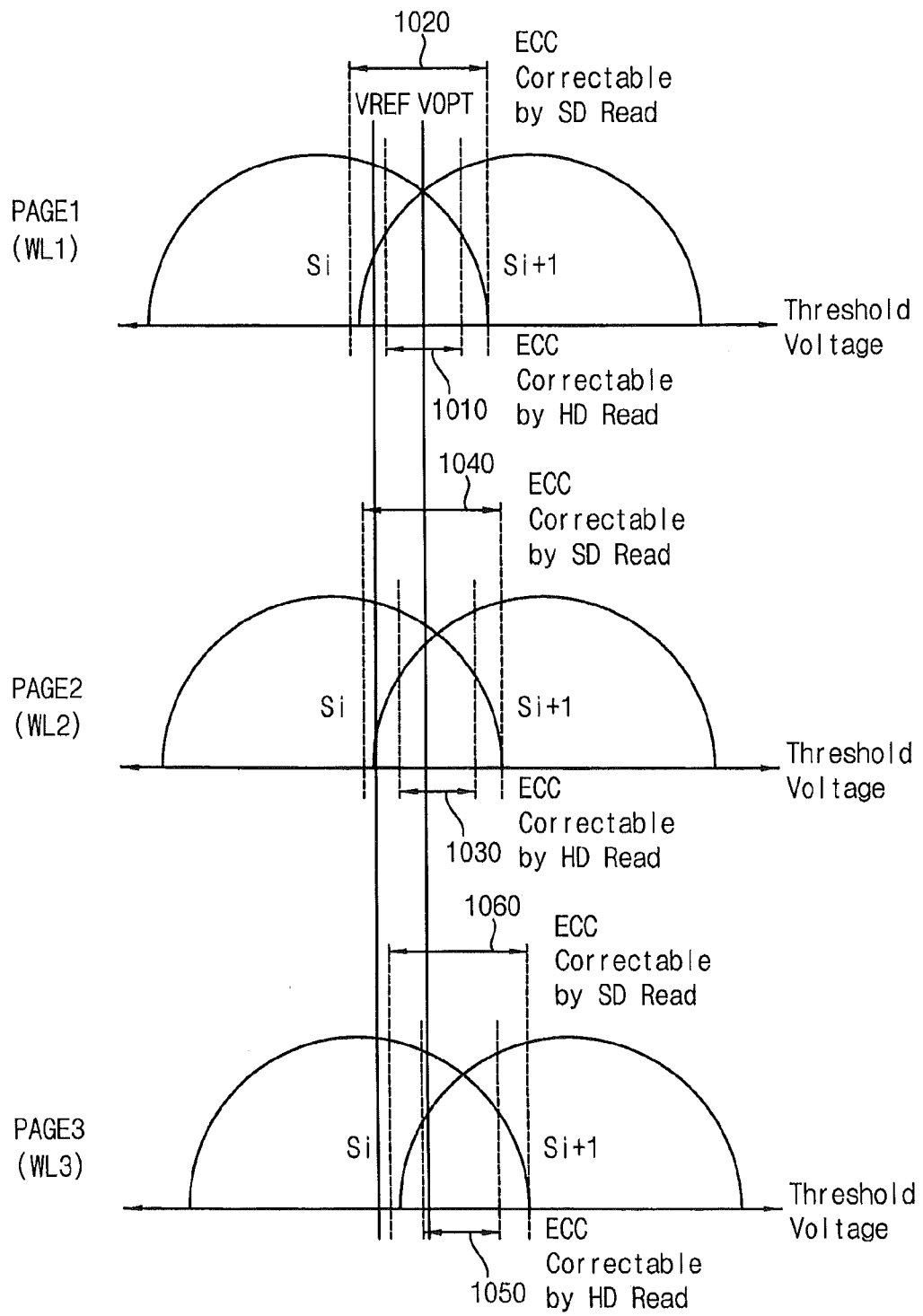
FIG. 14 is a diagram illustrating an example of threshold voltage distributions of a plurality of pages included in a nonvolatile memory device.

FIG. 13 is a flow chart illustrating a method of reading data from a nonvolatile memory device according to example embodiments, and FIG. 14 is a diagram illustrating an example of threshold voltage distributions of a plurality of pages included in a nonvolatile memory device.

Referring to FIG. 13, a nonvolatile memory device may perform a hard decision read operation that reads hard decision data (S910), and a memory controller may determine whether the hard decision data are error-correctable without reliability data (S920). If the hard decision data are error-correctable without the reliability data (S920: YES), the nonvolatile memory device and the memory controller may complete a read operation by recovering original data without performing a soft decision read operation and a read retry (S970).

If the hard decision data are not error-correctable without the reliability data (S920: NO), the nonvolatile memory device may perform a soft decision read operation that reads soft decision data having reliability information for the hard decision data (S930). The memory controller may determine whether the hard decision data are error-correctable based on the reliability data of the soft decision data (S940). The nonvolatile memory device may perform a read retry to obtain an optimal read level regardless or independent of whether the hard decision data are error-correctable based on the reliability data of the soft decision data (S950), and may store the optimal read level to be used in subsequent read operations (S960). That is, in the data read method according to example embodiments, the read retry may not be performed when the hard decision data are error-correctable without the reliability information (S920: YES), and the read retry may be performed when the hard decision data are not error-correctable based on the reliability data of the soft decision data (S940: NO) or even when the hard decision data are error-correctable based on the reliability data of the soft decision data (S940: YES).

In some example embodiments, the nonvolatile memory device may perform the read retry by using read retry voltages having different ranges according to whether the hard decision data are error-correctable based on the reliability data of the soft decision data. For example, when the hard decision data are determined not to be error-correctable based on the reliability information of the soft decision data, the nonvolatile memory device may perform the read retry using first read retry voltages having a first range, and, when the hard decision data are determined to be error-correctable based on the reliability information of the soft decision data, the nonvolatile memory device may perform the read retry using second read retry voltages having a second range narrower than the first range. The memory controller may recover original data by using an error correction code, the hard decision data and/or the soft decision data, and thus the read operation may be completed (S970). A subsequent read operation, or a subsequent hard decision read operation may be performed using the stored optimal read level (S910).

As described above, in the method of reading data from the nonvolatile memory device according to example embodiments, in a case where the soft decision read operation is performed, the read retry for obtaining the optimal read level may be performed regardless or independent of whether the hard decision data are error-correctable by the soft decision read operation. Further, since the hard decision read operation is performed using the optimal read level during a subsequent read operation, a probability that data read by the hard decision read operation of the subsequent read operation are error-correctable may be increased compared with that in a conventional data read method. Accordingly, the soft decision read operation and/or the read retry may not be performed during the subsequent read operation, and thus an average read time and an average read latency of the nonvolatile memory device according to example embodiments may be reduced.

For example, as illustrated in FIG. 14, a hard decision read operation for a first page PAGE1 may be performed by applying a first read voltage VREF having a predetermined reference level to a first word line WL1. In a case where the first read voltage VREF is out of an error-correctable range 1010 by the hard decision read operation, a soft decision read operation for the first page PAGE1 may be performed. If the first read voltage VREF is in an error-correctable range 1020 by the soft decision read operation, a read retry may not be performed in a conventional data read method, but the read retry may be performed to obtain an optimal read level in the data read method according to example embodiments. Accordingly, in the conventional data read method, subsequent hard decision read operations for second and third pages PAGE2 and PAGE3 use the first read voltage VREF, and thus soft decision read operations for the second and third pages PAGE2 and PAGE3 should be performed since the first read voltage VREF is out of error-correctable ranges 1030 and 1050 by the hard decision read operations for the second and third pages PAGE2 and PAGE3. Further, in the conventional data read method, a read retry for the second page PAGE2 may not be performed if the first read voltage VREF is in an error-correctable range 1040 by the soft decision read operation for the second page PAGE2, but a read retry for the third page PAGE3 is further performed if the first read voltage VREF is out of an error-correctable range 1060 by the soft decision read operation for the third page PAGE3. However, in the data read method according to example embodiments, the optimal read level may be obtained by the first read retry for the first page PAGE1, and a second read voltage VOPT having the optimal read level may be used for subsequent hard decision read operations for the second and third pages PAGE2 and PAGE3. Accordingly, the second read voltage VOPT may be in the error-correctable ranges 1030 and 1050 by the hard decision read operations for the second and third pages PAGE2 and PAGE3, and thus the soft decision read operations and the read retries for the second and third pages PAGE2 and PAGE3 may not be performed. As described above, in the subsequent read operations, since the soft decision read operations and the read retries may not be performed, an average read time and an average read latency of the nonvolatile memory device according to example embodiments may be reduced.

As described above, in methods of reading data from the nonvolatile memory device according to example embodiments, the optimal read level may be obtained even if read data are error-correctable by the soft decision read operation, and at least one subsequent read operation may be performed using the optimal read level. Accordingly, data read by the subsequent read operations may be error-correctable by the hard decision read operations without performing the soft decision read operations and/or the read retries, and thus read times and read latencies of the subsequent read operations may be reduced. Therefore, the average read time and the average read latency of the nonvolatile memory device according to example embodiments may be reduced.

Figure 15:
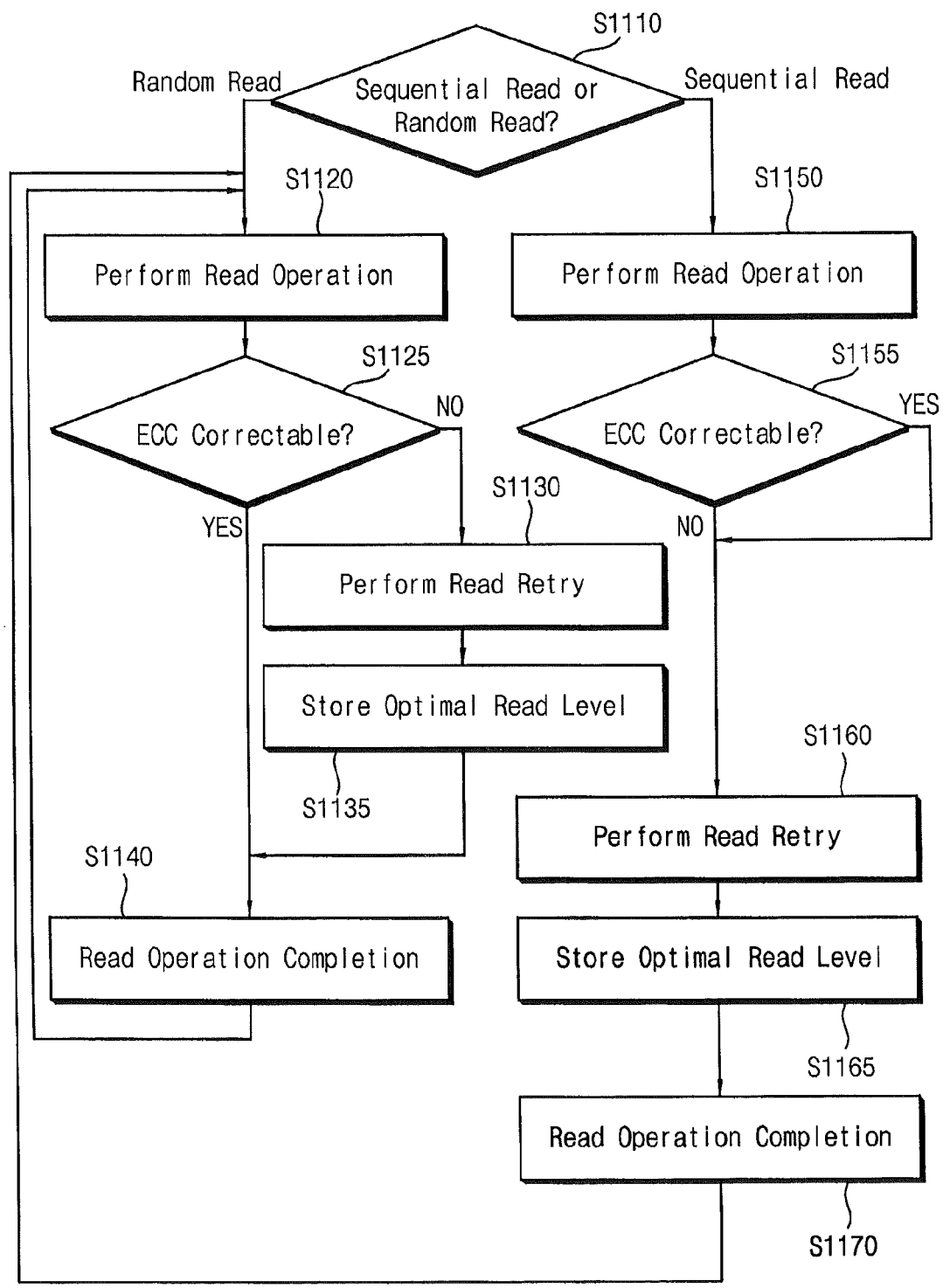
FIG. 15 is a flow chart illustrating methods of reading data from a nonvolatile memory device according to example embodiments.
Figure 16:
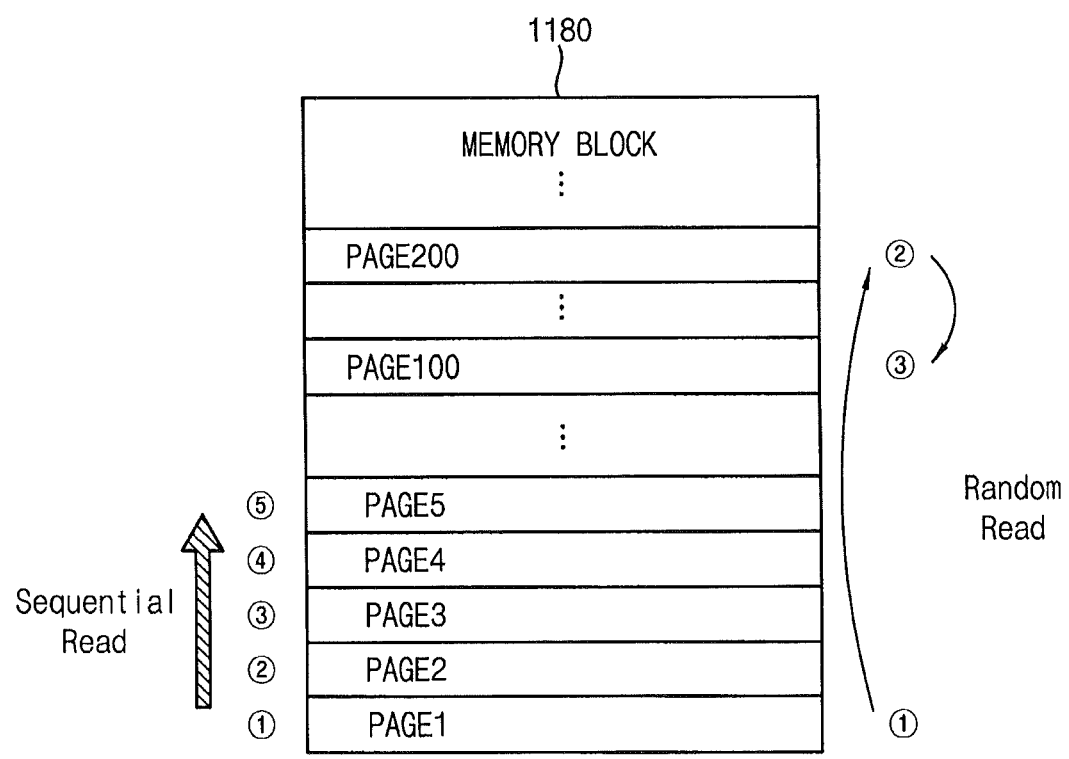
FIG. 16 is a diagram for describing sequential read operations and random read operations.

FIG. 15 is a flow chart illustrating a method of reading data from a nonvolatile memory device according to example embodiments, and FIG. 16 is a diagram for describing sequential read operations and random read operations.

Referring to FIG. 15, according to whether a read operation to be performed is one of sequential read operations or one of random read operations, a nonvolatile memory device may perform a read retry regardless or independent of whether read data are error-correctable, or may selectively perform the read retry according to whether the read data are error-correctable. For example, it may be determined whether the read operation is one of the sequential read operations or one of the random read operations (S1110). For example, as illustrated in FIG. 16, the read operation may be determined to be one of the sequential read operations if the read operation is one of operations that sequentially read data from a plurality of adjacent pages PAGE1, PAGE2, PAGE3, PAGE4 and PAGE5, and may be determined to be one of the random read operations if the read operation is one of operations that read data from a plurality of non-adjacent pages PAGE1, PAGE100 and PAGE200. Although FIG. 16 illustrates an example of the random read operations that read data from the non-adjacent pages PAGE1, PAGE100 and PAGE200 included in one memory block 1180, in some example embodiments, the random read operations may include read operations for a plurality of pages included in different memory blocks. In some example embodiments, whether the read operation is one of the sequential read operations or one of the random read operations may be determined by a memory controller. In other example embodiments, whether the read operation is one of the sequential read operations or one of the random read operations may be determined by a host.

If the read operation is one of the random read operations (S1110: Random Read), the nonvolatile memory device may perform the read operation (S1120). In case of the random read, the nonvolatile memory device may not perform the read retry when read data are error-correctable (S1125: YES), and may perform the read retry to obtain and store an optimal read level only when the read data are not error-correctable (S1125: NO, S1130 and S1135). Original data may be recovered by performing an error correction on data read by the read operation or the read retry, and the read operation may be completed (S1140).

If the read operation is one of the sequential read operations (S1110: Sequential Read), the nonvolatile memory device may perform the read operation (S1150), and may perform the read retry regardless or independent of whether read data are error-correctable (S1155 and S1160). That is, if the read data are not error-correctable (S1155: NO), or even if the read data are error-correctable (S1155: YES), the nonvolatile memory device may perform the read retry to obtain an optimal read level, and may store the optimal read level to be used in subsequent read operations of the sequential read operations (S1165). Original data may be recovered by performing an error correction on data read by the read operation or the read retry, and the read operation may be completed (S1170). The subsequent read operations of the sequential read operations may be performed using the stored optimal read level (S1120). During the subsequent read operations, read retries may be selectively performed according to whether data read by the subsequent read operations are error-correctable (S1125 and S1130). Adjacent pages may have similar threshold voltage distribution characteristics. Thus, if subsequent read operations of sequential read operations are performed using an optimal read level obtained by one of the sequential read operations, a probability that data read by the subsequent read operations are error-correctable may be increased. Accordingly, read retries may not be performed during the subsequent read operations, and thus an average read time and an average read latency of the nonvolatile memory device may be reduced.

As described above, in the method of reading data from the nonvolatile memory device according to example embodiments, if a read operation is one of sequential read operations, a read retry may be performed regardless or independent of whether read data are error-correctable. Accordingly, read retries may not be performed during subsequent read operations, and thus the average read time and the average read latency of the nonvolatile memory device may be reduced.

Figure 17:
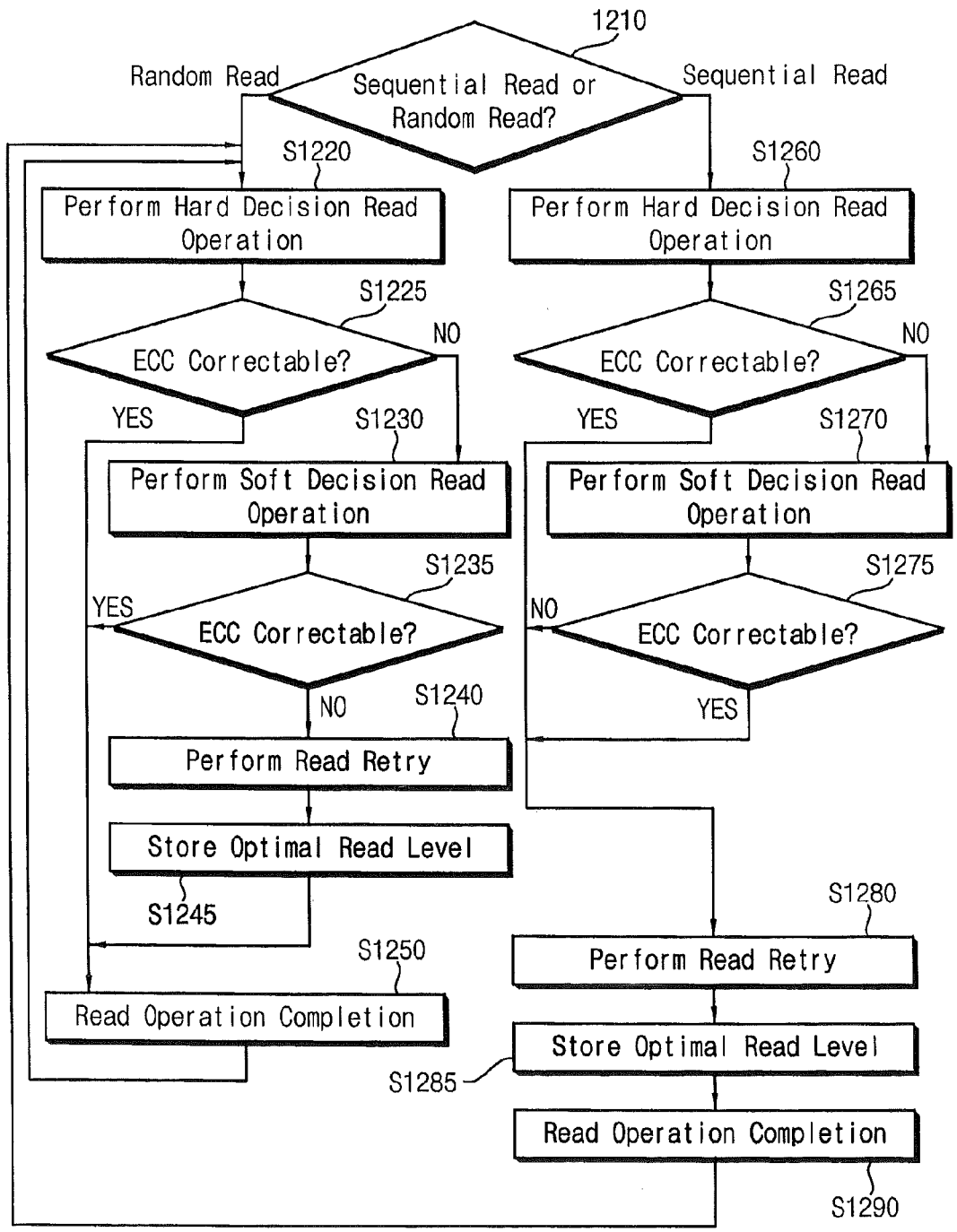
FIG. 17 is a flow chart illustrating methods of reading data from a nonvolatile memory device according to example embodiments.

FIG. 17 is a flow chart illustrating a method of reading data from a nonvolatile memory device according to example embodiments.

Referring to FIG. 17, according to whether a read operation to be performed is one of sequential read operations or one of random read operations, a nonvolatile memory device may perform a read retry regardless or independent of whether read data are error-correctable, or may selectively perform the read retry according to whether the read data are error-correctable. It may be determined whether the read operation is one of the sequential read operations or one of the random read operations (S1210).

If the read operation is one of the random read operations (S1210: Random Read), the nonvolatile memory device may perform a hard decision read operation that reads hard decision data (S1220), and may complete the read operation without performing a soft decision read operation and a read retry if the hard decision data are error-correctable without reliability information (S1225: YES and S1250). If the hard decision data are not error-correctable without reliability information (S1225: NO), the nonvolatile memory device may perform a soft decision read operation that reads soft decision data having the reliability information for the hard decision data (S1230), and may complete the read operation without performing a read retry if the hard decision data are error-correctable based on the reliability information of the soft decision data (S1235: YES and S1250). If the hard decision data are not error-correctable based on the reliability information of the soft decision data (S1235: NO), the nonvolatile memory device may perform a read retry (S1240), may store an optimal read level obtained by the read retry (S1245), and may complete the read operation (S1250).

If the read operation is one of the sequential read operations (S1210: Sequential Read), the nonvolatile memory device may perform a read retry regardless or independent of whether read data are error-correctable. For example, the nonvolatile memory device may perform a hard decision read operation that reads hard decision data (S1260), and may perform the read retry without performing a soft decision read operation if the hard decision data are error-correctable without reliability information (S1265: YES and S1280). If the hard decision data are not error-correctable without reliability information (S1265: NO), the nonvolatile memory device may perform a soft decision read operation that reads soft decision data having the reliability information for the hard decision data (S1270). Further, the nonvolatile memory device may perform the read retry that obtains the optimal read level if the hard decision data are not error-correctable based on the reliability information of the soft decision data, or even if the hard decision data are error-correctable based on the reliability information of the soft decision data (S1275: NO, S1275: YES and S1280). The nonvolatile memory device may store the optimal read level to be used in subsequent read operations of the sequential read operations (S1285), and may complete the read operation (S1290). During the subsequent read operations of the sequential read operations, subsequent hard decision read operations may be performed using the stored optimal read level (S1220), and read retries may be selectively performed according to whether read data are error-correctable (S1225, S1230, S1235 and S1240). Adjacent pages may have similar threshold voltage distribution characteristics. Thus, if subsequent read operations of sequential read operations are performed using an optimal read level obtained by one of the sequential read operations, a probability that data read by the subsequent read operations are error-correctable may be increased. Accordingly, read retries may not be performed during the subsequent read operations, and thus an average read time and an average read latency of the nonvolatile memory device may be reduced.

Figure 18:
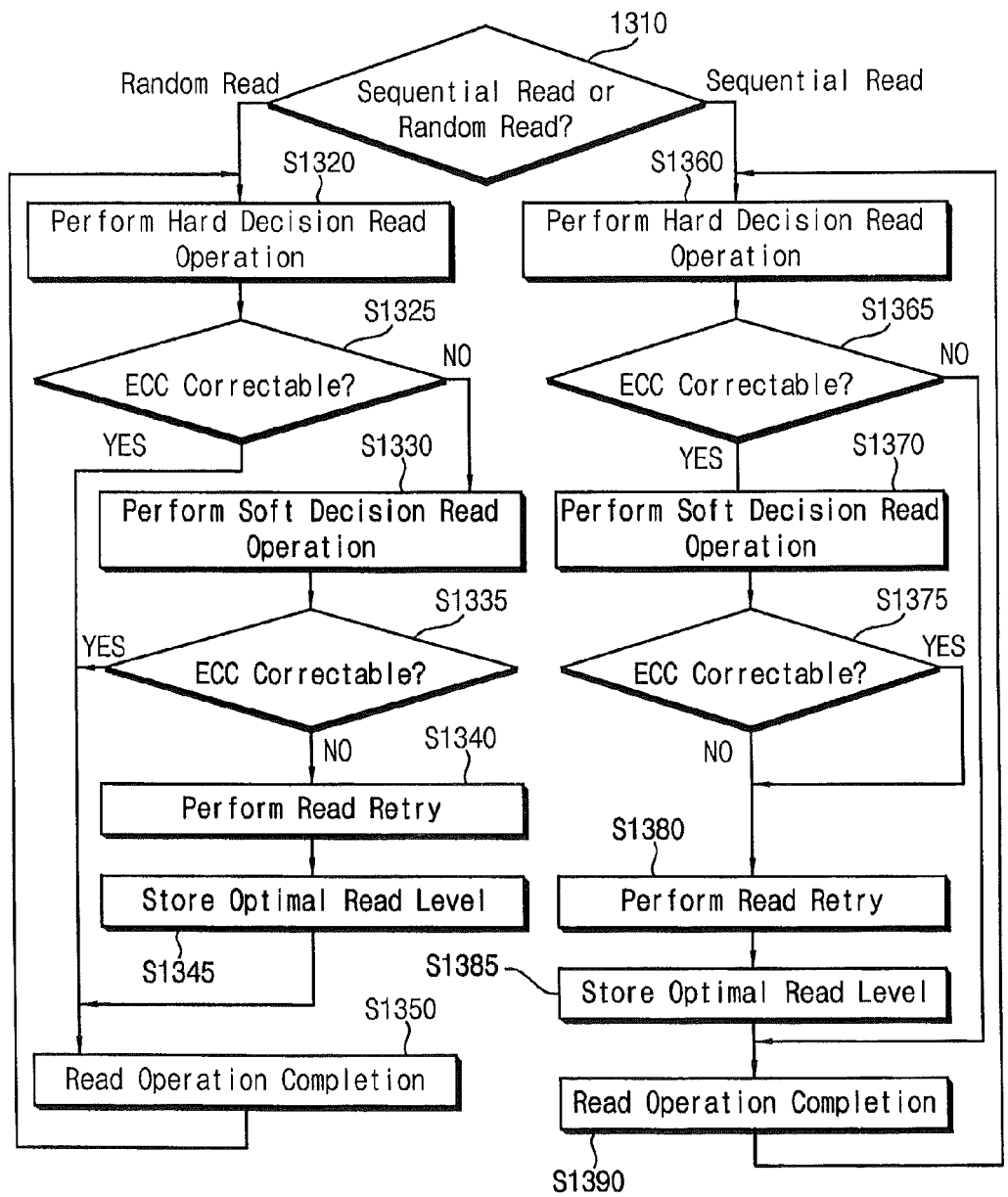
FIG. 18 is a flow chart illustrating methods of reading data from a nonvolatile memory device according to example embodiments.

FIG. 18 is a flow chart illustrating a method of reading data from a nonvolatile memory device according to example embodiments.

Referring to FIG. 18, according to whether a read operation to be performed is one of sequential read operations or one of random read operations, a nonvolatile memory device may perform a read retry regardless or independent of whether read data are error-correctable, or may selectively perform the read retry according to whether the read data are error-correctable. It may be determined whether the read operation is one of the sequential read operations or one of the random read operations (S1310).

If the read operation is one of the random read operations (S1310: Random Read), the nonvolatile memory device may perform a hard decision read operation that reads hard decision data (S1320), and may complete the read operation without performing a soft decision read operation and a read retry if the hard decision data are error-correctable without reliability information (S1325: YES and S1350). If the hard decision data are not error-correctable without reliability information (S1325: NO), the nonvolatile memory device may perform a soft decision read operation that reads soft decision data having the reliability information for the hard decision data (S1330), and may complete the read operation without performing a read retry if the hard decision data are error-correctable based on the reliability information of the soft decision data (S1335: YES and S1350). If the hard decision data are not error-correctable based on the reliability information of the soft decision data (S1335: NO), the nonvolatile memory device may perform a read retry (S1340), may store an optimal read level obtained by the read retry (S1345), and may complete the read operation (S1350).

If the read operation is one of the sequential read operations (S1310: Sequential Read), the nonvolatile memory device may perform a read retry regardless or independent of whether read data are error-correctable by a soft decision read operation. For example, the nonvolatile memory device may perform a hard decision read operation that reads hard decision data (S1360), and may complete the read operation without performing a soft decision read operation and a read retry if the hard decision data are error-correctable without reliability information (S1365: YES and S1390). If the hard decision data are not error-correctable without reliability information (S1365: NO), the nonvolatile memory device may perform a soft decision read operation that reads soft decision data having the reliability information for the hard decision data (S1370). Further, the nonvolatile memory device may perform the read retry that obtains the optimal read level if the hard decision data are not error-correctable based on the reliability information of the soft decision data, or even if the hard decision data are error-correctable based on the reliability information of the soft decision data (S1375: NO, S1375:YES and S1380). The nonvolatile memory device may store the optimal read level to be used in subsequent read operations of the sequential read operations (S1385), and may complete the read operation (S1390). During the subsequent read operations of the sequential read operations, subsequent hard decision read operations may be performed using the stored optimal read level (S1360). Adjacent pages may have similar threshold voltage distribution characteristics. Thus, if subsequent read operations of sequential read operations are performed using an optimal read level obtained by one of the sequential read operations, a probability that data read by the subsequent read operations are error-correctable may be increased. Accordingly, read retries may not be performed during the subsequent read operations, and thus an average read time and an average read latency of the nonvolatile memory device may be reduced.

Figure 19:
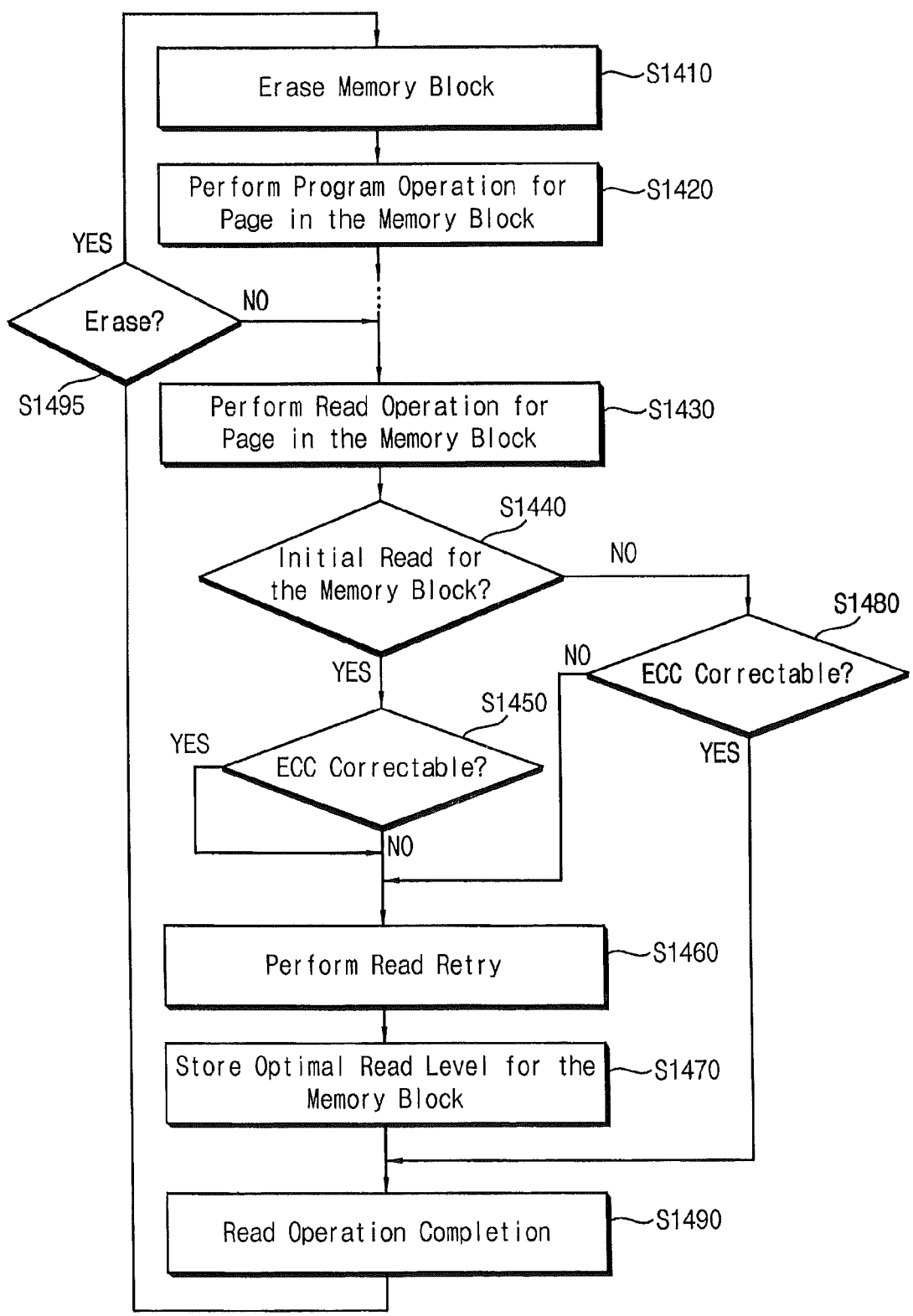
FIG. 19 is a flow chart illustrating methods of reading data from a nonvolatile memory device according to example embodiments.
Figure 20:
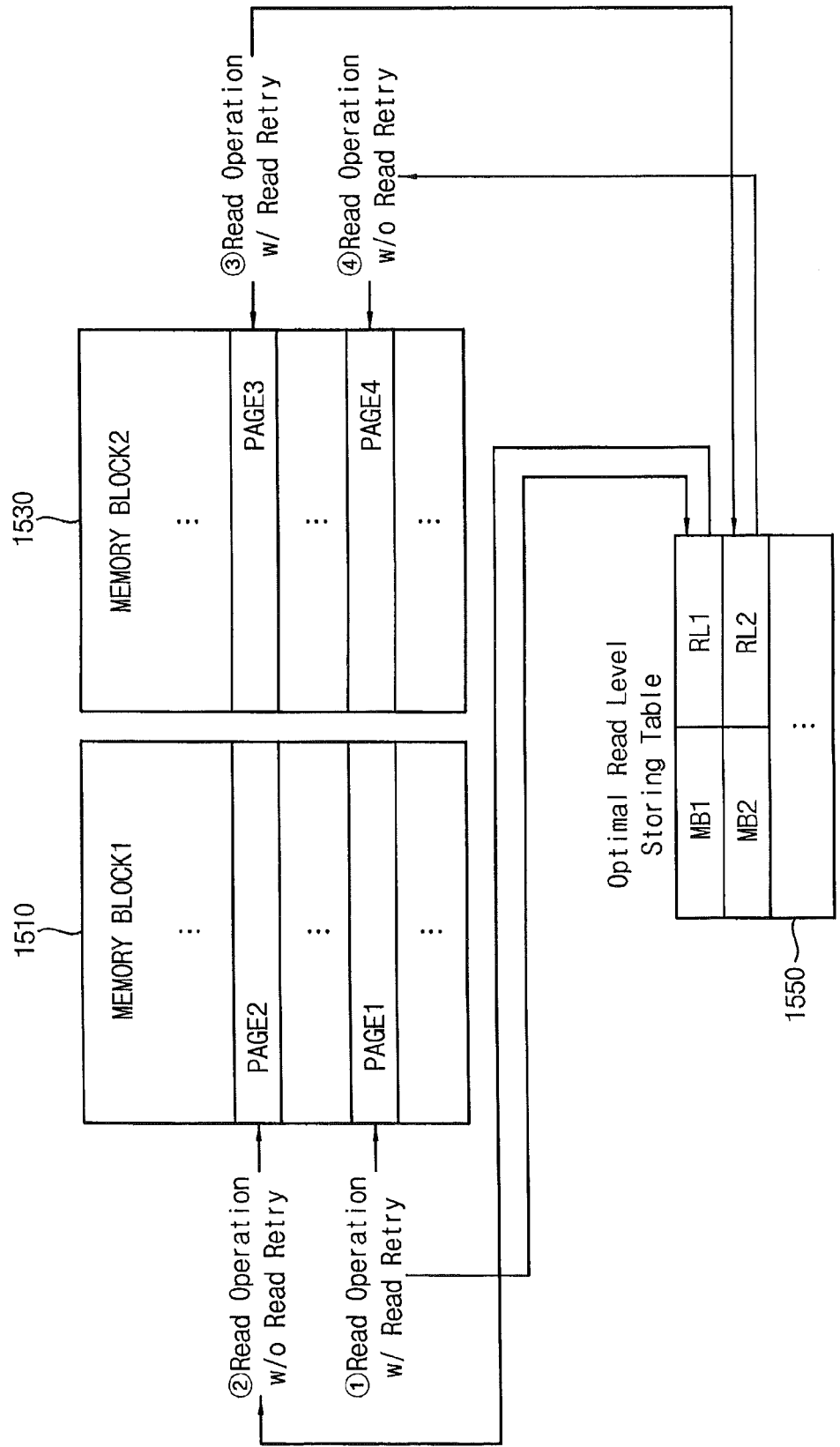
FIG. 20 is a diagram illustrating a nonvolatile memory device that stores optimal read levels for respective memory blocks.

FIG. 19 is a flow chart illustrating a method of reading data from a nonvolatile memory device according to example embodiments, and FIG. 20 is a diagram illustrating a nonvolatile memory device that stores optimal read levels for respective memory blocks.

Referring to FIG. 19, a nonvolatile memory device may perform a read retry regardless or independent of whether read data are error-correctable during a read operation that is performed for the first time after each memory block is erased and programmed. In some example embodiments, an optimal read level obtained by the read retry may be stored for each memory block.

For example, the nonvolatile memory device may erase a memory block (S1410), and may perform a program operation that writes data into a page of the memory block (S1420). Thereafter, the nonvolatile memory device may perform a read operation that read data from the page of the memory block (S1430). At this time, the nonvolatile memory device may determine whether the read operation is a read operation that is performed for the first time with respect to the memory block after the memory block is erased and programmed (S1440). If the read operation is not the read operation that is performed for the first time with respect to the memory block (S1440: NO), the nonvolatile memory device may perform a read retry only when the data are not error-correctable (S1480: NO and 1460), and may complete the read operation without performing the read retry when the data are error-correctable (S1480: YES and S1490).

If the read operation is the read operation that is performed for the first time with respect to the memory block (S1440: YES), the nonvolatile memory device may perform a read retry regardless or independent of whether the data are error-correctable (S1450 and S1460). That is, the nonvolatile memory device may obtain an optimal read level by performing the read retry if the data are not error-correctable, or even if the data are error-correctable (S1450: NO, S1450:YES and S1460), and may complete the read operation (S1490).

In some example embodiments, the optimal read level may be stored for each memory block. For example, as illustrated in FIG. 20, when a read operation for a first page PAGE1 is performed for the first time with respect to a first memory block (MB1) 1510 after the first memory block (MB1) 1510 is erased and programmed, the read operation for the first page PAGE1 may include a read retry that obtains an optimal read level RL1 for the first memory block (MB1) 1510 regardless or independent of whether read data are error-correctable. The optimal read level RL1 may be stored for the first memory block (MB1) 1510 in an optimal read level storing table 1550. Thereafter, when a read operation for a second page PAGE2 is performed, the read operation for the second page PAGE2 may be performed using the optimal read level RL1 for the first memory block (MB1) 1510 stored in the optimal read level storing table 1550, and a read retry may be selectively performed according to whether read data are error-correctable. Further, when a read operation for a third page PAGE3 is performed for the first time with respect to a second memory block (MB2) 1530 after the second memory block (MB2) 1530 is erased and programmed, the read operation for the third page PAGE3 may include a read retry that obtains an optimal read level RL2 for the second memory block (MB2) 1530 regardless or independent of whether read data are error-correctable. The optimal read level RL2 may be stored for the second memory block (MB2) 1530 in the optimal read level storing table 1550. Thereafter, when a read operation for a fourth page PAGE4 is performed, the read operation for the fourth page PAGE4 may be performed using the optimal read level RL2 for the second memory block (MB2) 1530 stored in the optimal read level storing table 1550, and a read retry may be selectively performed according to whether read data are error-correctable.

Pages included in the same memory block may have similar threshold voltage distribution characteristics. Thus, if, by using an optimal read level obtained by a read operation that is performed for the first time after a memory block is erased and programmed, subsequent read operations for other pages of the memory block are performed, a probability that data read by the subsequent read operations are error-correctable may be increased. Accordingly, read retries may not be performed during the subsequent read operations, and thus an average read time and an average read latency of the nonvolatile memory device may be reduced.

As described above, in the method of reading data from the nonvolatile memory device according to example embodiments, a read retry for obtaining an optimal read level may be performed regardless or independent of whether read data are error-correctable during a read operation that is performed for the first time with respect to a memory block after the memory block is erased and programmed. Further, a corresponding optimal read level may be stored for each memory block. Subsequent read operations are performed using the optimal read level for each memory block. Accordingly, read retries may not be performed during the subsequent read operations, and thus the average read time and the average read latency of the nonvolatile memory device may be reduced.

Figure 21:
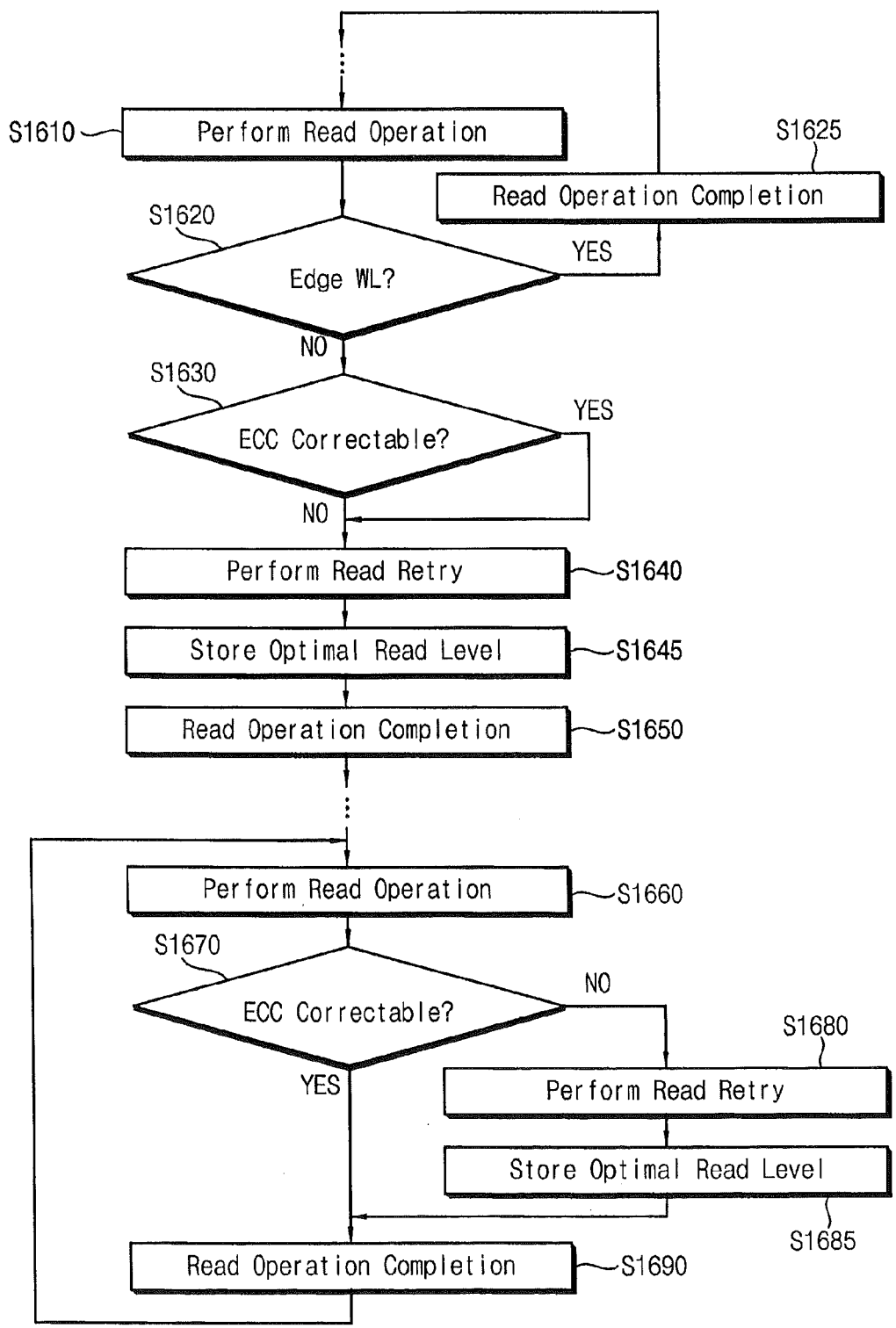
FIG. 21 is a flow chart illustrating methods of reading data from a nonvolatile memory device according to example embodiments.
Figure 22:
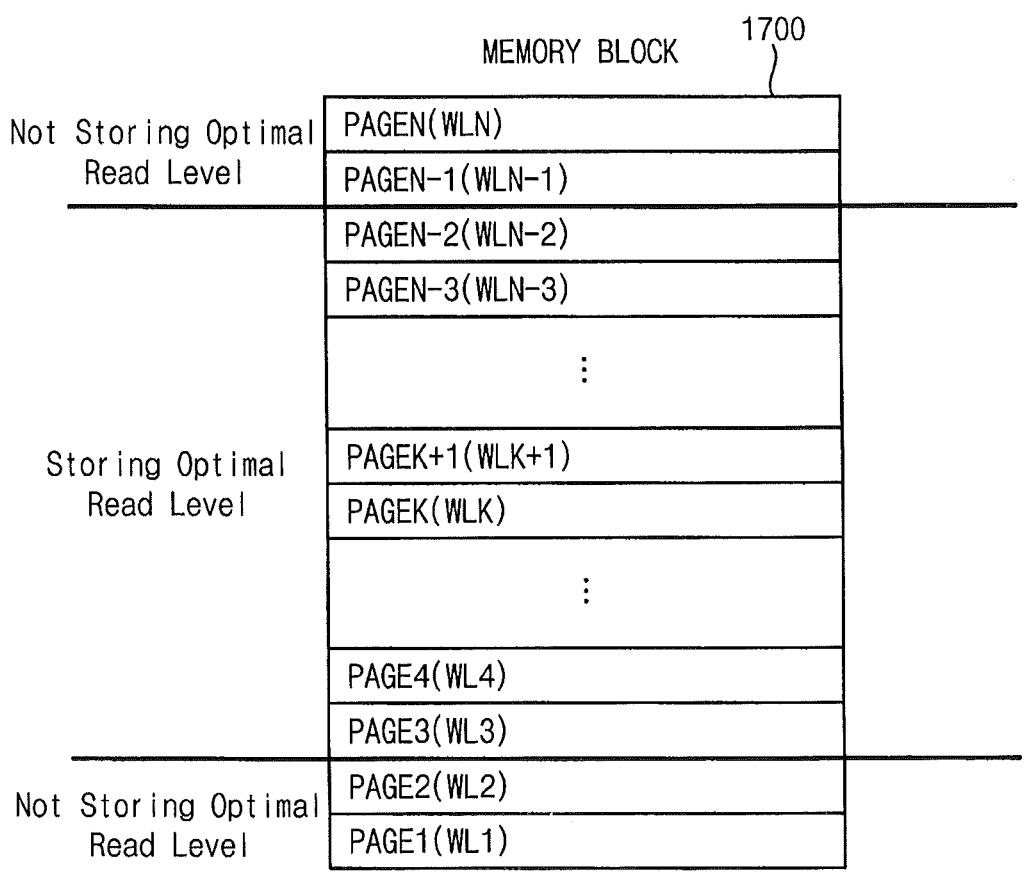
FIG. 22 is a diagram illustrating a nonvolatile memory device that selectively stores an optimal read level according to locations of word lines.

FIG. 21 is a flow chart illustrating a method of reading data from a nonvolatile memory device according to example embodiments, and FIG. 22 is a diagram illustrating a nonvolatile memory device that selectively stores an optimal read level according to locations of word lines.

Referring to FIG. 21, according to whether a word line of a page for which a read operation is performed is an edge word line that is located at an edge region of a memory block or not, a nonvolatile memory device may perform a read retry regardless or independent of whether read data are error-correctable, or may selectively perform the read retry according to whether the read data are error-correctable.

For example, the nonvolatile memory device may perform a read operation for a page corresponding to a word line (S1610), and may determine whether the word line is an edge word line that is located at an edge region of a memory block including memory cells coupled to the word line (S1620). If the word line is the edge word line (S1620: YES), the nonvolatile memory device may selectively perform a read retry according to whether read data are error-correctable, and may complete the read operation without storing an optimal read level even if the read retry is performed (S1625). If the word line is not the edge word line (S1620: NO), the nonvolatile memory device may perform the read retry regardless or independent of whether read data are error-correctable, may store an optimal read level, and may complete the read operation (S1640, S1645 and S1650).

For example, as illustrated in FIG. 22, during a read operation for a page PAGE1, PAGE2, PAGEN−1 and PAGEN coupled to a word line WL1, WL2, WLN−1 and WLN located at one or more edge regions of a memory block 1700, a read retry may be selectively performed according to whether read data are error-correctable, and an optimal read level may not be stored even if the read retry is performed. During a read operation for a page PAGE3, PAGE4, PAGEK, PAGEK+1, PAGEN−3 and PAGEN−2 coupled to a word line WL3, WL4, WLK, WLK+1, WLN−3 and WLN−2 located at a center region (a region except for the edge region) of the memory block 1700, a read retry may be performed regardless or independent of whether read data are error-correctable, and an optimal read level may be stored.

During subsequent read operations, the subsequent read operations may be performed using the stored optimal read level (S1660), a read retry and storing an optimal read level may be selectively performed according to whether read data are error-correctable, and the subsequent read operations may be completed (S1670, S1680, S1685 and S1690).

As described above, in the method of reading data from the nonvolatile memory device according to example embodiments, an optimal read level may not be stored during a read operation for a page located at an edge region, of which a threshold voltage distribution characteristic may be different from that of other pages, and an optimal read level may be obtained and stored by performing a read retry regardless or independent of whether read data are error-correctable during a read operation for a page located at a center region, of which a threshold voltage distribution characteristic may be similar to that of other pages. Accordingly, read retries may not be performed during subsequent read operations, and thus an average read time and an average read latency of the nonvolatile memory device may be reduced.

Figure 23:
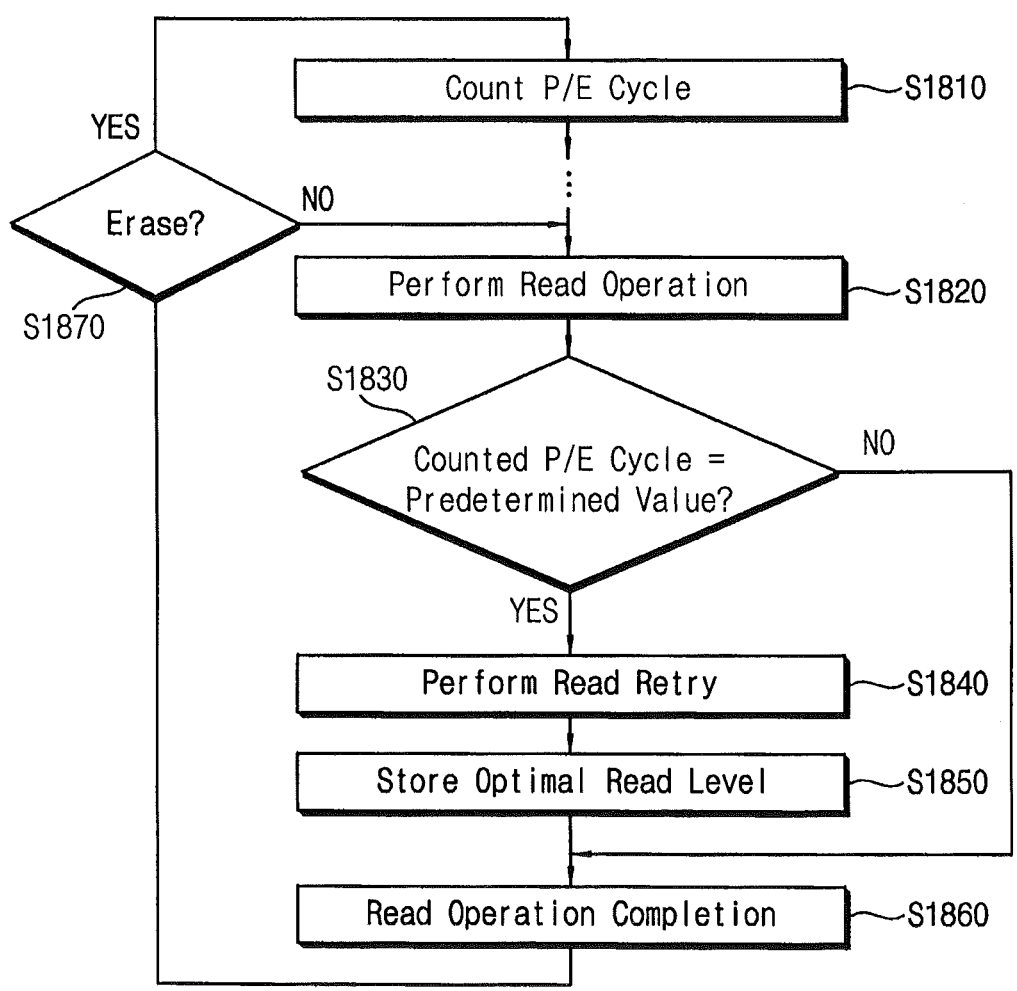
FIG. 23 is a flow chart illustrating methods of reading data from a nonvolatile memory device according to example embodiments.
Figure 24:
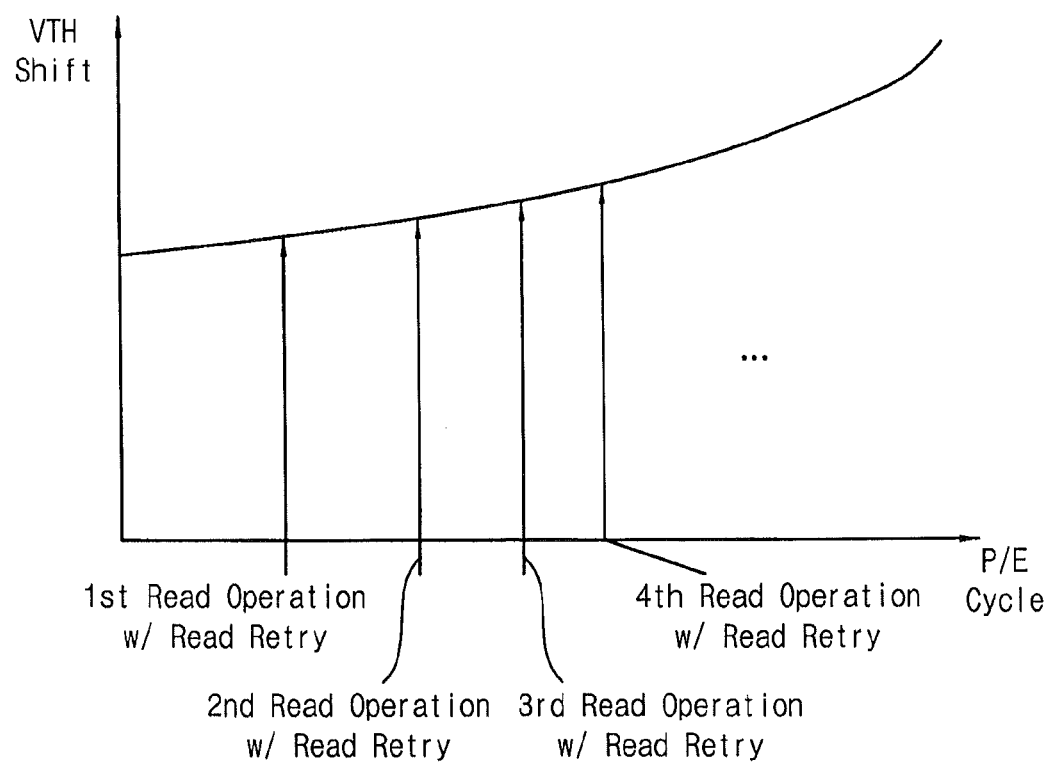
FIG. 24 is a graph illustrating threshold voltage shift according to the number of program/erase cycles.

FIG. 23 is a flow chart illustrating a method of reading data from a nonvolatile memory device according to example embodiments, and FIG. 24 is a graph illustrating threshold voltage shift according to the number of program/erase cycles.

Referring to FIG. 23, a nonvolatile memory device may perform a read retry regardless or independent of whether read data are error-correctable when the number of program and erase (P/E) cycles (or erase cycles) is one of predetermined values.

For example, the nonvolatile memory device may count the number of erase cycles of the nonvolatile memory device or the number of erase cycles of each memory block (S1810). The nonvolatile memory device may increase the counted number of erase cycles of a memory block each time the memory block is erased. The nonvolatile memory device may perform a read operation for a page included in the memory block (S1820), and may compare the counted number of the erase cycles of the memory block with predetermined values (S1830). If the counted number of the erase cycles of the memory block does not match (or in some embodiments, is less than) the predetermined values (S1830: NO), the nonvolatile memory device may selectively perform a read retry according to whether read data are error-correctable, and may complete the read operation (S1860). If the counted number of the erase cycles of the memory block matches (or in some embodiments, is greater than) the predetermined values (S1830: YES), the nonvolatile memory device may perform a read retry regardless or independent of whether read data are error-correctable (S1840), may store an optimal read level (S1850), and may complete the read operation (S1860).

In some example embodiments, the predetermined values of the erases cycles where a read retry is performed regardless or independent of whether read data are error-correctable may have regular intervals. In other example embodiments, the predetermined values of the erases cycles may have intervals that gradually decrease. For example, as illustrated in FIG. 24, as the erase cycles of a memory block increase, a degree of degradation of memory cells included in the memory block increases, and a degree of threshold voltage shift of each page may increase. Accordingly, as the erase cycles of a memory block increase, the predetermined values of the erases cycles may have intervals that gradually decrease such that the read retry may be more frequently performed regardless or independent of whether read data are error-correctable.

As described above, in the method of reading data from the nonvolatile memory device according to example embodiments, at predetermined erase cycles, an optimal read level may be obtained and stored regardless or independent of whether read data are error-correctable, and read retries may not be performed during subsequent read operations. Accordingly, an average read time and an average read latency of the nonvolatile memory device may be reduced.

Figure 25:
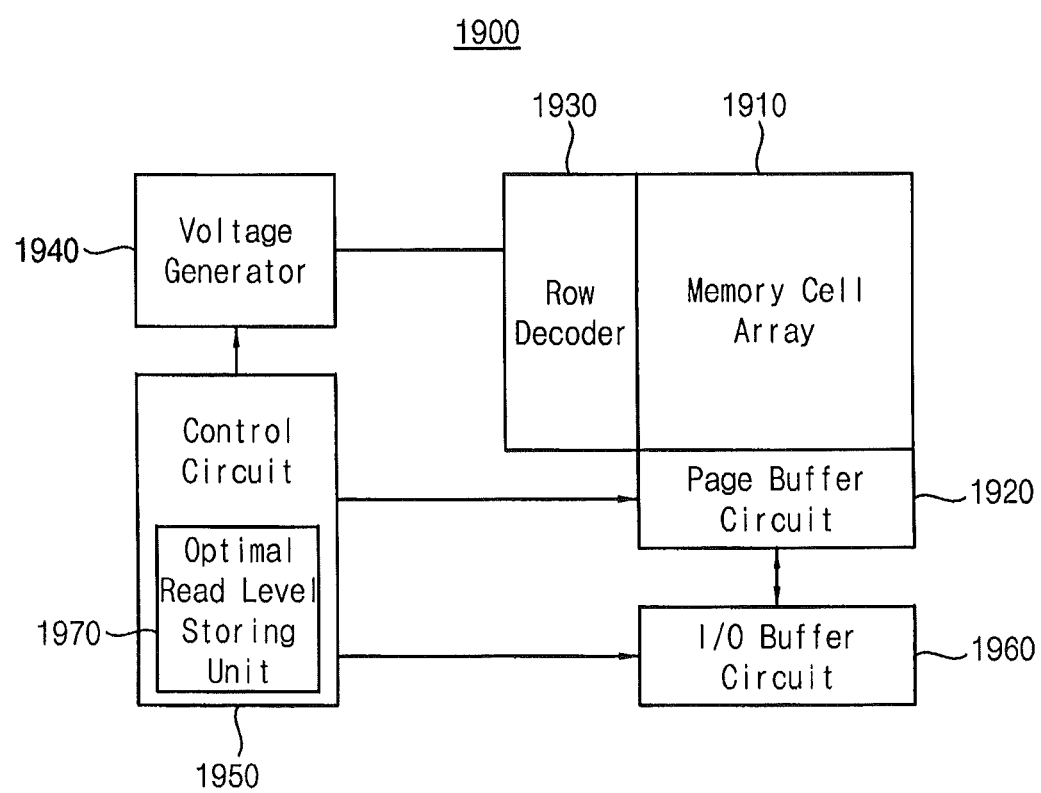
FIG. 25 is a block diagram illustrating a nonvolatile memory device according to example embodiments.

FIG. 25 is a block diagram illustrating a nonvolatile memory device according to example embodiments.

Referring to FIG. 25, a nonvolatile memory device 1900 includes a memory cell array 1910, a page buffer circuit 1920, a row decoder 1930, a voltage generator 1940, an input/output buffer circuit 1960, and a control circuit 1950. In some example embodiments, the nonvolatile memory device 1900 may be a flash memory device. In other example embodiments, the nonvolatile memory device 1900 may be a phase random access memory (PRAM), a resistive random access memory (RRAM), a magnetic random access memory (MRAM), a ferroelectric random access memory (FRAM), etc.

The memory cell array 1910 may include a plurality of memory cells coupled to a plurality of word lines and a plurality of bit lines. As described below with reference to FIGS. 26A through 26C, the plurality of memory cells may be NAND or NOR flash memory cells, and may be arranged in a two dimensional array structure or a three dimensional vertical array structure.

In some example embodiments, the memory cells may be SLCs, each of which stores one data bit therein, or MLCs, each of which stores a plurality of data bits therein. In case of the MLC, a program scheme in a write mode may include various program schemes such as a shadow program scheme, a reprogram scheme or an on-chip buffered program scheme.

The page buffer circuit 1920 may be coupled to the bit lines, and may store write data to be programmed in the memory cell array 1910 or read data that are sensed from the memory cell array 1910. That is, the page buffer circuit 1920 may be operated as a write driver or a sensing amplifier according to an operation mode of the nonvolatile memory device 1900. For example, the page buffer circuit 1920 may be operated as the write driver in a write mode and as the sensing amplifier in a read mode. The input/output buffer circuit 1960 may receive data to be programmed in the memory cell array 1910 from an external memory controller, and may transmit data read from the memory cell array 1910 to the memory controller.

The row decoder 1930 may be coupled to the word lines, and may select at least one of the word lines in response to a row address. The voltage generator 1940 may generate word line voltages, such as a program voltage, a pass voltage, a verification voltage, an erase voltage, a read voltage, etc. according to a control of the control circuit 1950. The control circuit 1950 may control the page buffer circuit 1920, the row decoder 1930, the voltage generator 1940 and the input/output buffer circuit 1960 to perform data storing, erasing and reading operations for the memory cell array 1910.

In some example embodiments, the nonvolatile memory device 1900 may include an optimal read level storing unit 1970. The optimal read level storing unit 1970 may be located inside or outside the control circuit 1950. The control circuit 1950 may control the nonvolatile memory device 1900 to perform a first read operation for memory cells coupled to a word line by applying a read voltage to the word line, to perform a read retry to obtain an optimal read level regardless or independent of whether data read by the first read operation are error-correctable, and to store the optimal read level in the optimal read level storing unit 1970 to perform a subsequent second read operation using the stored optimal read level. The nonvolatile memory device 1900 may perform subsequent read operations using the optimal read level that is obtained by performing the read retry regardless or independent of whether read data are error-correctable. Accordingly, data read by the subsequent read operations may be error-correctable without performing read retries and/or soft decision read operations, and thus an average read time and an average read latency of the nonvolatile memory device 1900 may be reduced.

Figure 26A:
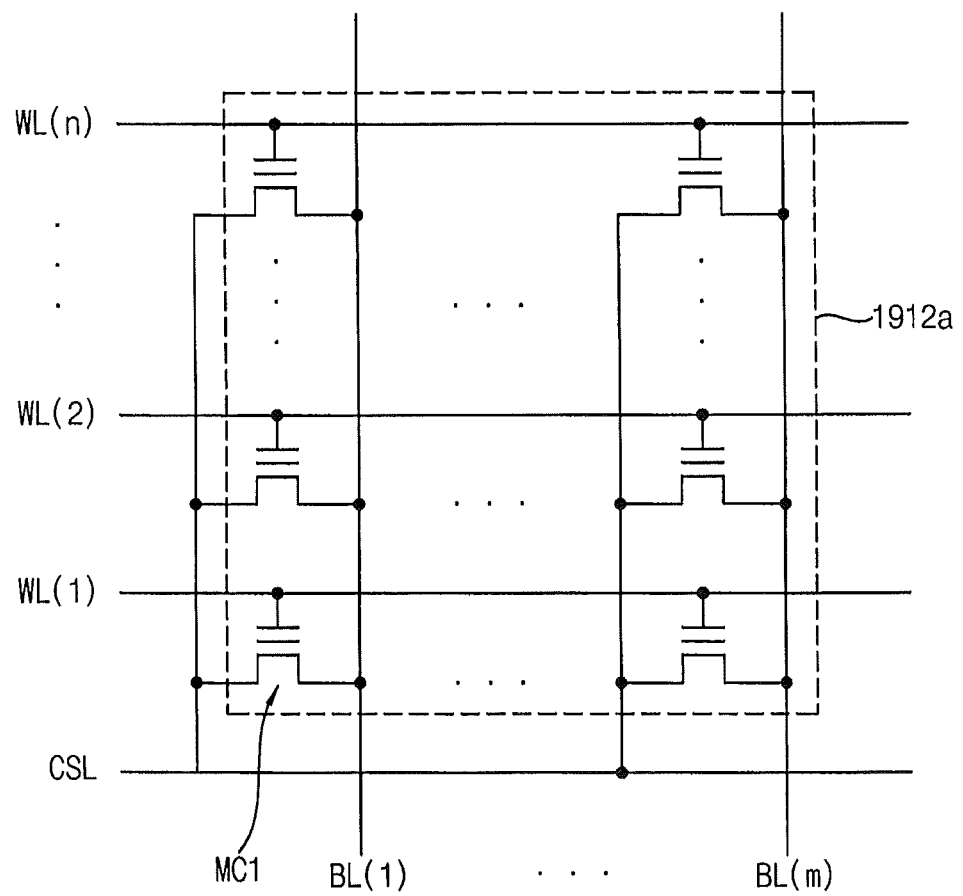
FIGS. 26A through 26C are diagrams illustrating examples of memory cell arrays included in nonvolatile memory devices.
Figure 26B:
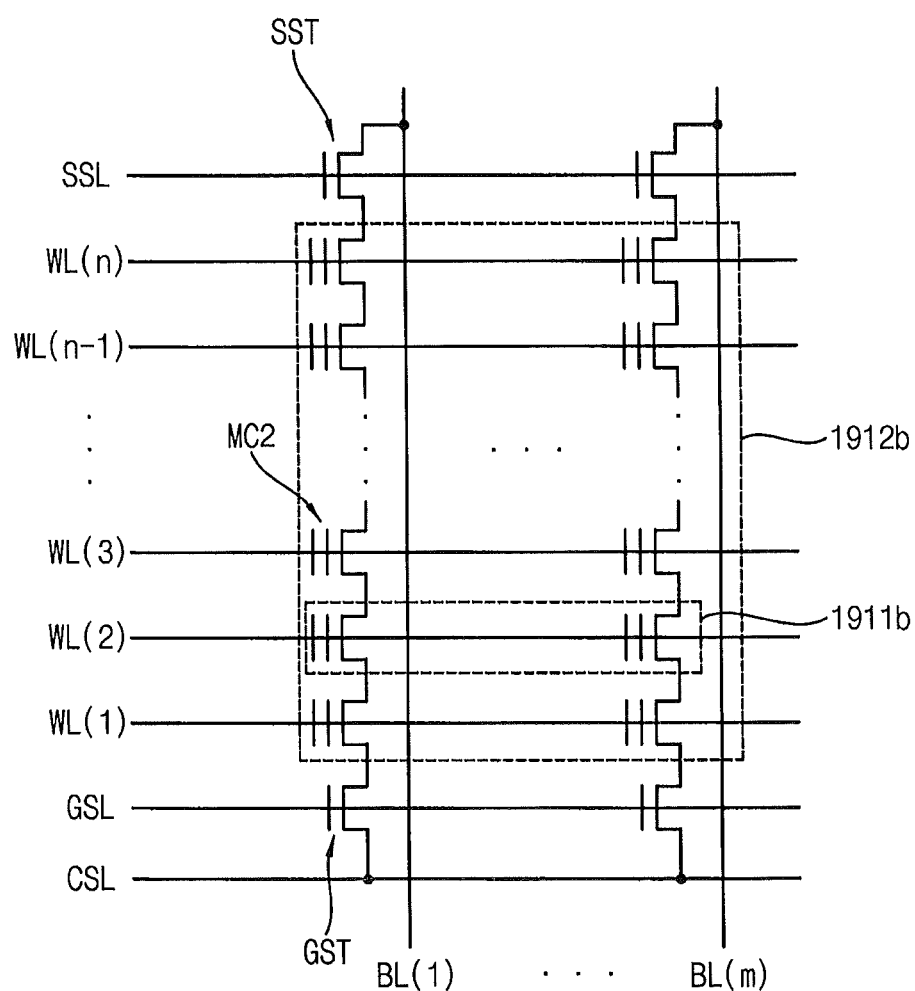
Figure 26C:
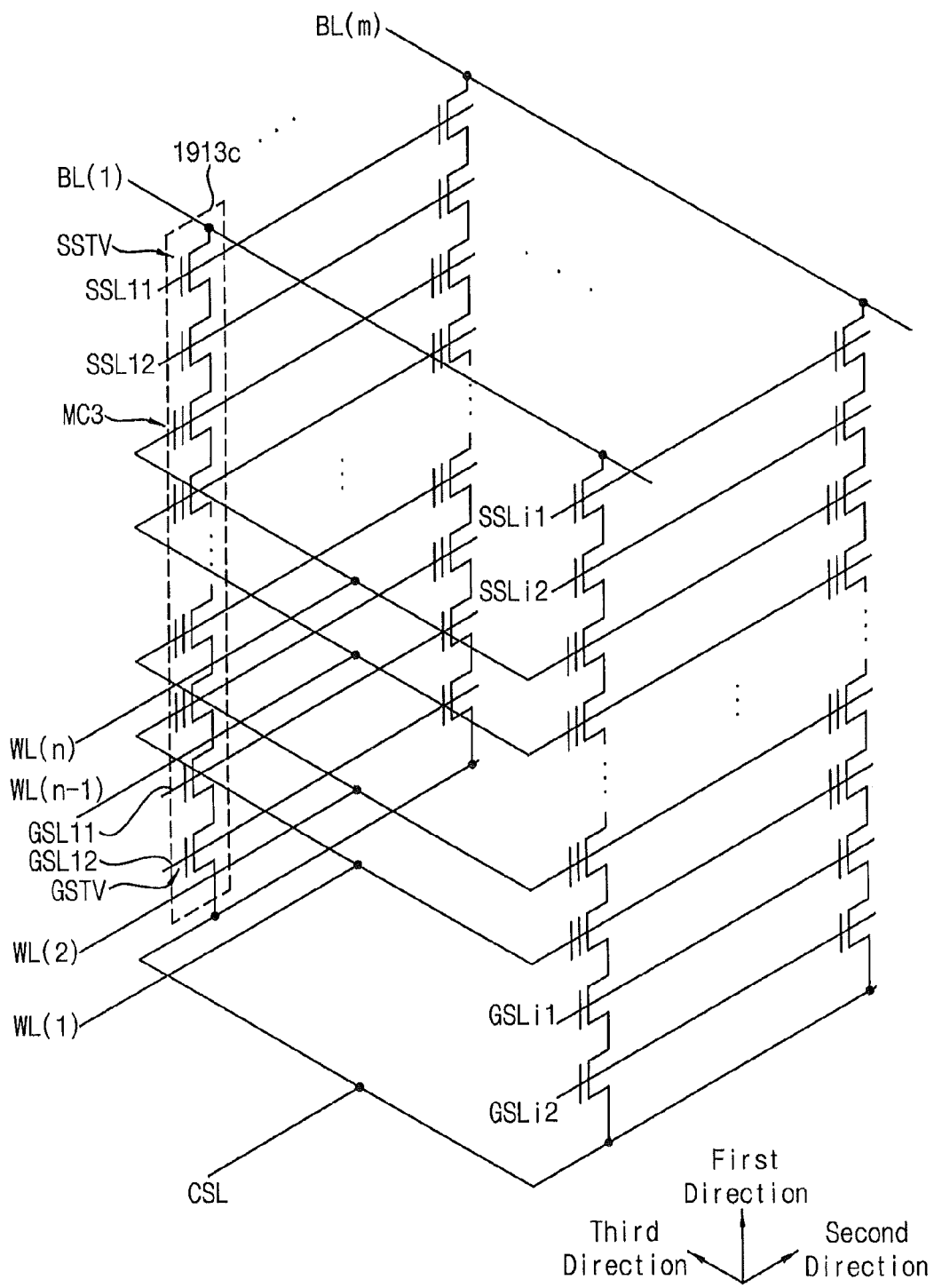

FIGS. 26A through 26C are diagrams illustrating examples of memory cell arrays included in nonvolatile memory devices.

FIG. 26A is a circuit diagram illustrating an example of a memory cell array included in a NOR flash memory device, FIG. 26B is a circuit diagram illustrating an example of a memory cell array included in a NAND flash memory device, and FIG. 26C is a circuit diagram illustrating an example of a memory cell array included in a vertical flash memory device.

Referring to FIG. 26A, a memory cell array 1910a may include a plurality of memory cells MC1. The memory cells MC1 arranged in the same row may be disposed in parallel between one of bit lines BL(1), . . . , BL(m) and a common source line CSL, and may be coupled in common to one of word lines WL(1), WL(2), . . . , WL(n). For example, the memory cells arranged in a first row may be disposed in parallel between a first bit line BL(1) and the common source line CSL. Gate electrodes of the memory cells arranged in the first row may be coupled in common to a first word line WL(1). The memory cells MC1 may be controlled according to a level of a voltage applied to the word lines WL(1), . . . , WL(n). The NOR flash memory device including the memory cell array 1910a may perform write and read operations in units of byte or word, and may perform an erase operation in units of block 1912a.

Referring to FIG. 26B, a memory cell array 1910b may include string selection transistors SST, ground selection transistors GST and memory cells MC2. The string selection transistors SST may be coupled to the bit lines BL(1), . . . , BL(m), and the ground selection transistors GST may be coupled to the common source line CSL. The memory cells MC2 arranged in the same row may be disposed in series between one of the bit lines BL(1), . . . , BL(m) and the common source line CSL, and the memory cells MC2 arranged in the same column may be coupled in common to one of the word lines WL(1), WL(2), WL(3), . . . , WL(n−1), WL(n). That is, the memory cells MC2 may be coupled in series between the string selection transistors SST and the ground selection transistors GST, and the 16, 32 or 64 word lines may be disposed between the string selection line SSL and the ground selection line GSL.

The string selection transistors SST are coupled to the string selection line SSL such that the string selection transistors SST may be controlled according to a level of a voltage applied from the string selection line SSL. The memory cells MC2 may be controlled according to a level of a voltage applied to the word lines WL(1), . . . , WL(n).

The NAND flash memory device including the memory cell array 1910b may perform write and read operations in units of page 1911b and an erase operation in units of block 1912b. In some example embodiments, each of page buffers may be coupled to even and odd bit lines one by one. In this case, the even bit lines form an even page, the odd bit lines form an odd page, and the write operations for the memory cells MC2 of the even and odd pages may be performed by turns and sequentially.

Referring to FIG. 26C, a memory cell array 1910c may include a plurality of strings 1913c having a vertical structure. The plurality of strings 1913c may be formed in a second direction such that a string row may be formed. A plurality of string rows may be formed in a third row such that a string array may be formed. Each of the strings 1913c may include ground selection transistors GSTV, memory cells MC3 and string selection transistors SSTV which are disposed in series in a first direction between the bit lines BL(1), ..., BL(m) and the common source line CSL.

The ground selection transistors GSTV may be coupled to the ground selection lines GSL11, GSL12, ..., GSLi1, GSLi2, respectively, and the string selection transistors SSTV may be connected to the string selection lines SSL11, SSL12, ..., SSLi1, SSLi2, respectively. The memory cells MC3 arranged on the same layer may be coupled in common to one of the word lines WL(1), WL(2), ..., WL(n−1), WL(n). The ground selection lines GSL11, ..., GSLi2 and the string selection lines SSL11, ..., SSLi2 may extend in the second direction and may be formed along the third direction. The word lines WL(1), ..., WL(n) may extend in the second direction and may be formed along the first and third directions. The bit lines BL(1), ..., BL(m) may extend in the third direction and may be formed along the second direction. The memory cells MC3 may be controlled according to a level of a voltage applied to the word lines WL(1), ..., WL(n).

Since the vertical flash memory device including the memory cell array 1910c includes NAND flash memory cells, like the NAND flash memory device of FIG. 26B, the vertical flash memory device performs the write and read operations in units of page and the erase operation in units of block.

In some example embodiments, it may be implemented that two string selection transistors included in one string 1913c are coupled to one string selection line, and two ground selection transistors included in one string are coupled to one ground selection line. In other example embodiments, it may be implemented that one string includes one string selection transistor and one ground selection transistor.

Figure 27:
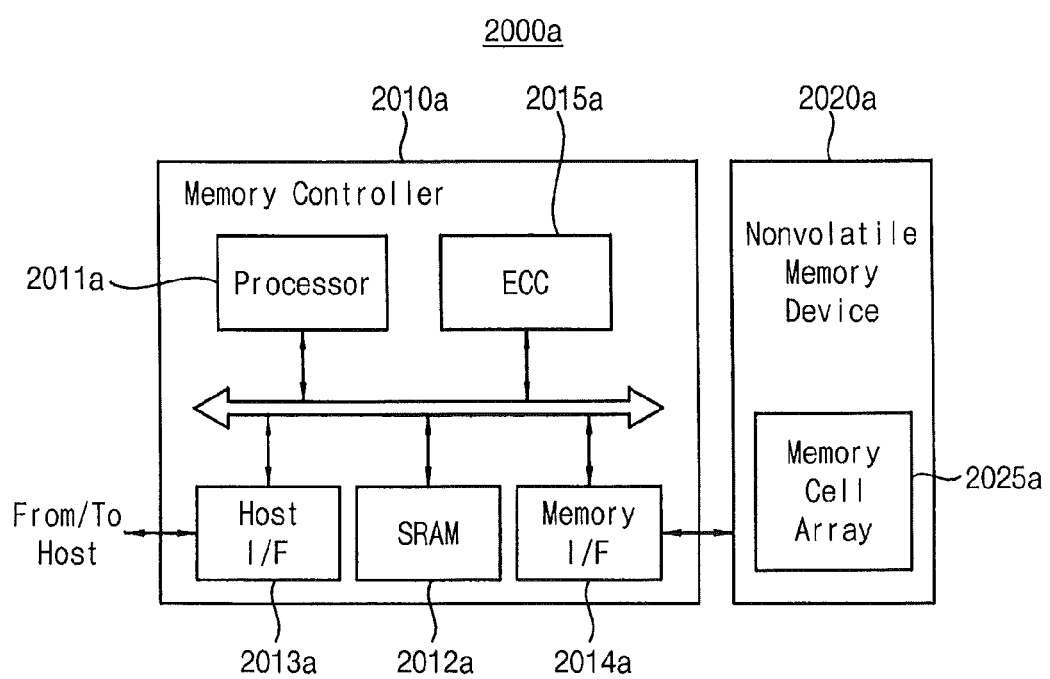
FIG. 27 is a block diagram illustrating an example of a memory system including a nonvolatile memory device and a memory controller according to example embodiments.

FIG. 27 is a block diagram illustrating an example of a memory system including a nonvolatile memory device and a memory controller according to example embodiments.

Referring to FIG. 27, a memory system 2000a includes a memory controller 2010a and a nonvolatile memory device 2020a.

The nonvolatile memory device 2020a includes a memory cell array 2025a including a plurality of memory cells that store data. The nonvolatile memory device 2020a may perform a read operation, and may obtain and store an optimal read level by performing a read retry regardless or independent of whether data read by the read operation are error-correctable. The nonvolatile memory device 2020a may perform subsequent read operations using the stored optimal read level. Accordingly, data read by the subsequent read operations may be error-correctable without performing read retries and/or soft decision read operations, and thus an average read time and an average read latency of the nonvolatile memory device 2020a may be reduced.

The memory controller 2010a may control the nonvolatile memory device 2020a. The memory controller 2010a may control data transfer between an external host and the nonvolatile memory device 2020a. The memory controller 2010a may include a processor 2011a, such as a central processing unit (CPU), a buffer memory 2012a, a host interface 2013a, a memory interface 2014a and an ECC block 2015a. The processor 2011a may perform operations for the data transfer. In some example embodiments, the buffer memory 2012a may be implemented by a static random access memory (SRAM). In other example embodiments, a dynamic random access memory (DRAM), a phase random access memory (PRAM), a ferroelectric random access memory (FRAM), a resistive random access memory (RRAM), a magnetic random access memory (MRAM), etc. According to example embodiments, the buffer memory 2012a may be located inside or outside the memory controller 2010a.

The host interface 2013a may be coupled to the host, and the memory interface 2014a may be coupled to the nonvolatile memory device 2020a. The processor 2011a may communicate with the host via the host interface 2013a. For example, the host interface 2013a may be configured to communicate with the host using at least one of various interface protocols, such as a universal serial bus (USB), a multi-media card (MMC), a peripheral component interconnect-express (PCI-E), a small computer system interface (SCSI), a serial-attached SCSI (SAS), a serial advanced technology attachment (SATA), a parallel advanced technology attachment (PATA), an enhanced small disk interface (ESDI), integrated drive electronics (IDE), etc. Further, the processor 2011a may communicate with the nonvolatile memory device 2020a via the memory interface 2014a. In some example embodiments, the ECC block 2015a may perform ECC encoding and ECC decoding by using a Bose-Chaudhuri-Hocquenghem (BCH) code. In other example embodiments, the ECC block 2015a may perform the ECC encoding and the ECC decoding by using a low density parity check (LDPC) code. In still other example embodiments, the ECC block 2015a may perform the ECC encoding and the ECC decoding by using a turbo code, a Reed-Solomon code, a convolution code, a recursive systematic code (RSC), a coded modulation, such as a trellis-coded modulation (TCM), a block coded modulation (BCM), etc., or other error correction codes. According to example embodiments, the memory controller 2010a may be built in the nonvolatile memory device 2020a, or the memory controller 2010a and the nonvolatile memory device 2020a may be implemented as separate chips.

The memory system 2000a may be implemented as a memory card, a solid state drive, etc. In some embodiments, the nonvolatile memory device 2020a, the memory controller 2010a and/or the memory system 2000a may be packaged in various forms, such as package on package (PoP), ball grid arrays (BGAs), chip scale packages (CSPs), plastic leaded chip carrier (PLCC), plastic dual in-line package (PDIP), die in waffle pack, die in wafer form, chip on board (COB), ceramic dual in-line package (CERDIP), plastic metric quad flat pack (MQFP), thin quad flat pack (TQFP), small outline IC (SOIC), shrink small outline package (SSOP), thin small outline package (TSOP), system in package (SIP), multi chip package (MCP), wafer-level fabricated package (WFP), or wafer-level processed stack package (WSP).

Figure 28:
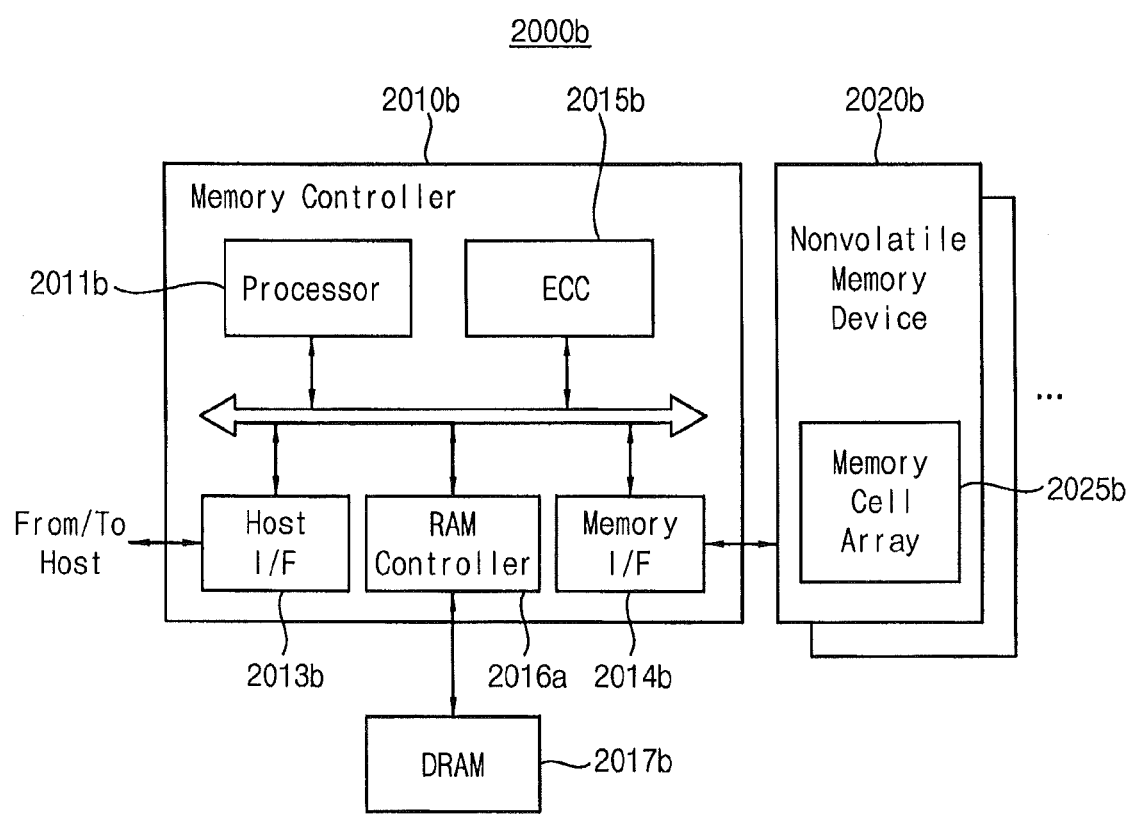
FIG. 28 is a block diagram illustrating another example of a memory system including a nonvolatile memory device and a memory controller according to example embodiments.

FIG. 28 is a block diagram illustrating another example of a memory system including a nonvolatile memory device and a memory controller according to example embodiments.

Referring to FIG. 28, a memory system 2000b includes a memory controller 2010b, a nonvolatile memory device 2020b and a buffer memory 2017b. In some example embodiments, the buffer memory 2017b may a dynamic random access memory (DRAM), and may be located outside the memory controller 2010b. The nonvolatile memory device 2020b may include a memory cell array 2025b, and the memory controller 2010b may include a processor 2011b, a host interface 2013b, a memory interface 2014b, an ECC block 2015b and a random access memory (RAM) controller 2016b for controlling the buffer memory 2017b. The memory system 2000b of FIG. 28 may have substantially similar configurations and operations to a memory system 2000a of FIG. 27, except that the buffer memory 2017b is located outside the memory controller 2010b.

Figure 29:
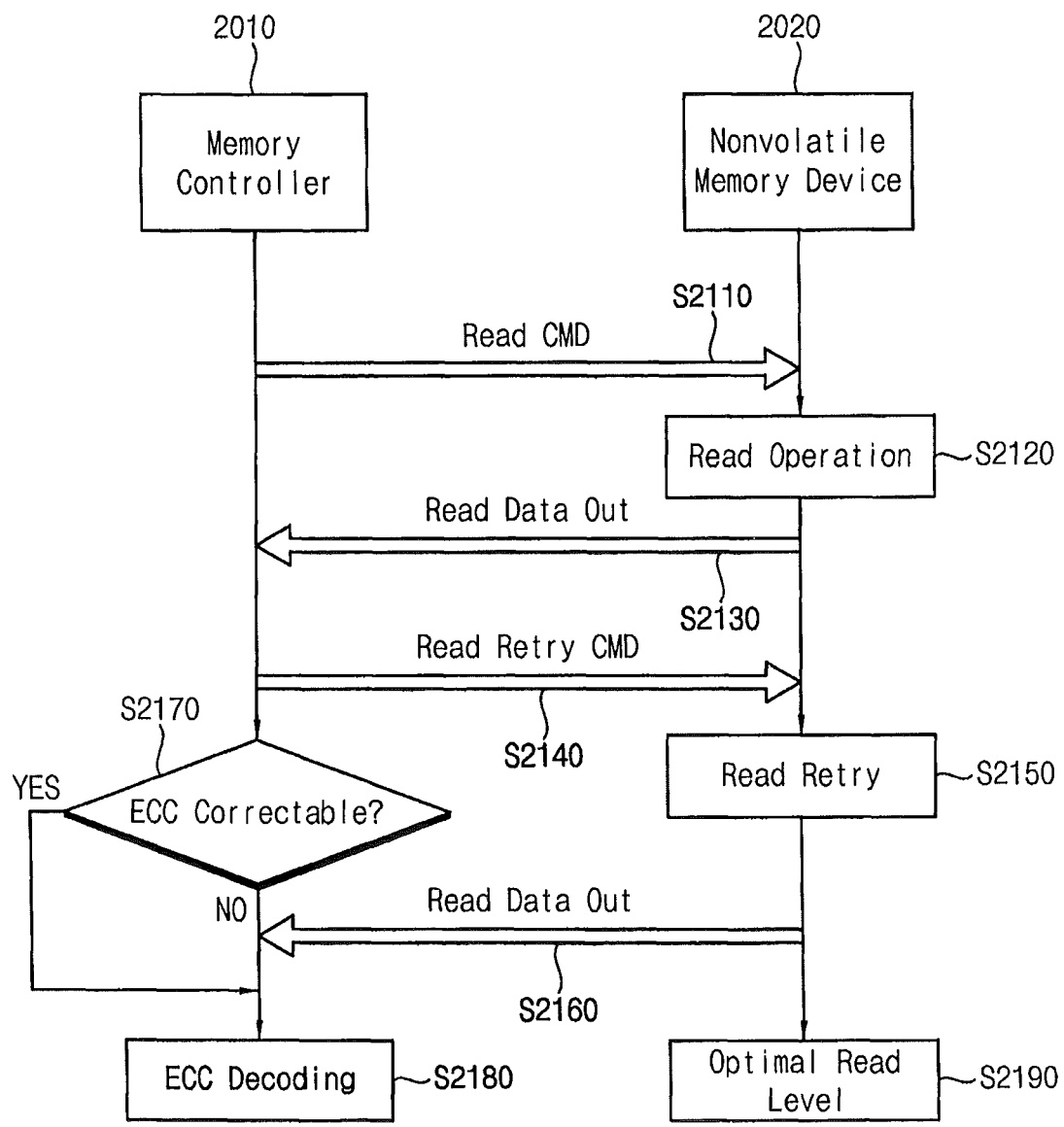
FIG. 29 is a flow chart illustrating methods of operating a memory system according to example embodiments.

FIG. 29 is a flow chart illustrating a method of operating a memory system according to example embodiments.

Referring to FIG. 29, a method of operating a memory system including a memory controller 2010 and a nonvolatile memory device 2020, the memory controller 2010 may transmit a read command to the nonvolatile memory device 2020 (S2110), and the nonvolatile memory device 2020 may transmit data read by a first read operation to the memory controller 2010 by performing the first read operation in response to the read command (S2120 and S2130). The memory controller 2010 may transmit a read retry command to the nonvolatile memory device 2020 regardless or independent of whether data read by the first read operation are error-correctable (S2140). For example, the memory controller 2010 may transmit the read retry command before determining whether the data are error-correctable, or after determining whether the data are error-correctable, may transmit the read retry command regardless or independent of a result of the determination. The nonvolatile memory device 2020 may perform the read retry in response to the read retry command, and may transmit data read by the read retry to the memory controller 2010 (S2150 and S2160). In some example embodiments, if the data read by the first read operation are error-correctable (S2170: YES), the memory controller 2010 may disregard the data read by the read retry, and may recover original data by performing ECC decoding on the data read by the first read operation (S2180). If the data read by the first read operation are not error-correctable (S2170: NO), the memory controller 2010 may recover original data by performing ECC decoding on the data read by the read retry (S2180). The nonvolatile memory device may store the optimal read level obtained by the read retry to perform a subsequent second read operation using the optimal read level (S2190).

As described above, in the method of operating the memory system, the nonvolatile memory device 2020 may perform at least one subsequent second read operation by using an optimal read level obtained during a first read operation. Accordingly, data read by subsequent read operations may be error-correctable without performing read retries and/or soft decision read operations, and thus an average read time and an average read latency of the nonvolatile memory device 2020 may be reduced.

Figure 30:
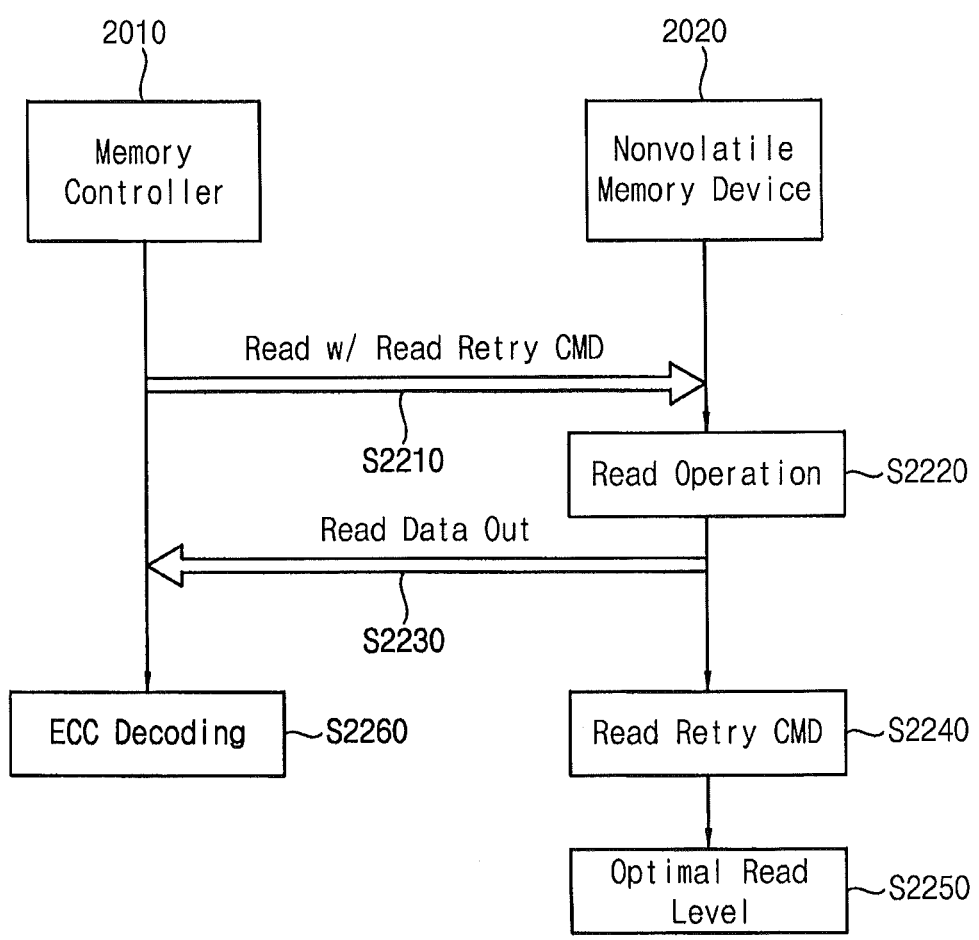
FIG. 30 is a flow chart illustrating methods of operating a memory system according to example embodiments.

FIG. 30 is a flow chart illustrating a method of operating a memory system according to example embodiments.

Referring to FIG. 30, a memory controller 2010 may transmit one command (e.g., a read and read retry command (Read w/ Read Retry CMD) to a nonvolatile memory device 2020, so that nonvolatile memory device 2020 may perform a read retry regardless or independent of whether read data are error-correctable after performing a read operation. For example, the memory controller 2010 may transmit the read and read retry command to the nonvolatile memory device 2020 (S2210). The nonvolatile memory device 2020 may perform a first read operation in response to the read and read retry command, and may transmit data read by the first read operation to the memory controller 2010 (S2220 and S2230). The memory controller 2010 may recover original data by performing ECC decoding on the data read by the first read operation (S2260). The nonvolatile memory device 2020 may perform, in response to the read and read retry command without receiving an additional command, a read retry regardless or independent of whether the data read by the first read operation are error-correctable (S2240). The nonvolatile memory device may store an optimal read level obtained by the read retry to perform a subsequent second read operation using the optimal read level (S2250).

As described above, in the method of operating the memory system, the nonvolatile memory device 2020 may perform at least one subsequent second read operation by using an optimal read level obtained during a first read operation. Accordingly, data read by subsequent read operations may be error-correctable without performing read retries and/ or soft decision read operations, and thus an average read time and an average read latency of the nonvolatile memory device 2020 may be reduced.

Figure 31:
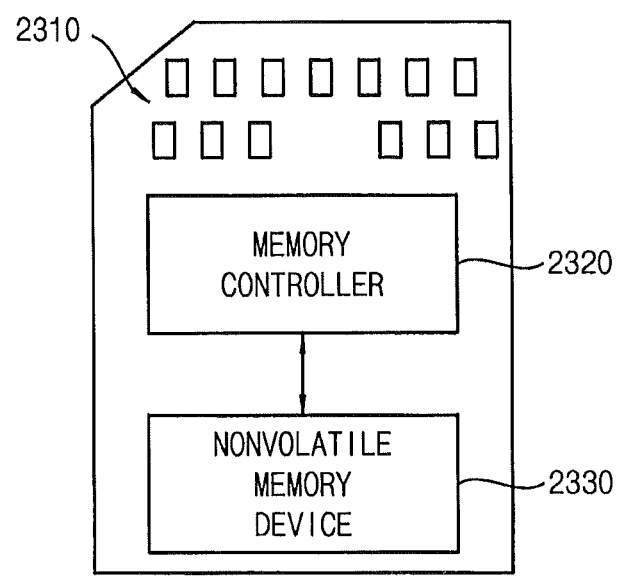
FIG. 31 is a diagram illustrating a memory card including a memory system according to example embodiments.

FIG. 31 is a diagram illustrating a memory card including a memory system according to example embodiments.

Referring to FIG. 31, a memory card 2300 may include a plurality of connecting pins 2310, a memory controller 2320 and a nonvolatile memory device 2330.

The connecting pins 2310 may be coupled to a host to transfer signals between the host and the memory card 2300. The connecting pins 2310 may include a clock pin, a command pin, a data pin and/or a reset pin.

The memory controller 2320 may receive data from the host, and may store the received data in the nonvolatile memory device 2330.

The nonvolatile memory device 2330 may perform a read operation, and may obtain and store an optimal read level by performing a read retry regardless or independent of whether data read by the read operation are error-correctable. The nonvolatile memory device 2330 may perform subsequent read operations using the stored optimal read level. Accordingly, data read by the subsequent read operations may be error-correctable without performing read retries and/or soft decision read operations, and thus an average read time and an average read latency of the nonvolatile memory device 2330 may be reduced.

For example, the memory card 2300 may include a multimedia card (MMC), an embedded multimedia card (eMMC), a hybrid embedded multimedia card (hybrid eMMC), a secure digital (SD) card, a micro-SD card, a memory stick, an ID card, a personal computer memory card international association (PCMCIA) card, a chip card, a USB card, a smart card, a compact flash (CF) card, etc.

In some example embodiments, the memory card 2300 may be attachable to the host, such as a desktop computer, a laptop computer, a tablet computer, a mobile phone, a smart phone, a music player, a personal digital assistants (PDA), a portable multimedia player (PMP), a digital television, a digital camera, a portable game console, etc.

Figure 32:
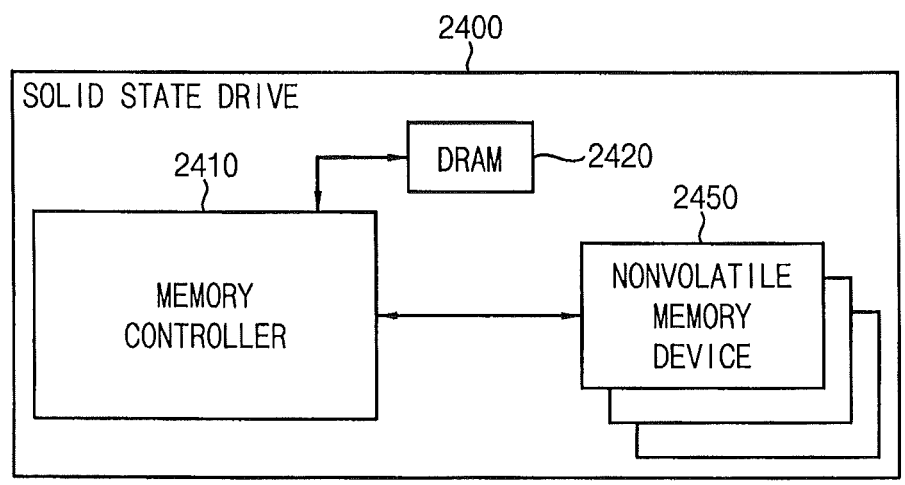
FIG. 32 is a diagram illustrating a solid state drive including a memory system according to example embodiments.

FIG. 32 is a diagram illustrating a solid state drive including a memory system according to example embodiments.

Referring to FIG. 32, a solid state drive (SSD) 2400 includes a memory controller 2410, a buffer memory 2420 and a plurality of nonvolatile memory devices 2450.

The memory controller 2410 may receive data from a host. The memory controller 2410 may store the received data in the plurality of nonvolatile memory devices 2450. The buffer memory 2420 may temporarily store data transferred between the host and the plurality of nonvolatile memory devices 2450, and may be implemented by a DRAM located outside the memory controller 2410.

Each nonvolatile memory device 2450 may perform a read operation, and may obtain and store an optimal read level by performing a read retry regardless or independent of whether data read by the read operation are error-correctable. The nonvolatile memory device 2450 may perform subsequent read operations using the stored optimal read level. Accordingly, data read by the subsequent read operations may be error-correctable without performing read retries and/or soft decision read operations, and thus an average read time and an average read latency of the nonvolatile memory device 2450 may be reduced.

In some example embodiments, the solid state drive 2400 may be coupled to the host, such as a mobile device, a mobile phone, a smart phone, a PDA, a PMP, a digital camera, a portable game console, a music player, a desktop computer, a notebook computer, a tablet computer, a speaker, a video, a digital television, etc.

Figure 33:
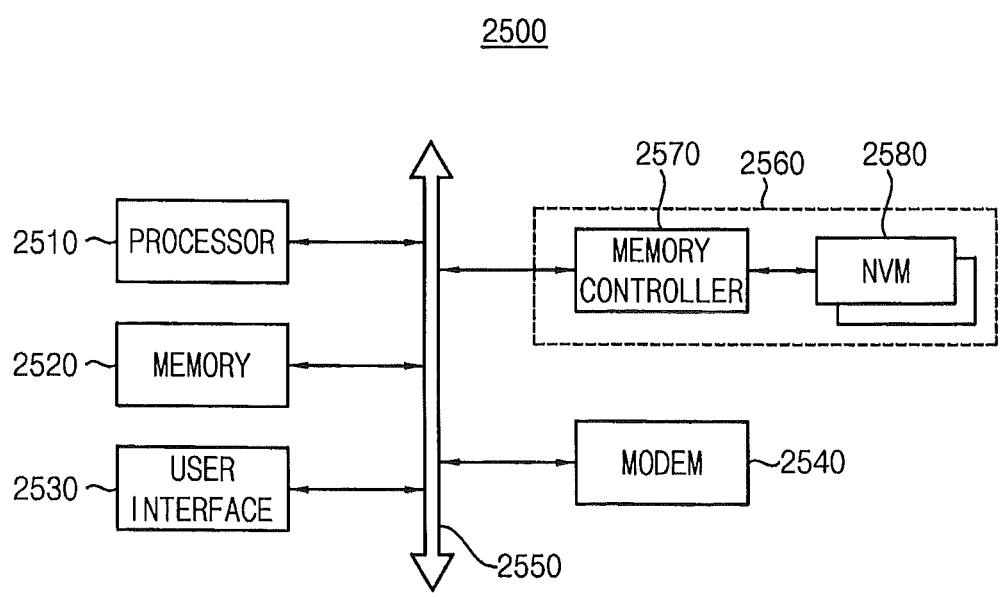
FIG. 33 is a diagram illustrating a computing system according to example embodiments.

FIG. 33 is a diagram illustrating a computing system according to example embodiments.

Referring to FIG. 33, a computing system 2500 includes a processor 2510, a memory device 2520, a user interface 2530, a bus 2550 and a memory system 2560. In some embodiments, the computing system 2500 may further include a modem 2540, such as a baseband chipset.

The processor 2510 may perform specific calculations or tasks. For example, the processor 2510 may be a microprocessor, a central processing unit (CPU), a digital signal processor, or the like. The processor 2510 may be coupled to the memory device 2520 via a bus 2550, such as an address bus, a control bus and/or a data bus. For example, the memory device 2520 may be implemented by a DRAM, a mobile DRAM, a SRAM, a PRAM, a FRAM, a RRAM, a MRAM and/or a flash memory. Further, the processor 2510 may be coupled to an extension bus, such as a peripheral component interconnect (PCI) bus, and may control the user interface 2530 including at least one input device, such as a keyboard, a mouse, a touch screen, etc., and at least one output device, a printer, a display device, etc. The modem 2540 may perform wired or wireless communication with an external device. The nonvolatile memory device 2580 of the memory system 2560 may be controlled by a memory controller 2570 to store data processed by the processor 2510 or data received via the modem 2540. In some example embodiments, the computing system 2500 may further include a power supply, an application chipset, a camera image processor (CIS), etc.

The inventive concept may be applied to any nonvolatile memory device, and devices and systems including the nonvolatile memory device. For example, the inventive concept may be applied to various electronic devices, such as a memory card, a solid state drive, a desktop computer, a laptop computer, a tablet computer, a mobile phone, a smart phone, a music player, a PDA, a PMP, a digital television, a digital camera, a portable game console, etc.

Although a few example embodiments have been described, those skilled in the art will readily appreciate that many modifications are possible in the example embodiments without materially departing from the novel teachings and advantages of the present inventive concept. Accordingly, all such modifications are intended to be included within the scope of the present inventive concept as defined in the claims. Therefore, it is to be understood that the foregoing is illustrative of various example embodiments and is not to be construed as limited to the specific example embodiments disclosed, and that modifications to the disclosed example embodiments, as well as other example embodiments, are intended to be included within the scope of the appended claims.

What is claimed is:

1. A method of operating a nonvolatile memory device, the method comprising:
performing a read operation to read data from a memory cell of the memory device by applying a first read voltage to a first word line coupled thereto, wherein the memory cell corresponds to a first page of a memory block;
performing a read retry operation to read the data from the memory cell responsive to performing the read operation and independent of whether the data read in the read operation is correctable by an error correction code;
determining an error-correctable read voltage different from the first read voltage responsive to the read retry operation; and
performing a subsequent read operation to read data from a memory cell corresponding to a second page of the memory block by applying the error-correctable read voltage to a second word line coupled thereto.

2. The method of claim 1, further comprising:
determining that the data read in the read operation is correctable by the error correction code;
wherein the read retry operation is performed responsive to determining that the data is correctable by the error correction code.

3. The method of claim 1, wherein a probability that the data read in the subsequent read operation is correctable by the error correction code is increased responsive to performing the read retry operation.

4. The method of claim 1, further comprising:
selectively performing or omitting a subsequent read retry operation for the second page dependent on whether the data read in the subsequent read operation is correctable by the error correction code,
wherein a read retry voltage of the subsequent read retry operation is based on a relationship between the first read retry voltage and the error-correctable read voltage.

5. The method of claim 1, wherein the read operation is a soft decision read operation indicating a reliability of the data read in a preceding read operation, and wherein the subsequent read operation is a hard decision read operation indicating either a first or second state of the memory cell corresponding to the second page.

6. The method of claim 1, wherein the read operation comprises a sequential read operation that is indicative of a sequence of the first page relative to a previously read page, and wherein the subsequent read operation comprises a random read operation that is independent of a sequence of the second page relative to the first page.

7. The method of claim 1, wherein the read operation comprises an initial read operation after erasure of the memory block.

8. The method of claim 1, wherein the error-correctable read voltage corresponds to the memory block, and further comprising:
storing respective error-correctable read voltages for each of a plurality of memory blocks.

9. The method of claim 1, wherein the first and second word lines are coupled to respective memory cells that are remote from edges of the memory block.

10. The method of claim 1, further comprising:
determining a number of program/erase operations previously performed on a memory block including the memory cell,
wherein the read retry operation is selectively performed based on the number of program/erase operations.

11. The method of claim 1, wherein a number of read retry voltages applied to the first word line during the read retry operation and/or respective ranges therebetween vary based on whether the data read in the read operation is correctable by the error correction code.

12. A method of reading data from a nonvolatile memory device, the method comprising:
performing a first read operation for memory cells coupled to a first word line by applying a first read voltage to the first word line;
performing a first read retry to obtain an optimal read level regardless of whether data read by the first read operation are error-correctable; and storing the optimal read level to perform a subsequent second read operation for memory cells coupled to a second word line using the optimal read level.

13. The method of claim 12, further comprising:
performing the second read operation for the memory cells coupled to the second word line by applying a second read voltage having the optimal read level to the second word line; and
selectively performing a second read retry according to whether data read by the second read operation are error-correctable.

14. The method of claim 13, further comprising:
determining whether the data read by the second read operation are error-correctable,
wherein selectively performing the second read retry comprises:
when the data read by the second read operation are determined to be error-correctable, completing the second read operation without performing the second read retry; and
when the data read by the second read operation are determined not to be error-correctable, performing the second read retry.

15. The method of claim 14, wherein the second read retry is performed using a result of the first read retry.

16. The method of claim 15, wherein, when the optimal read level lower than a voltage level of the first read voltage is obtained as the result of the first read retry, the second read retry is performed by applying read retry voltages having voltage levels lower than the voltage level of the first read voltage to the second word line, and
wherein, when the optimal read level higher than the voltage level of the first read voltage is obtained as the result of the first read retry, the second read retry is performed by applying read retry voltages having voltage levels higher than the voltage level of the first read voltage to the second word line.

17. The method of claim 12, further comprising:
determining whether the data read by the first read operation are error-correctable,
wherein performing the first read retry comprises:
when the data read by the first read operation are determined not to be error-correctable, performing the first read retry using first read retry voltages having a first range; and
when the data read by the first read operation are determined to be error-correctable, performing the first read retry using second read retry voltages having a second range narrower than the first range.

18. The method of claim 17, wherein a quantity of the second read retry voltages is less than a quantity of the first read retry voltages.

19. The method of claim 12, further comprising:
performing an error correction on the data read by the first read operation using a Bose-Chaudhuri-Hocquenghem (BCH) code.

20. The method of claim 12, further comprising:
performing an error correction on the data read by the first read operation using a low density parity check (LDPC) code.

21. The method of claim 12, wherein performing the first read operation comprises:
performing a first hard decision read operation that reads first hard decision data from the memory cells coupled to the first word line by applying the first read voltage to the first word line;

determining whether the first hard decision data read by the first hard decision read operation are error-correctable; and
when the first hard decision data are determined not to be error-correctable, performing a first soft decision read operation that reads first soft decision data having reliability information for the first hard decision data from the memory cells coupled to the first word line.

22. The method of claim 21, wherein, even when the first hard decision data are error-correctable based on the reliability information of the first soft decision data, or are error-correctable without the reliability information of the first soft decision data, the first read retry is performed.

23. The method of claim 22, further comprising:
when the first soft decision read operation is performed, determining whether the first hard decision data are error-correctable based on the reliability information of the first soft decision data,
wherein performing the first read retry comprises:
when the first hard decision data are determined not to be error-correctable based on the reliability information of the first soft decision data, performing the first read retry using first read retry voltages having a first range;
when the first hard decision data are determined to be error-correctable based on the reliability information of the first soft decision data, performing the first read retry using second read retry voltages having a second range narrower than the first range; and
when the first hard decision data are determined to be error-correctable without the reliability information of the first soft decision data, performing the first read retry using third read retry voltages having a third range narrower than the second range.

24. The method of claim 23, wherein a quantity of the second read retry voltages is less than a quantity of the first read retry voltages, and a quantity of the third read retry voltages is less than the quantity of the second read retry voltages.

25. The method of claim 21, wherein the first read retry is not performed when the first hard decision data are error-correctable without the reliability information, and is performed even when the first hard decision data are error-correctable based on the reliability information of the first soft decision data.

26. The method of claim 25, further comprising:
when the first soft decision read operation is performed, determining whether the first hard decision data are error-correctable based on the reliability information of the first soft decision data,
wherein performing the first read retry comprises:
when the first hard decision data are determined not to be error-correctable based on the reliability information of the first soft decision data, performing the first read retry using first read retry voltages having a first range; and
when the first hard decision data are determined to be error-correctable based on the reliability information of the first soft decision data, performing the first read retry using second read retry voltages having a second range narrower than the first range.

27. The method of claim 21, further comprising:
performing a second hard decision read operation that reads second hard decision data from memory cells coupled to a second word line by applying a second read voltage having the optimal read level to the second word line;

determining whether the second hard decision data read by the second hard decision read operation are error-correctable;

when the second hard decision data are determined not to be error-correctable, performing a second soft decision read operation that reads second soft decision data having reliability information for the second hard decision data from the memory cells coupled to the second word line; and selectively performing a second read retry according to whether the second hard decision data are error-correctable based on the reliability information of the second soft decision data.

28. The method of claim 12, further comprising:

determining whether the first read operation is one of sequential read operations that sequentially read data from a plurality of adjacent pages, wherein the first read retry is selectively performed according to whether the data read by the first read operation are error-correctable when the first read operation is determined not to be one of the sequential read operations, and is performed regardless of whether the data read by the first read operation are error-correctable when the first read operation is determined to be one of the sequential read operations.

29. The method of claim 12, further comprising:

determining whether the first read operation is a read operation that is performed for the first time after a memory block including the memory cells coupled to the first word line is erased, wherein the first read retry is selectively performed according to whether the data read by the first read operation are error-correctable when the first read operation is determined not to be the read operation that is performed for the first time after the memory block is erased, and is performed regardless of whether the data read by the first read operation are error-correctable when the first read operation is determined to be the read operation that is performed for the first time after the memory block is erased.

30. The method of claim 12, wherein the optimal read level is stored for each memory block included in the nonvolatile memory device.

31. The method of claim 12, further comprising:

determining whether the first word line is an edge word line that is located at an edge region of a memory block including the memory cells coupled to the first word line, wherein the first read retry is selectively performed according to whether the data read by the first read operation are error-correctable when the first word line is determined to be the edge word line, and is performed regardless of whether the data read by the first read operation are error-correctable when the first word line is determined not to be the edge word line.

32. The method of claim 12, further comprising:

counting erase cycles of a memory block including the memory cells coupled to the first word line; and comparing a counted number of the erase cycles with a predetermined value, wherein the first read retry is selectively performed according to whether the data read by the first read operation are error-correctable when the counted number of the erase cycles does not match the predetermined value, and is performed regardless of whether the data read by the first read operation are error-correctable when the counted number of the erase cycles matches the predetermined value.

33. A nonvolatile memory device, comprising:

a memory cell array including a plurality of memory cells; and a control circuit configured to perform a first read operation for memory cells coupled to a first word line among the plurality of memory cells by applying a read voltage to the first word line, to perform a read retry to obtain an optimal read level regardless of whether data read by the first read operation are error-correctable, and to store the optimal read level to perform a subsequent second read operation for memory cells coupled to a second word line using the optimal read level.

34. A method of operating a memory system including a nonvolatile memory device and a memory controller, the method comprising:

transmitting, by the memory controller, a read command to the nonvolatile memory device;

transmitting, by the nonvolatile memory device, data read by a first read operation to the memory controller by performing the first read operation for memory cells coupled to a first word line in response to the read command;

transmitting, by the memory controller, a read retry command to the nonvolatile memory device regardless of whether the data read by the first read operation are error-correctable; and storing, by the nonvolatile memory device, an optimal read level by performing a read retry in response to the read retry command to perform a subsequent second read operation for memory cells coupled to a second word line using the optimal read level, wherein data read by the subsequent second read operation is error-correctable responsive to the optimal read level.

35. A method of operating a memory system including a nonvolatile memory device and a memory controller, the method comprising:

transmitting, by the memory controller, a read and read retry command to the nonvolatile memory device;

transmitting, by the nonvolatile memory device, data read by a first read operation to the memory controller by performing the first read operation for memory cells coupled to a first word line in response to the read and read retry command; and storing, by the nonvolatile memory device, an optimal read level by performing a read retry in response to the read retry command regardless of whether the data read by the first read operation are error-correctable to perform a subsequent second read operation for memory cells coupled to a second word line using the optimal read level, wherein data read by the subsequent second read operation is error-correctable responsive to the optimal read level.

* * * * *